US012648406B2

(12) United States Patent
Sanemasa et al.

(10) Patent No.: US 12,648,406 B2
(45) Date of Patent: Jun. 2, 2026

(54) ROBOT, SYSTEM, CONTROL METHOD, AND COMPUTER-READABLE STORAGE MEDIUM

(71) Applicant: KABUSHIKI KAISHA YASKAWA DENKI, Fukuoka (JP)

(72) Inventors: Hiroki Sanemasa, Fukuoka (JP); Yoshiki Kimura, Fukuoka (JP); Ryosuke Watanabe, Fukuoka (JP)

(73) Assignee: KABUSHIKI KAISHA YASKAWA DENKI, Fukuoka (JP)

( * ) Notice: Subject to any disclaimer, the term of this patent is extended or adjusted under 35 U.S.C. 154(b) by 27 days.

(21) Appl. No.: 18/824,927

(22) Filed: Sep. 5, 2024

(65) Prior Publication Data

US 2025/0087523 A1 Mar. 13, 2025

(30) Foreign Application Priority Data

Sep. 7, 2023 (JP) ................................. 2023-144955

(51) Int. Cl.
| | |
|---|---|
| *H01L 21/687* | (2006.01) |
| *B25J 11/00* | (2006.01) |
| *B25J 21/00* | (2006.01) |
| *H01L 21/677* | (2006.01) |
| *B25J 9/04* | (2006.01) |

(52) U.S. Cl.
CPC ..... *H01L 21/68707* (2013.01); *B25J 11/0095* (2013.01); *B25J 21/00* (2013.01); *H01L 21/67706* (2013.01); *B25J 9/04* (2013.01)

(58) Field of Classification Search
CPC . B25J 11/0095; B25J 21/00; B25J 9/04; B25J 9/16; B25J 18/00; H01L 21/68707; H01L 21/67706; H01L 21/67766; H01L 21/6773; H01L 21/67201; H01L 21/67721; H01L 21/68785; H01L 23/544
See application file for complete search history.

(56) References Cited

U.S. PATENT DOCUMENTS

| | | | | |
|---|---|---|---|---|
| 9,824,908 | B2 * | 11/2017 | Yoshida | ................ B25J 9/1664 |
| 2002/0057955 | A1 | 5/2002 | Tsubota | |

(Continued)

FOREIGN PATENT DOCUMENTS

| | | |
|---|---|---|
| JP | H11238779 A | 8/1999 |
| JP | H11265924 A | 9/1999 |

(Continued)

*Primary Examiner* — Nhi Q Bui

(57) ABSTRACT

Provided is a robot arranged in a housing having a front wall having a plurality of openings and a back wall facing the front wall and having an opening, the robot including: a first movable portion; a second movable portion which has a third arm and a hand; an information storage unit which stores cooperative operation-related information; a cooperative operation selection unit selects, based on a position of an access target of access by the hand and the cooperative operation-related information stored in the information storage unit, whether to cause the hand to access the access target by an cooperative operation of the third arm and the hand or to cause the hand to access the access target by an cooperative operation of the third arm, the hand, and the first movable portion; and a control unit which controls the first movable portion and the second movable portion.

20 Claims, 27 Drawing Sheets

(56)                    References Cited

U.S. PATENT DOCUMENTS

| | | | |
|---|---|---|---|
| 2014/0350713 A1* | 11/2014 | Kimura | H01L 21/67265 |
| | | | 901/46 |
| 2017/0294334 A1 | 10/2017 | Sanemasa | |
| 2018/0286741 A1 | 10/2018 | Ueda | |
| 2019/0240831 A1 | 8/2019 | Bonora | |
| 2020/0083071 A1 | 3/2020 | Gould | |
| 2021/0078181 A1 | 3/2021 | Iura | |
| 2022/0111539 A1* | 4/2022 | Yamaguchi | B25J 9/0093 |
| 2024/0109197 A1* | 4/2024 | Taruno | B25J 9/1638 |

FOREIGN PATENT DOCUMENTS

| | | |
|---|---|---|
| JP | H11300663 A | 11/1999 |
| JP | 2000006064 A | 1/2000 |
| JP | 2000031240 A | 1/2000 |
| JP | 2002210684 A | 7/2002 |
| JP | 2018167380 A | 11/2018 |
| JP | 6492271 B2 | 4/2019 |
| JP | 2021048229 A | 3/2021 |
| JP | 2022056064 A | 4/2022 |
| JP | 7275039 B2 | 5/2023 |
| WO | 2021150548 A1 | 7/2021 |

* cited by examiner

: REGION WHERE THIRD ROTATION SHAFT 105 CAN BE POSITIONED REGARDLESS OF ARM-SYSTEM ANGULAR RANGE

: REGION WHERE THIRD ROTATION SHAFT 105 CAN BE POSITIONED ONLY WHEN $\theta_{B1}$ IS INCLUDED IN SECOND ARM-SYSTEM ANGULAR RANGE : REGION WHERE THIRD ROTATION SHAFT 105 CAN BE POSITIONED ONLY WHEN $\theta_{B1}$ IS INCLUDED IN FIRST ARM-SYSTEM ANGULAR RANGE

ROBOT, SYSTEM, CONTROL METHOD, AND COMPUTER-READABLE STORAGE MEDIUM

The contents of the following patent application(s) are incorporated herein by reference: NO. 2023-144955 filed in JP on Sep. 7, 2023

BACKGROUND

1. Technical Field

The present invention relates to a robot, system, a control method, and a computer-readable storage medium.

2. Related Art

Patent Document 1 describes a conveyance system, a robot, and a robot control method capable of performing efficient conveyance without increasing cost.

PRIOR ART DOCUMENT

Patent Document

Patent Document 1: Japanese Patent No. 6492271

DESCRIPTION OF EXEMPLARY EMBODIMENTS

Hereinafter, the present invention will be described through embodiments of the invention. However, the following embodiments do not limit the invention defined in the claims. In addition, not all of the combinations of features described in the embodiments are essential to the solving means of the invention.

In the embodiments described below, expressions such as "parallel", "vertical", and "horizontal" may be used, but it is not necessary to strictly satisfy these states. That is, each expression described above is considered to allow deviations in manufacturing accuracy, installation accuracy, processing accuracy, detection accuracy, and the like.

In the embodiments described below, the expression "vector" may be used. The expression "vector" is not a mathematical expression that defines a size and a direction, but is considered an expression that defines only the direction.

Figure 1:
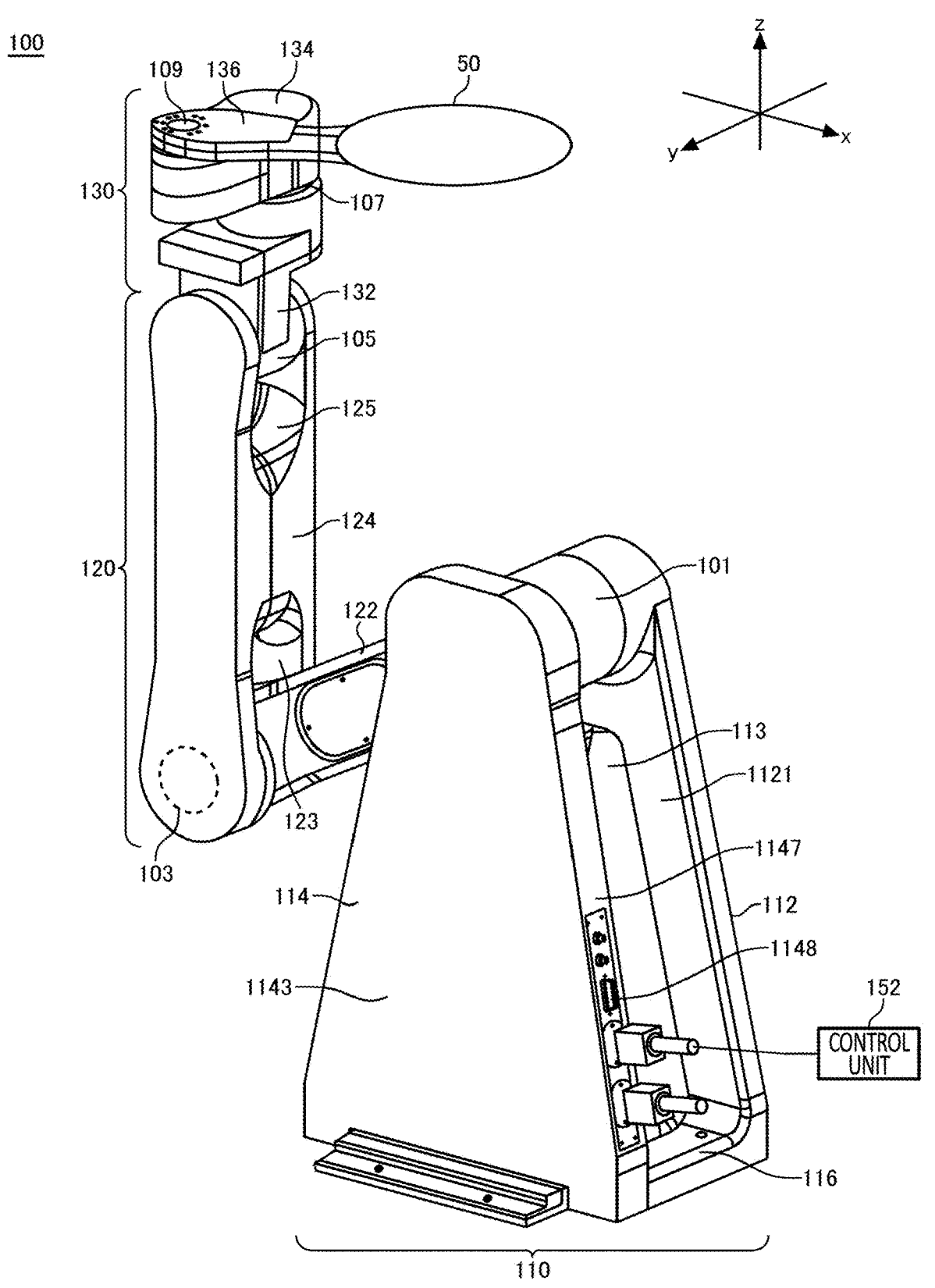
FIG. 1 is a perspective view schematically illustrating an example of a robot 100.

FIG. 1 is a perspective view schematically illustrating an example of a robot 100. The robot 100 is used to move a movement target. The movement target is, for example, a substrate such as a wafer or a liquid crystal. FIG. 1 illustrates an example of a case where the movement target is a wafer 50.

The robot 100 may be arranged in a housing associated with semiconductor manufacturing. The semiconductor manufacturing includes processing such as etching processing, ashing processing, exposure processing, and inspection processing.

The housing is, for example, a so-called equipment front end module (EFEM). The housing may be a sorter. The sorter is a housing for rearranging the wafer 50.

The robot 100 may include a first base 110, a first movable portion 120, and a second movable portion 130. The robot 100 may further include a control unit 152 that controls an operation of the robot 100. FIG. 1 illustrates an example in which the control unit 152 is externally attached to the robot 100. However, the control unit 152 may be accommodated in the first base 110 or fixed to the first base 110, for example. Note that the first movable portion 120 and the second movable portion 130 may be collectively referred to as a robot arm.

The first base 110 may have a first side surface portion 112 and a second side surface portion 114 facing the first side surface portion 112. The first base 110 may further include a bottom surface portion 116.

The first side surface portion 112 may include an inner surface 1121 and an outer surface. The first side surface portion 112 supports, for example, the first movable portion 120. The first side surface portion 112 supports the first movable portion 120 by being connected to the first arm 122, for example.

For example, the first base 110 supports the first movable portion 120 only by the first side surface portion 112. The first base 110 may support the first movable portion 120 on both the first side surface portion 112 and the second side surface portion 114.

The first side surface portion 112 has, for example, a cavity 113. Accordingly, it is possible to reduce the weight of the robot.

The second side surface portion 114 may include an inner surface, an outer surface 1143, a first side surface, and a second side surface 1147. For example, a connector portion 1148 is provided on the second side surface 1147. By providing the connector portion 1148 on the side surface of the second side surface portion 114, a cable or the like does not protrude outward from the outer surface 1143. Accordingly, it is possible to achieve a robot that can be arranged in a region with a narrower width. Here, the "width" is a length in a y axis direction illustrated in FIG. 1. Therefore, the "region with a narrow width" is a region having a short length in the y axis direction illustrated in FIG. 1.

The second side surface portion 114 further includes, for example, a hollow portion capable of accommodating a cable. Accordingly, the cable can be accommodated in the hollow portion, and thus a robot that can be arranged in a narrower space can be achieved.

The first side surface portion 112 and the bottom surface portion 116 may be integrated. The second side surface portion 114 and the bottom surface portion 116 may be integrated. The first side surface portion 112, the second side surface portion 114, and the bottom surface portion 116 may be integrated.

For example, the first base 110 is detachably arranged with respect to an arrangement surface. For example, the first base 110 is detachably arranged with respect to a bottom portion of a housing in which the robot 100 is arranged. The first base 110 is detachably arranged with respect to the bottom portion of the housing by being fixed to a fixing portion such as a frame included in the bottom portion of the housing, for example. Accordingly, it is possible to achieve a robot having high ease of operations such as arrangement and maintenance.

The first movable portion 120 may have a first arm 122 and a second arm 124. The first movable portion 120 may be movable in a vertical plane. FIG. 1 illustrates an example of a case where the first movable portion 120 is movable in an xz plane.

The proximal end side of the first arm 122 may be connected to the first base 110 to be rotatable about a first rotation shaft 101 in the vertical plane. The first arm 122 includes, for example, a link portion and a connecting portion. The first arm 122 includes the connecting portion on each of the proximal end side and the distal end side, for example. The connecting portion on the proximal end side may correspond to the first rotation shaft 101, and the connecting portion on the distal end side may correspond to a second rotation shaft 103.

The proximal end side of the second arm 124 may be connected to the distal end side of the first arm 122 to be rotatable about the second rotation shaft 103 in the vertical plane. The second arm 124 includes, for example, a link portion and a connecting portion. The second arm 124 includes the connecting portion on each of the proximal end side and the distal end side, for example. The connecting portion on the proximal end side may correspond to the second rotation shaft 103, and the connecting portion on the distal end side may correspond to a third rotation shaft 105.

The second movable portion 130 may include a second base 132, a third arm 134, and a hand 136. FIG. 1 illustrates an example in which the robot 100 includes one hand 136. The number of hands 136 included in the robot 100 is not limited to one, and may be two or more.

The second base 132 may be movable in the vertical plane. For example, the proximal end side of the second base 132 is connected to the distal end side of the second arm 124 to be rotatable about the third rotation shaft 105 in the vertical plane. FIG. 1 illustrates an example of a case where the second base 132 is rotatable in the xz plane.

The third arm 134 may be movable in a plane perpendicular to a fourth rotation shaft 107. FIG. 1 illustrates an example of a case where the fourth rotation shaft 107 is parallel to a z axis, and the third arm 134 is movable in an xy plane perpendicular to the fourth rotation shaft 107.

For example, the proximal end side of the third arm 134 is connected to the distal end side of the second base 132 to be rotatable about the fourth rotation shaft 107. The third arm 134 includes, for example, a link portion and a connecting portion. The third arm 134 includes the connecting portion on each of the proximal end side and the distal end side, for example. The connecting portion on the proximal end side may correspond to the fourth rotation shaft 107, and the connecting portion on the distal end side may correspond to a fifth rotation shaft 109.

The hand 136 holds a movement target such as the wafer 50. The hand 136 may hold the movement target by any method.

The hand 136 holds the movement target by, for example, vacuum-attracting the back surface of the movement target. The hand 136 holds the movement target by, for example, frictional force generated between the hand 136 and the movement target. In this case, in order to further increase the frictional force, a substance having a high friction coefficient such as rubber may be used for the contact surface of the hand 136 in contact with the movement target. The hand 136 holds the movement target by, for example, grasping the movement target. For example, the hand 136 grasps the movement target by physically clamping the periphery of the movement target. The hand 136 may hold the movement target in a non-contact manner. The hand 136 holds the movement target in a non-contact manner by, for example, using the Bernoulli effect in which when a fluid such as a gas or a liquid is vigorously ejected, the pressure around the ejected fluid decreases. In this case, the hand 136 is a Bernoulli chuck.

The hand 136 may be movable in a plane perpendicular to the fifth rotation shaft 109. For example, the proximal end side of the hand 136 is connected to the distal end side of the third arm 134 to be rotatable about the fifth rotation shaft 109. FIG. 1 illustrates an example of a case where the fifth rotation shaft 109 is parallel to the z axis, and the hand 136 is rotatable in the xy plane perpendicular to the fifth rotation shaft 109.

The first rotation shaft 101, the second rotation shaft 103, and the third rotation shaft 105 may be parallel to each other. The fourth rotation shaft 107 may be perpendicular to the third rotation shaft 105. The fourth rotation shaft 107 and the fifth rotation shaft 109 may be parallel to each other. In an example illustrated in FIG. 1, the first rotation shaft 101, the second rotation shaft 103, and the third rotation shaft 105 are parallel to the y axis, and the fourth rotation shaft 107 and the fifth rotation shaft 109 are parallel to the z axis.

The shape of the projection of the first base 110 onto the vertical plane perpendicular to the first rotation shaft 101 is, for example, a shape in which the width on the support side supporting the first movable portion 120 is narrower than the width on the arrangement surface side of the first base 110. The shape of the projection of the first base 110 onto the vertical plane is, for example, a tapered shape tapered from the arrangement surface side of the first base 110 toward the side supporting the first movable portion 120. The shape of the projection of the first base 110 onto the vertical plane is, for example, a trapezoid. The shape of the projection of the first side surface portion 112 onto the vertical plane is, for example, a triangle. The shape of the projection of the first side surface portion 112 onto the vertical plane may be a convex shape. In an example illustrated in FIG. 1, the shape of the projection of the first base 110 onto the vertical plane perpendicular to the first rotation shaft 101 is the shape of projection onto the xz plane.

The shape of the projection of the first side surface portion 112 onto the vertical plane perpendicular to the first rotation shaft 101 is, for example, a shape in which the width on the side supporting the first movable portion 120 is narrower than the width on the arrangement surface side of the first base 110. The shape of the projection of the first side surface portion 112 onto the vertical plane is, for example, a tapered shape tapered from the arrangement surface side of the first base 110 toward the side supporting the first movable portion 120. The shape of the projection of the first side surface portion 112 onto the vertical plane is, for example, a triangle. The shape of the projection of the first side surface portion 112 onto the vertical plane is, for example, a trapezoid. The shape of the projection of the first side surface portion 112 onto the vertical plane may be a convex shape.

The shape of the projection of the second side surface portion 114 onto the vertical plane perpendicular to the first rotation shaft 101 is, for example, a shape in which the width on the side supporting the first movable portion 120 is narrower than the width on the arrangement surface side of the first base 110. The shape of the projection of the second side surface portion 114 onto the vertical plane is, for example, a tapered shape tapered from the arrangement surface side of the first base 110 toward the side supporting the first movable portion 120. The shape of the projection of the second side surface portion 114 onto the vertical plane is, for example, a trapezoid. The shape of the projection of the second side surface portion 114 onto the vertical plane is, for example, a triangle. The shape of the projection of the second side surface portion 114 onto the vertical plane may be a convex shape.

The first base 110 has a structure in which the shape of the projection of the first base 110 onto the vertical plane is a shape in which the width on the support side supporting the first movable portion 120 is narrower than the width on the arrangement surface side of the first base 110, so that the first base 110 can stably support the robot arm even when the robot arm rotates. Furthermore, in the shape of the projection of the first base 110 onto the vertical plane, the width on the support side supporting the first movable portion 120 is narrow, so that the occurrence of interference between the third arm 134 or the hand 136 and the first base 110 can be avoided even when the robot arm is positioned near the first base 110. Accordingly, it is possible to achieve a robot capable of moving the movement target in a wider range.

The first arm 122 and the second arm 124 have a structure in which the trajectory of the first arm 122 and the trajectory of the second arm 124 overlap each other when the first arm 122 and the second arm 124 rotate, for example. Note that the "structure in which two trajectories overlap each other" does not mean a structure in which two trajectories necessarily overlap each other, but means a structure in which there are cases where two trajectories overlap each other.

For example, the width of the trajectory of the first arm 122 in a direction perpendicular to the vertical plane falls within the width of the trajectory of the second arm 124 in the direction perpendicular to the vertical plane. FIG. 1 illustrates an example of the robot 100 in which the width of the trajectory of the first arm 122 in the y axis direction falls within the width of the trajectory of the second arm 124 in the y axis direction.

For example, in the connecting portion between the first arm 122 and the second arm 124, the connecting portion on the proximal end side of the second arm 124 is connected to the connecting portion on the distal end side of the first arm 122 such that a width between the outer surfaces of the first arm 122 in the direction parallel to the second rotation shaft 103 falls within a width between the inner surfaces of the second arm 124 in the direction parallel to the second rotation shaft 103. For example, in the connecting portion between the first arm 122 and the second arm 124, the connecting portion on the proximal end side of the second arm 124 is connected to the connecting portion on the distal end side of the first arm 122 so as to sandwich the outer surface of the first arm 122.

With the structure in which the trajectory of the first arm 122 and the trajectory of the second arm 124 overlap each other when the first arm 122 and the second arm 124 rotate, the width of the trajectory can be further narrowed as compared with a robot having a structure in which the trajectories of two arms do not overlap each other when the two arms rotate. Accordingly, it is possible to achieve a robot that can be arranged in a region with a narrower width.

At least one of the first arm 122 or the second arm 124 has a structure capable of avoiding the interference between the first arm 122 and the second arm 124 in a state where the projection of the link portion of the first arm 122 onto the vertical plane and the projection of the link portion of the second arm 124 onto the vertical plane overlap each other, for example. For example, in the connecting portion between the first arm 122 and the second arm 124, the connecting portion on the proximal end side of the second arm 124 is connected to the connecting portion on the distal end side of the first arm 122 such that a gap 123 exists.

With the structure which is capable of avoiding the interference between the first arm 122 and the second arm 124 in a state where the projection of the link portion of the first arm 122 onto the vertical plane and the projection of the link portion of the second arm 124 onto the vertical plane overlap each other, it is possible to further bend the first movable portion 120 while avoiding the occurrence of the interference between the first arm 122 and the second arm 124. Accordingly, it is possible to achieve a robot capable of moving the movement target in a wider range.

For example, the second arm 124 has a structure capable of avoiding interference between the second arm 124 and the second base 132 when the second base 132 rotates. For example, in the connecting portion between the second arm 124 and the second base 132, the connecting portion on the distal end side of the second arm 124 is connected to the connecting portion on the proximal end side of the second base 132 such that a width between the outer surfaces of the second base 132 in the direction parallel to the third rotation shaft 105 falls within a width between the inner surfaces of the second arm 124 in the direction parallel to the third rotation shaft 105, and a gap 125 exists. For example, in the connecting portion between the second arm 124 and the second base 132, the connecting portion on the distal end side of the second arm 124 is connected to the connecting portion on the proximal end side of the second base 132 so as to sandwich the outer surface of the second base 132 and to have the gap 125. Accordingly, it is possible to achieve a robot that can increase the movable range of the second base 132 while avoiding the occurrence of the interference between the second arm 124 and the second base 132 and can move the movement target to a wider range.

For example, the first movable portion 120 has a structure capable of avoiding interference between the first movable portion 120 and the first base 110 in a state where the projection of the link portion of the first arm 122 onto the vertical plane and the projection of the first base 110 onto the vertical plane overlap each other. For example, the first movable portion 120 has a structure capable of avoiding the interference between the first movable portion 120 and the first base 110 in a state where the projection of the link portion of the first arm 122 onto the vertical plane and the projection of the link portion of the second arm 124 onto the vertical plane overlap each other, and the projection of the link portion of the first arm 122 onto the vertical plane and the projection of the first base 110 onto the vertical plane overlap each other. A specific structure capable of avoiding the interference between the first movable portion 120 and the first base 110 will be described later.

With the structure which is capable of avoiding the interference between the first movable portion 120 and the first base 110 in a state where the projection of the link portion of the first arm 122 onto the vertical plane and the projection of the first base 110 onto the vertical plane overlap each other, it is possible to move the movement target to the vicinity of the first base 110 while avoiding the occurrence of interference between the robot arm and the first base 110. In particular, with the structure which is capable of avoiding the interference between the first movable portion 120 and the first base 110 in a state where the projection of the link portion of the first arm 122 onto the vertical plane and the projection of the link portion of the second arm 124 onto the vertical plane overlap each other, and the projection of the link portion of the first arm 122 onto the vertical plane and the projection of the first base 110 onto the vertical plane overlap each other, it is possible to move the movement target to the vicinity of the first base 110 in a state where the first movable portion 120 is bent, and thus, it is possible to move the movement target to the vicinity of the first base 110 while avoiding the occurrence of interference between the robot arm and the first base 110. Accordingly, it is possible to achieve a robot capable of moving the movement target in a wider range.

The first movable portion 120 and the second movable portion 130 have a structure in which at least one of the projection of the fourth rotation shaft 107 onto the vertical plane or the projection of the fifth rotation shaft 109 onto the vertical plane does not overlap the projection of the first base 110 onto the vertical plane in a state where the projection of the link portion of the first arm 122 onto the vertical plane and the projection of the first base 110 onto the vertical plane overlap each other. For example, the first movable portion 120 and the second movable portion 130 have a structure in which the projection of the fourth rotation shaft 107 onto the vertical plane does not overlap the projection of the first base 110 onto the vertical plane. For example, the first movable portion 120 and the second movable portion 130 have a structure in which the projection of the fifth rotation shaft 109 onto the vertical plane does not overlap the projection of the first base 110 onto the vertical plane. For example, the first movable portion 120 and the second movable portion 130 have a structure in which both the projection of the fourth rotation shaft 107 onto the vertical plane and the projection of the fifth rotation shaft 109 onto the vertical plane do not overlap the projection of the first base 110 onto the vertical plane.

For example, the first movable portion 120 and the second movable portion 130 have a structure in which the altitude of the third rotation shaft 105 is higher than that of the upper end of the first base 110 in a state where the projection of the link portion of the first arm 122 onto the vertical plane and the projection of the first base 110 onto the vertical plane overlap each other. For example, the first movable portion 120 and the second movable portion 130 have a structure in which the altitude of the lower end of the fourth rotation shaft 107 is higher than that of the upper end of the first base 110 in a state where the projection of the link portion of the first arm 122 onto the vertical plane and the projection of the first base 110 onto the vertical plane overlap each other. For example, the first movable portion 120 and the second movable portion 130 have a structure in which the altitude of the lower end of the fifth rotation shaft 109 is higher than that of the upper end of the first base 110 in a state where the projection of the link portion of the first arm 122 onto the vertical plane and the projection of the first base 110 onto the vertical plane overlap each other.

With the structure in which at least one of the projection of the fourth rotation shaft 107 onto the vertical plane or the projection of the fifth rotation shaft 109 onto the vertical plane does not overlap the projection of the first base 110 onto the vertical plane in a state where the projection of the link portion of the first arm 122 onto the vertical plane and the projection of the first base 110 onto the vertical plane overlap each other, it is possible to move the movement target to the vicinity of the first base 110 while avoiding the occurrence of interference between the third arm 134 or the hand 136 and the first base 110. Accordingly, it is possible to achieve a robot capable of moving the movement target in a wider range.

Figure 2:
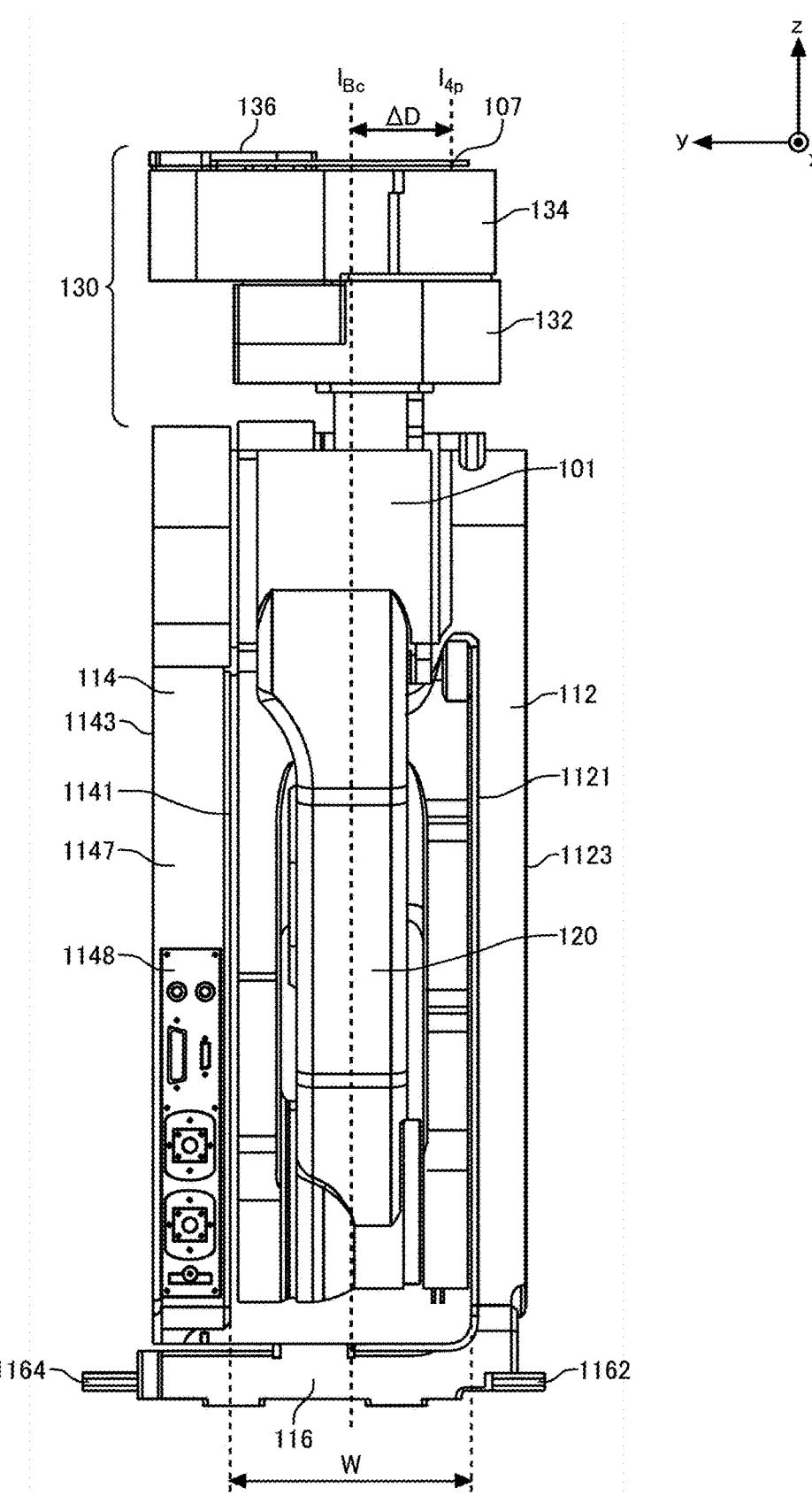
FIG. 2 is a side view schematically illustrating an example of the robot 100.

FIG. 2 is a side view schematically illustrating an example of the robot 100. FIG. 2 illustrates an example of the robot 100 in a state where the first movable portion 120 is positioned between the inner surface 1121 of the first side surface portion 112 and the inner surface 1141 of the second side surface portion 114.

The inner surface 1121 and the inner surface 1141 may be perpendicular to the first rotation shaft 101. FIG. 2 illustrates an example of a case where the inner surface 1121 and the inner surface 1141 are perpendicular to the y axis parallel to the first rotation shaft 101.

For example, the width of the first movable portion 120 in the direction perpendicular to the vertical plane falls within the width between the inner surface 1121 and the inner surface 1141 in the direction perpendicular to the vertical plane. A structure in which the width of the first movable portion 120 in the direction perpendicular to the vertical plane falls within the width between the inner surface 1121 and the inner surface 1141 in the direction perpendicular to the vertical plane may be an example of a structure capable of avoiding the interference between the first movable portion 120 and the first base 110.

For example, the case where the width of the first movable portion 120 in the direction perpendicular to the vertical plane falls within the width between the inner surface 1121 and the inner surface 1141 in the direction perpendicular to the vertical plane includes a case where the width of the first arm 122 in the direction perpendicular to the vertical plane falls within the width between the inner surface 1121 and the inner surface 1141 in the direction perpendicular to the vertical plane. For example, the case where the width of the first movable portion 120 in the direction perpendicular to the vertical plane falls within the width between the inner surface 1121 and the inner surface 1141 in the direction perpendicular to the vertical plane includes a case where the width of the second arm 124 in the direction perpendicular to the vertical plane falls within the width between the inner surface 1121 and the inner surface 1141 in the direction perpendicular to the vertical plane. For example, the case where the width of the first movable portion 120 in the direction perpendicular to the vertical plane falls within the width between the inner surface 1121 and the inner surface 1141 in the direction perpendicular to the vertical plane includes a case where both the width of the first arm 122 in the direction perpendicular to the vertical plane and the width of the second arm 124 in the direction perpendicular to the vertical plane fall within the width between the inner surface 1121 and the inner surface 1141 in the direction perpendicular to the vertical plane. FIG. 2 illustrates an example of a case where the vertical plane of the first movable portion 120 is the xz plane, the vertical plane between the inner surface 1121 and the inner surface 1141 is the xz plane, and the width of the first movable portion 120 in the y axis direction falls within a width W between the inner surface 1121 and the inner surface 1141 in the y axis direction.

Since the width of the first movable portion 120 falls within the width between the inner surface 1121 and the inner surface 1141, the robot arm can pass through a space between the inner surface 1121 and the inner surface 1141 while avoiding the interference between the first movable portion 120 and the first base 110. Accordingly, it is possible to achieve a robot having a robot arm with a wider movable range.

For example, the second movable portion 130 has a structure capable of avoiding the interference between the second movable portion 130 and the first base 110. For example, the second base 132 does not protrude from the inner surface 1141 in the direction perpendicular to the vertical plane of the second movable portion 130. FIG. 2 illustrates an example of the robot 100 in which the vertical plane of the second movable portion 130 is the xz plane, and the left end of the second base 132 does not protrude from the inner surface 1141 in the negative direction of the y axis.

With the structure capable of avoiding the interference between the second movable portion 130 and the first base 110, the robot arm can pass through the space between the inner surface 1121 and the inner surface 1141 while avoiding the interference between the second movable portion 130 and the first base 110. Accordingly, it is possible to achieve a robot having a robot arm with a wider movable range.

For example, the fourth rotation shaft 107 is shifted from a center line $I_{Bc}$ of the width between the inner surface 1121 and the inner surface 1141. For example, the fourth rotation shaft 107 is shifted from the center line $I_{Bc}$ toward the first side surface portion 112. The fourth rotation shaft 107 may be shifted from the center line $I_{Bc}$ toward the second side surface portion 114. FIG. 2 illustrates an example of the robot 100 in which a straight line $I_{4p}$ parallel to the fourth rotation shaft 107 and passing through the fourth rotation shaft 107 is shifted by $\Delta D$ from the center line $I_{Bc}$ toward the first side surface portion 112.

When the fourth rotation shaft 107 is shifted from the center line of the width between the inner surface 1121 and the inner surface 1141 toward the first side surface portion 112, the length of the third arm 134 can be made longer, for example, within the range of the width between the outer surface 1123 and the outer surface 1143 in the y axis direction as compared with the robot in which the fourth rotation shaft is positioned on the center line of the width between the inner surfaces of the side surface portions, and thus, it is possible to achieve a robot having high ease of access to the first side surface portion 112 by the hand 136. In addition, when the fourth rotation shaft 107 is shifted from the center line of the width between the inner surface 1121 and the inner surface 1141 toward the second side surface portion 114, the length of the third arm 134 can be made longer, for example, within the range of the width between the outer surface 1123 and the outer surface 1143 in the y axis direction as compared with the robot in which the fourth rotation shaft is positioned on the center line of the width between the inner surfaces of the side surface portions, and thus, it is possible to achieve a robot having high ease of access to the second side surface portion 114 by the hand 136.

The bottom surface portion 116 includes, for example, a first protruding portion 1162 protruding from the outer surface 1123 of the first side surface portion 112 and a second protruding portion 1164 protruding from the outer surface 1143 of the second side surface portion 114. Accordingly, the robot 100 can be loaded into and unloaded from the housing by using a forklift, and thus it is possible to achieve a robot having high ease of work such as arrangement and maintenance.

Figure 3:
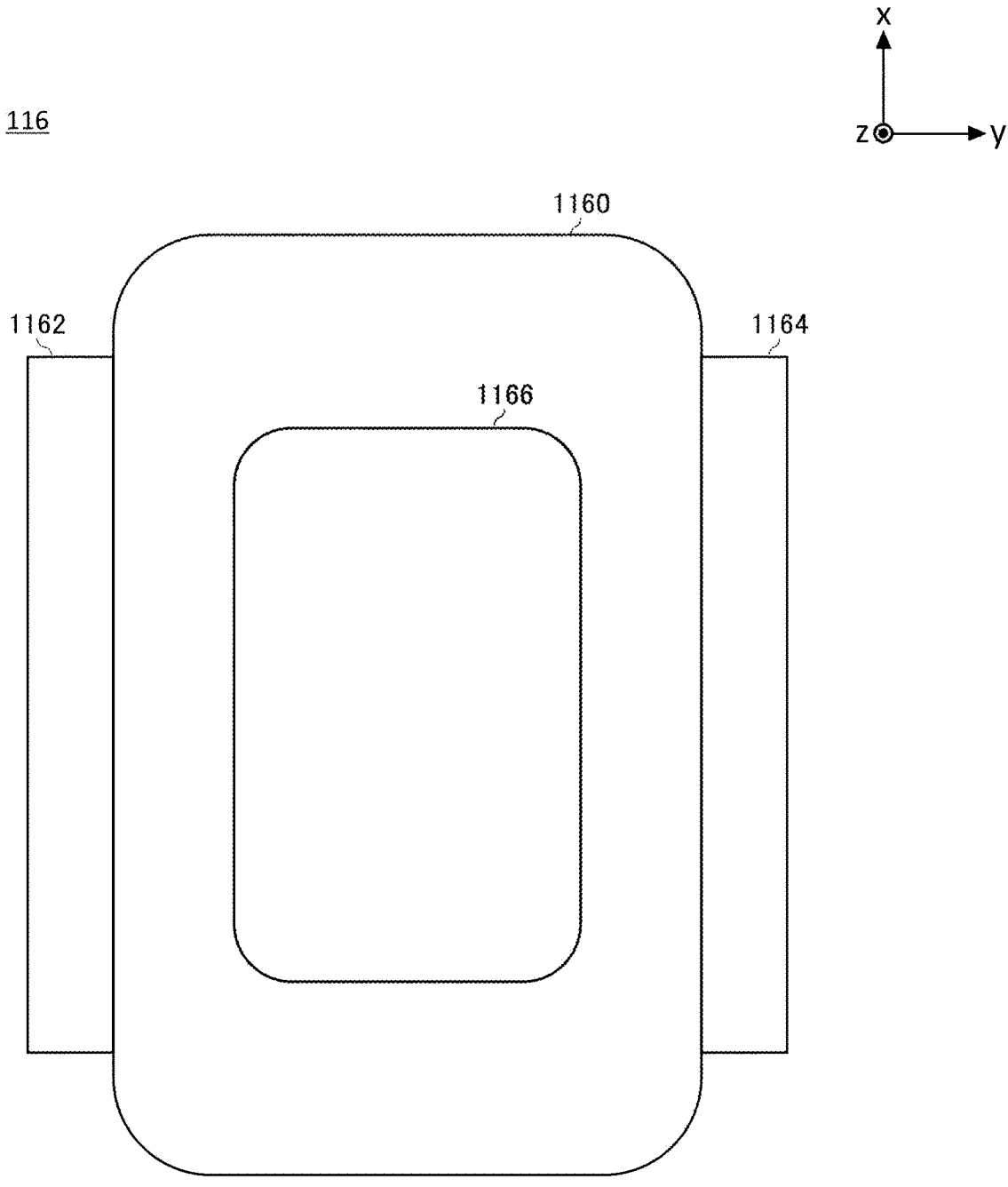
FIG. 3 schematically illustrates an example of a bottom surface portion 116.

FIG. 3 schematically illustrates an example of the bottom surface portion 116. FIG. 3 is a top view schematically illustrating an example of the bottom surface portion 116. In FIG. 3, the first movable portion 120 and the second movable portion 130 are omitted.

The bottom surface portion 116 includes, for example, a central portion 1160, the first protruding portion 1162, and the second protruding portion 1164. FIG. 3 illustrates an example of the bottom surface portion 116 in which the first protruding portion 1162 protrudes from the first side surface of the central portion 1160 toward the negative direction of the y axis, and the second protruding portion 1164 protrudes from the second side surface of the central portion 1160 facing the first side surface toward the positive direction of the y axis.

For example, the bottom surface portion 116 has a structure capable of avoiding the interference between the first movable portion 120 and the bottom surface portion 116 when the first movable portion 120 is positioned above the bottom surface portion 116. Here, the structure will be mainly described.

The case where the first movable portion 120 is positioned above the bottom surface portion 116 includes, for example, a case where the second rotation shaft 103 is positioned above the bottom surface portion 116. The case where the second rotation shaft 103 is positioned above the bottom surface portion 116 includes, for example, a case where the second rotation shaft 103 is positioned above the bottom surface portion 116 in a state where the altitude of the second rotation shaft 103 is lower than the altitude of the first rotation shaft 101.

The central portion 1160 has, for example, a hole 1166. The hole 1166 penetrates the central portion 1160, for example. In this case, the hole 1166 is a through hole. The hole 1166 may form a depression in the central portion 1160 without penetrating the central portion 1160. In this case, the hole 1166 is a blind hole.

The hole 1166 is provided in the central portion 1160 such that, for example, when the first movable portion 120 is positioned above the bottom surface portion 116, the first movable portion 120 is included in the space surrounded by the inner wall of the hole 1166. The hole 1166 is provided in the central portion 1160 such that, for example, when the first movable portion 120 is positioned above the bottom surface portion 116, the distal end portion of the first arm 122 is included in the space surrounded by the inner wall of the hole 1166. The hole 1166 is provided in the central portion 1160 such that, for example, when the first movable portion 120 is positioned above the bottom surface portion 116, the proximal end portion of the second arm 124 is included in the space surrounded by the inner wall of the hole 1166. The hole 1166 is provided in the central portion 1160 such that, for example, when the first movable portion 120 is positioned above the bottom surface portion 116, the distal end portion of the first arm 122 and the proximal end portion of the second arm 124 are included in the space surrounded by the inner wall of the hole 1166. The hole 1166 is provided in the central portion 1160 such that, for example, when the first movable portion 120 is positioned above the bottom surface portion 116, the second rotation shaft 103 is included in the space surrounded by the inner wall of the hole 1166. The hole 1166 may be an example of the structure of the bottom surface portion 116 capable of avoiding the interference between the first movable portion 120 and the bottom surface portion 116 when the first movable portion 120 is positioned above the bottom surface portion 116.

When the hole 1166 is a through hole, the shape of the central portion 1160 is, for example, an O shape. When the hole 1166 is a through hole, the shape of the central portion 1160 is, for example, a U shape. FIG. 3 illustrates an example of the bottom surface portion 116 including the O-shaped central portion 1160.

With the structure of the bottom surface portion 116 capable of avoiding the interference between the first movable portion 120 and the bottom surface portion 116, a longer robot arm can pass through the space between the inner surface 1121 and the inner surface 1141 without any interference with the first base 110. Accordingly, it is possible to achieve a robot that has a wider movable range and can move the movement target to a farther position.

Figure 4:
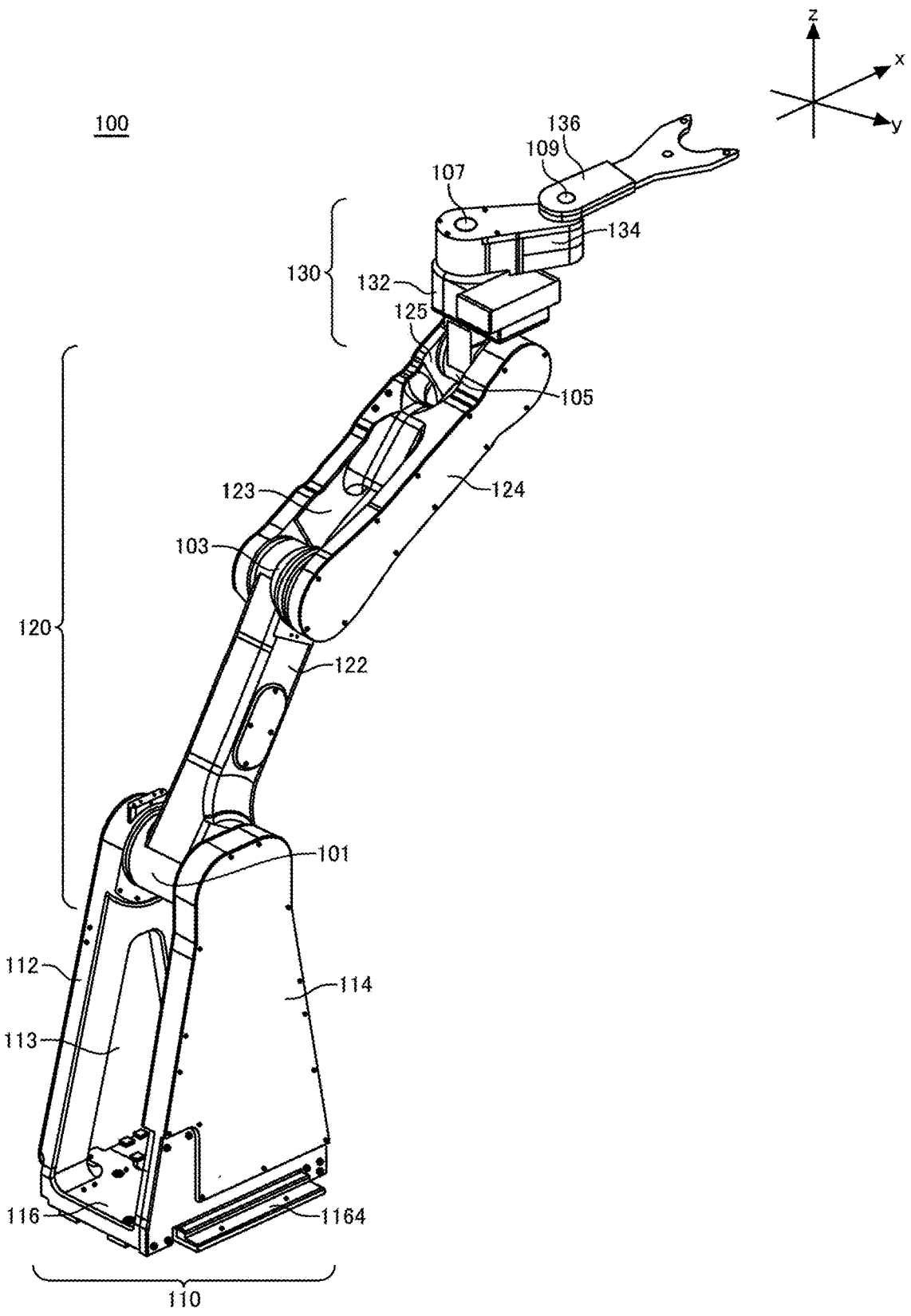
FIG. 4 is a perspective view schematically illustrating an example of the robot 100 in a state where a robot arm is extended.

FIG. 4 is a perspective view schematically illustrating an example of the robot 100 in a state where the robot arm is extended. Here, matters regarding the control of the robot arm will be mainly described.

The control unit 152 controls the first movable portion 120 so as to extend the robot arm, for example. The control unit 152 controls the second movable portion 130 so as to extend the robot arm, for example. The control unit 152 controls the first movable portion 120 and the second movable portion 130 so as to extend the robot arm, for example.

The control unit 152 controls the first movable portion 120 by, for example, rotating the first rotation shaft 101 by using a motor. The motor that rotates the first rotation shaft 101 is, for example, a servomotor. When the motor that rotates the first rotation shaft 101 is a servomotor, the servomotor and a deceleration mechanism such as a speed reducer, a belt, and a pulley may be combined to rotate the first rotation shaft 101. In this case, the control unit 152 may further control the deceleration mechanism in addition to the servomotor. The motor that rotates the first rotation shaft 101 may be any other motor.

The control unit 152 controls the first movable portion 120 by, for example, rotating the second rotation shaft 103 by using a motor. The motor that rotates the second rotation shaft 103 is, for example, a servomotor. When the motor that rotates the second rotation shaft 103 is a servomotor, the servomotor and the deceleration mechanism may be combined to rotate the second rotation shaft 103. In this case, the control unit 152 may further control the deceleration mechanism in addition to the servomotor. The motor that rotates the second rotation shaft 103 may be any other motor.

The control unit 152 controls the second movable portion 130 by, for example, rotating the third rotation shaft 105 by using a motor. The motor that rotates the third rotation shaft 105 is, for example, a servomotor. When the motor that rotates the third rotation shaft 105 is a servomotor, the servomotor and the deceleration mechanism may be combined to rotate the third rotation shaft 105. In this case, the control unit 152 may further control the deceleration mechanism in addition to the servomotor. The motor that rotates the third rotation shaft 105 may be any other motor.

The control unit 152 controls the second movable portion 130 by, for example, rotating the fourth rotation shaft 107 by using a motor. The motor that rotates the fourth rotation shaft 107 is, for example, a direct drive (DD) motor. The DD motor is a motor in which a motor such as a servomotor directly rotates a rotation target without a deceleration mechanism. The DD motor is, for example, an axial gap motor. The motor that rotates the fourth rotation shaft 107 may be any other motor.

The control unit 152 controls the second movable portion 130 by, for example, rotating the fifth rotation shaft 109 by using a motor. The motor that rotates the fifth rotation shaft 109 is, for example, a DD motor. The motor that rotates the fifth rotation shaft 109 may be any other motor.

Unlike a case where the servomotor and the deceleration mechanism are combined to rotate the rotation target, the DD motor can rotate the rotation target without using the deceleration mechanism, so that the rotation target can be rotated with low vibration. Therefore, when the robot 100 controls the second movable portion 130 by using the DD motor, it is possible to achieve a robot capable of adjusting the distal end position of the hand with high accuracy.

Figure 5:
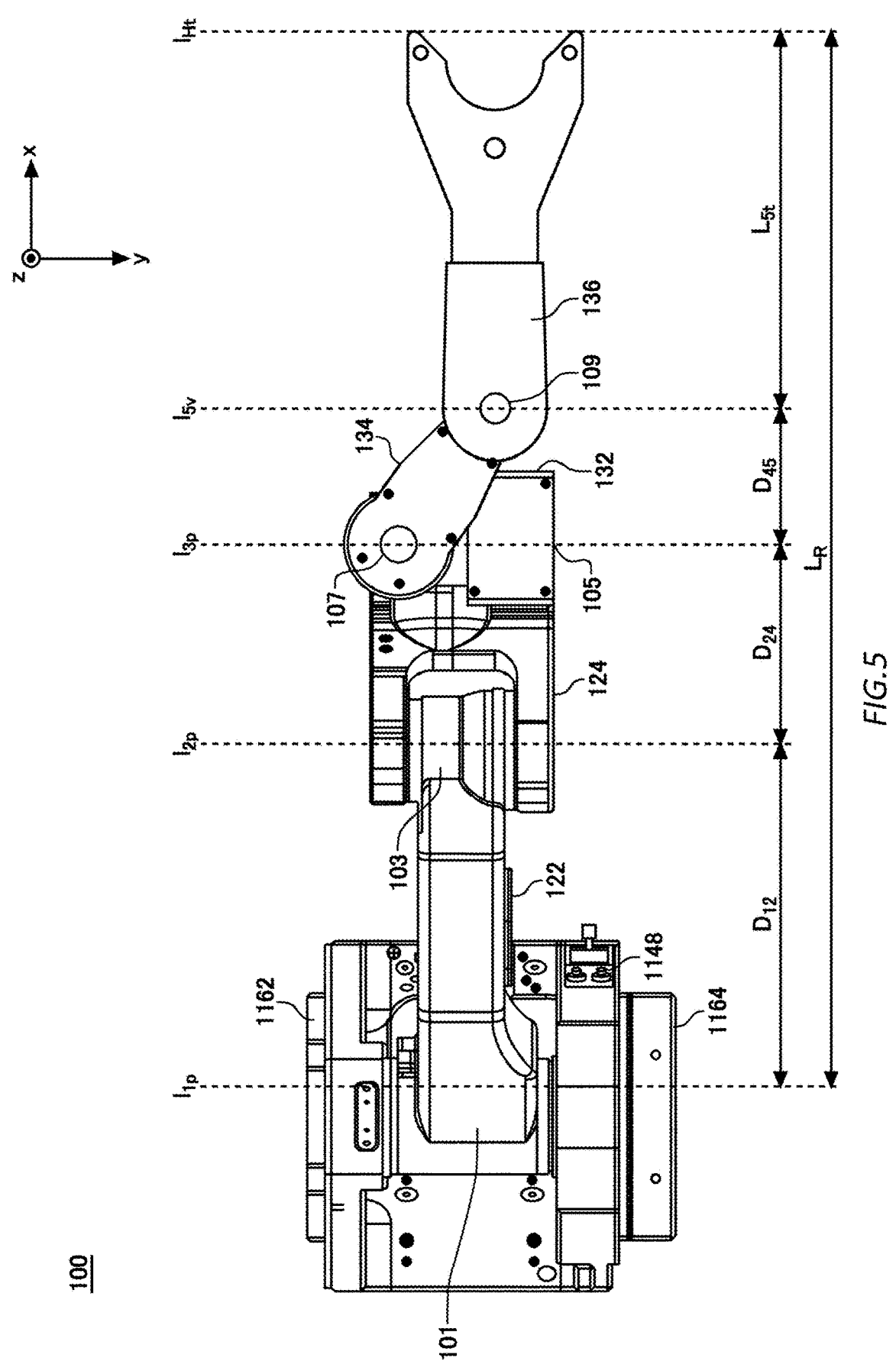
FIG. 5 is a top view schematically illustrating an example of the robot 100 in a state where the robot arm is extended.

FIG. 5 is a top view schematically illustrating an example of the robot 100 in a state where the robot arm is extended. FIG. 5 is a top view of an example of the robot 100 in FIG. 4. Here, matters regarding the length of the robot arm will be mainly described.

$I_{1p}$ is a straight line that is parallel to the first rotation shaft 101 and passes through the first rotation shaft 101. $I_{2p}$ is a straight line that is parallel to the second rotation shaft 103 and passes through the second rotation shaft 103. $I_{3p}$ is a straight line that is parallel to the third rotation shaft 105 and passes through the third rotation shaft 105. $I_{5_v}$ is a straight line that is perpendicular to the fifth rotation shaft 109 and passes through the fifth rotation shaft 109. $I_{H_t}$ is a straight line passing through the distal end of the hand 136.

$L_R$ is the length of the robot arm. $L_R$ is determined based on, for example, a distance $D_{12}$ between the first rotation shaft 101 and the second rotation shaft 103, a distance $D_{24}$ between the second rotation shaft 103 and the fourth rotation shaft 107, a distance $D_{45}$ between the fourth rotation shaft 107 and the fifth rotation shaft 109, and a length $L_{5_t}$ from the fifth rotation shaft 109 to the distal end of the hand 136. $D_{24}$ is determined based on a distance $D_{23}$ between the second rotation shaft 103 and the third rotation shaft 105 and a distance $D_{34}$ between the third rotation shaft 105 and the fourth rotation shaft 107. FIG. 5 illustrates an example of the robot 100 in a state where the third rotation shaft 105 and fourth rotation shaft 107 are positioned on the same yz plane.

For example, $D_{12}$ is defined as the length of the first arm 122. A length from the proximal end of the first arm 122 to the distal end of the first arm 122 may be defined as the length of the first arm 122.

For example, $D_{23}$ is defined as the length of the second arm 124. A length from the proximal end of the second arm 124 to the distal end of the second arm 124 may be defined as the length of the second arm 124.

For example, $D_{34}$ is defined as the length of the second base 132. A length from the proximal end of the second base 132 to the distal end of the second base 132 may be defined as the length of the second base 132.

For example, $D_{45}$ is defined as the length of the third arm 134. A length from the proximal end of the third arm 134 to the distal end of the third arm 134 may be defined as the length of the third arm 134.

For example, $L_{5_t}$ is defined as the length of the hand 136. A length from the proximal end of the hand 136 to the distal end of the hand 136 may be defined as the length of the hand 136.

Figure 6:
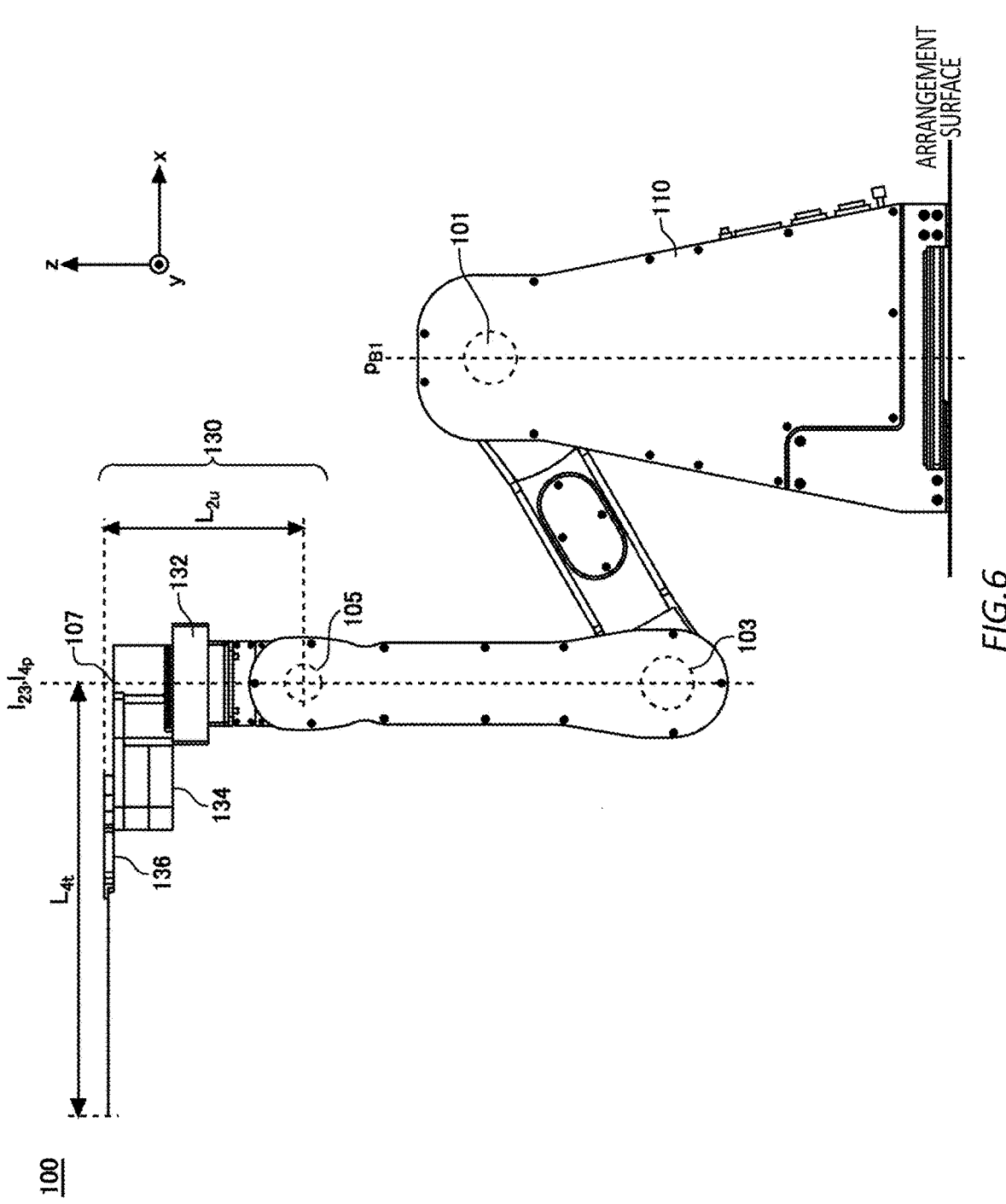
FIG. 6 is a front view schematically illustrating an example of the robot 100.

FIG. 6 is a front view schematically illustrating an example of the robot 100. Note that in an example illustrated in FIG. 6, the third arm 134 and the hand 136 are parallel to the xy plane which is a horizontal plane.

Psi is a plane perpendicular to the arrangement surface of the first base 110 and including the first rotation shaft 101. In an example illustrated in FIG. 6, the arrangement surface of the first base 110 is an xy plane, and $p_{B1}$ is a yz plane.

$L_{4_t}$ is a length from the fourth rotation shaft 107 to the distal end of the hand 136. FIG. 6 illustrates an example of the length from $I_{4p}$ to the distal end of the hand 136 in a state where the third arm 134 and the hand 136 are maximally extended in the negative direction of the x axis. In an example illustrated in FIG. 6, $I_{4p}$ is a straight line parallel to the z axis.

$I_{23}$ is a straight line that passes through the second rotation shaft 103 and the third rotation shaft 105 and is perpendicular to the second rotation shaft 103 and the third rotation shaft 105. In an example illustrated in FIG. 6, $I_{23}$ is a straight line parallel to the z axis.

FIG. 6 illustrates an example of a case where the yz plane including $I_{23}$ and the yz plane including $I_{4p}$ are the same plane. The yz plane including $I_{23}$ and the yz plane including $I_{4p}$ may be different planes.

$L_{2_u}$ is a length from the third rotation shaft 105 to the upper end of the second movable portion 130. FIG. 6 illustrates an example of $L_{2_u}$ in a state where a vector parallel to $I_{23}$ is perpendicular to the arrangement surface of the first base 110 and parallel to the fourth rotation shaft 107.

Figure 7:
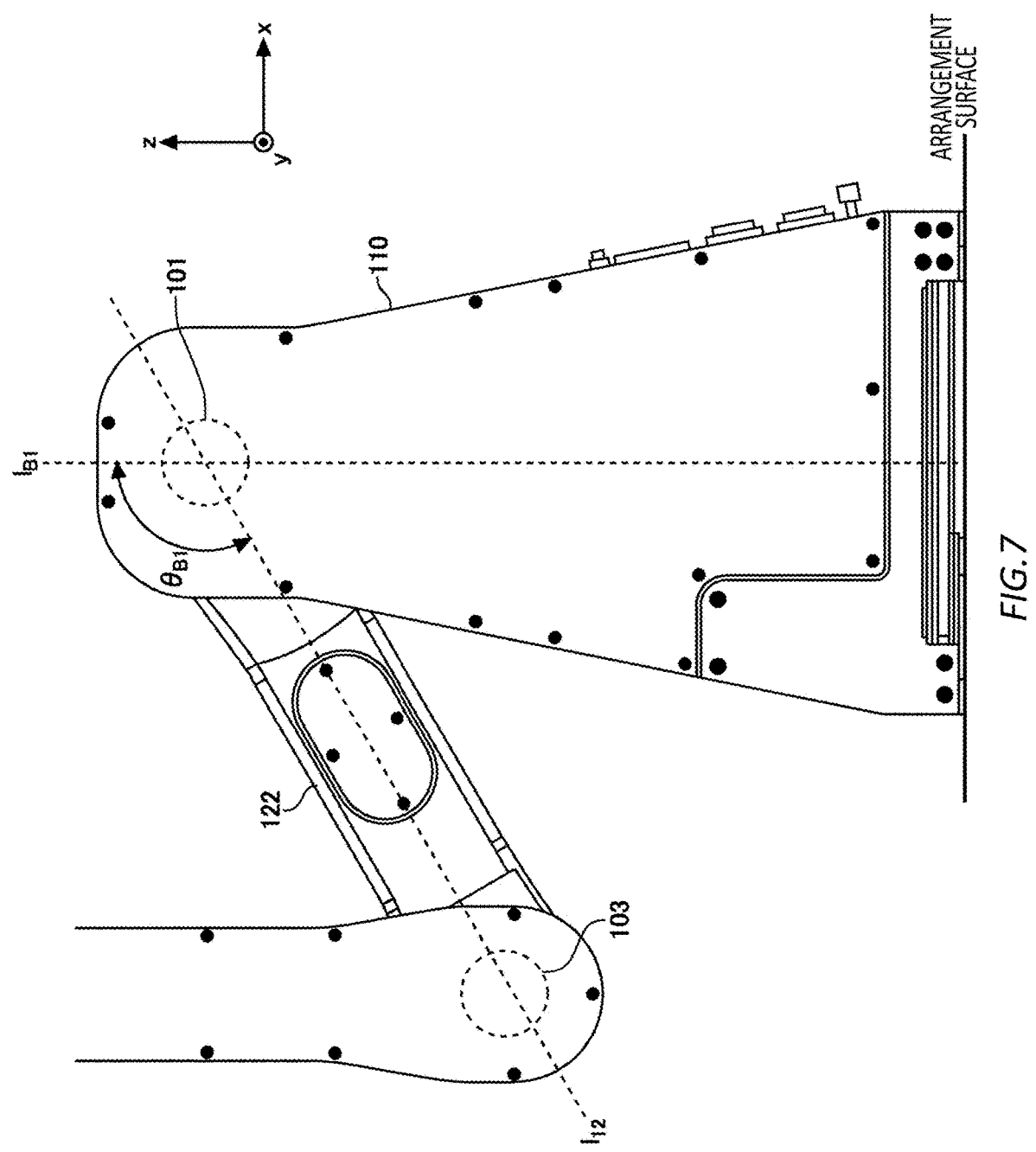
FIG. 7 is an explanatory diagram for explaining a movable range of a first arm 122.

FIG. 7 is an explanatory diagram for explaining a movable range of the first arm 122. The movable range of the first arm 122 may be determined based on an angular range of an angle $\theta_{B1}$ between an upward vector parallel to a straight line $I_{B1}$ perpendicular to the arrangement surface of the first base 110 and a vector parallel to a straight line $I_{12}$ passing through the first rotation shaft 101 and the second rotation shaft 103 and perpendicular to the first rotation shaft 101 and the second rotation shaft 103. The angular range of $\theta_{B1}$ may be determined by the length of the first arm 122, the shape of the first base 110, and the like. Note that a counterclockwise rotation direction is considered a positive rotation direction and a clockwise rotation direction is considered a negative rotation direction.

The arm system of the robot 100 is determined, for example, based on the angular range of $\theta_{B1}$. Note that the angular range of $\theta_{B1}$ may be referred to as an arm-system angular range.

The arm-system angular range includes, for example, a first arm-system angular range and a second arm-system angular range. For example, the first arm-system angular range is an angle from 0° to 220° and the second arm-system angular range is an angle from −220° to 0°. In this case, the angular range of $\theta_{B1}$ is an angle from −220° to 220°. The angular range of $\theta_{B1}$ may be any other angular range. FIG. 7 illustrates an example of the robot 100 in a case where $\theta_{B1}$ is included in the first arm-system angular range.

Figure 8:
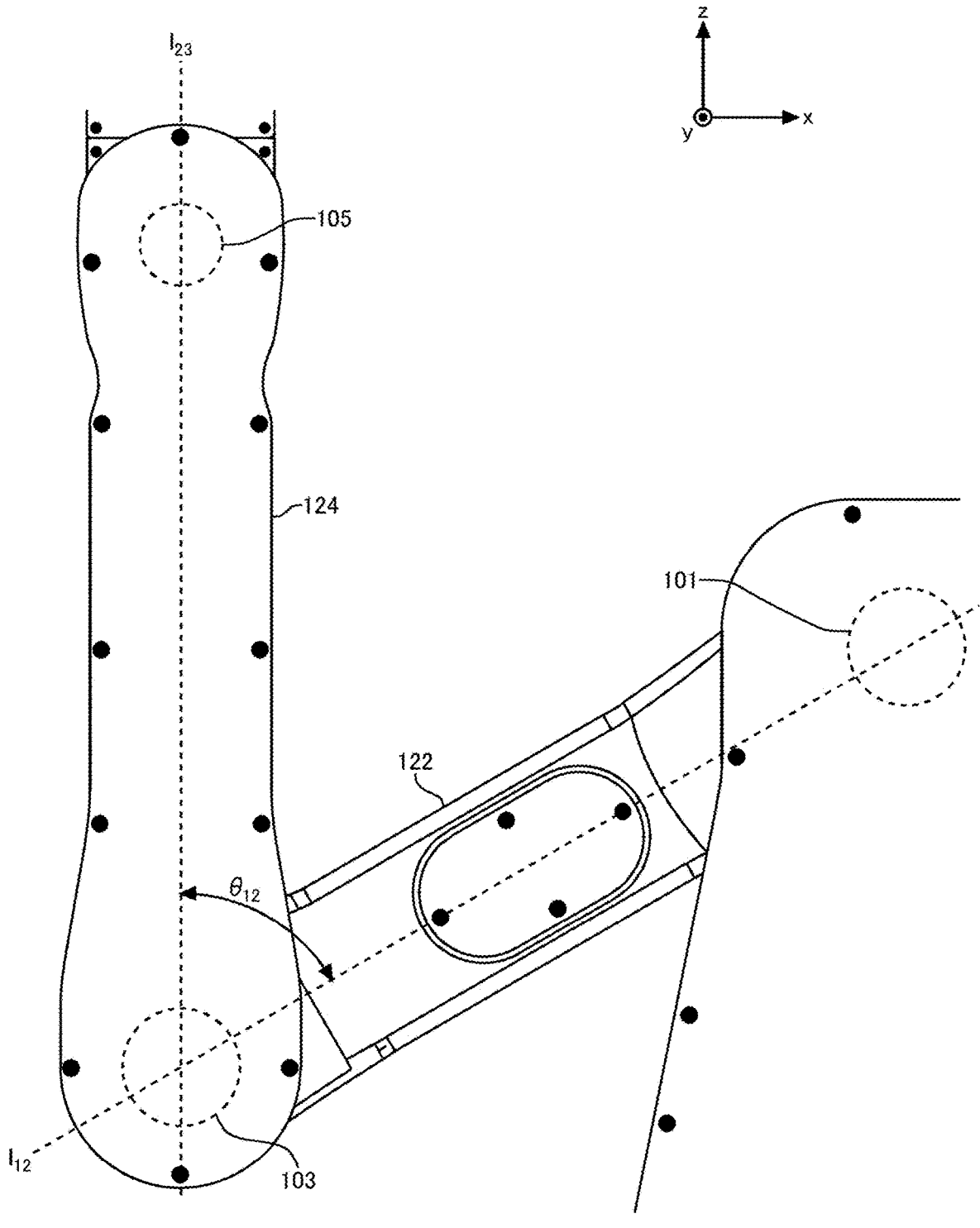
FIG. 8 is an explanatory diagram for explaining a movable range of a second arm 124.

FIG. 8 is an explanatory diagram for explaining a movable range of the second arm 124. The movable range of the second arm 124 may be determined based on the angular range of an angle $\theta_{12}$ between the vector parallel to $I_{12}$ and the vector parallel to $I_{23}$. The angular range of $\theta_{12}$ may be determined by the lengths, shapes, and the like of the first arm 122 and the second arm 124.

The elbow system of the robot 100 is determined, for example, based on the angular range of $\theta_{12}$. Note that the angular range of $\theta_{12}$ may be referred to as an elbow-system angular range.

The elbow-system angular range includes, for example, a first elbow-system angular range and a second elbow-system angular range. For example, the first elbow-system angular range corresponds to a case where the first movable portion 120 is extended in the positive rotation direction, and the second elbow-system angular range corresponds to a case where the first movable portion 120 is extended in the negative rotation direction. FIG. 8 illustrates an example of the robot 100 in a case where $\theta_{12}$ is included in the first elbow-system angular range.

Figure 9:
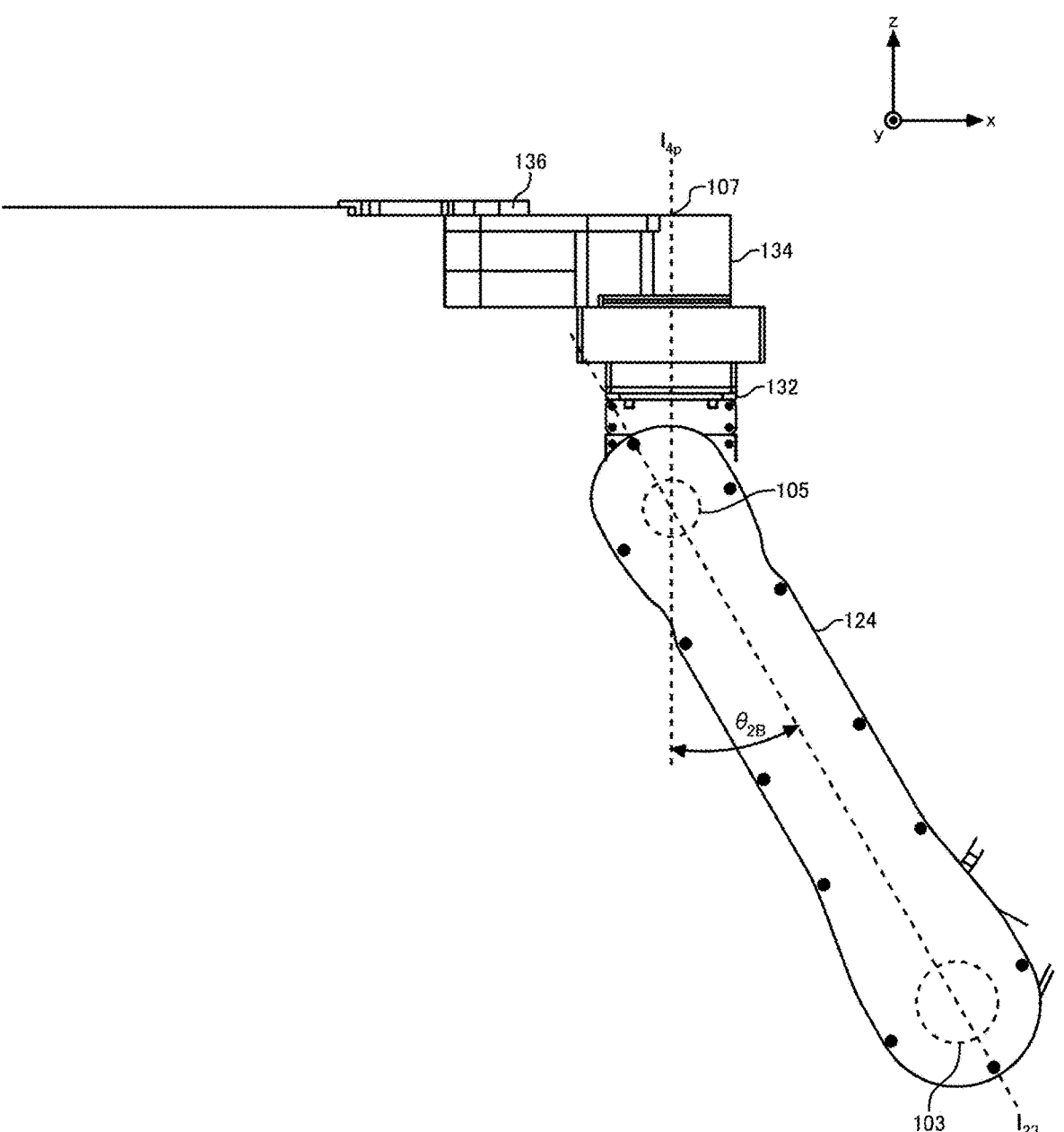
FIG. 9 is an explanatory diagram for explaining a movable range of a second base 132.

FIG. 9 is an explanatory diagram for explaining a movable range of the second base 132. The movable range of the second base 132 may be determined based on the angular range of an angle $\theta_{2B}$ between the vector parallel to $I_{23}$ and the vector parallel to $I_{4p}$. The angular range of $\theta_{2B}$ may be determined by the shapes and the like of the second arm 124 and the second base 132.

The wrist system of the robot 100 is determined, for example, based on the angular range of $\theta_{2B}$. Note that the angular range of $\theta_{2B}$ may be referred to as a wrist-system angular range.

The wrist-system angular range includes, for example, a first wrist-system angular range and a second wrist-system angular range. For example, the first wrist-system angular range corresponds to a case where the second base 132 is rotated in the positive rotation direction with respect to a state where the direction of the vector parallel to $I_{23}$ coincides with the direction of the vector parallel to $I_{4p}$, and the second wrist-system angular range corresponds to a case where the second base 132 is rotated in the negative rotation direction with respect to a state where the direction of the vector parallel to $I_{23}$ coincides with the direction of the vector parallel to $I_{4p}$. FIG. 9 illustrates an example of the robot 100 in a case where $\theta_{2B}$ is included in the second wrist-system angular range.

Figure 10:
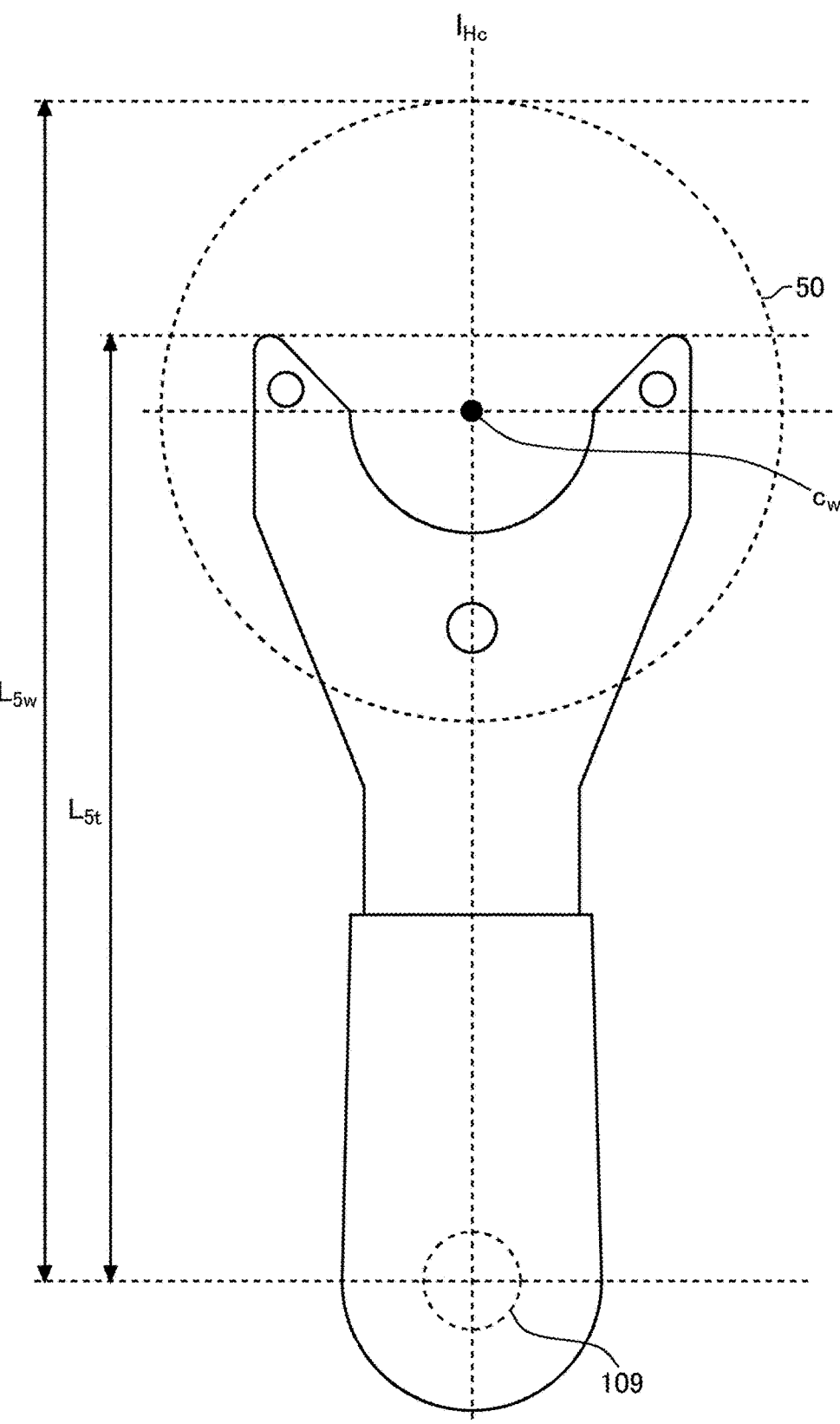
FIG. 10 schematically illustrates an example of a hand 136.

FIG. 10 schematically illustrates an example of the hand 136. FIG. 10 is a top view schematically illustrating an example of the hand 136.

$I_{Hc}$ is a center line of the hand 136 perpendicular to the fifth rotation shaft 109 and passing through the fifth rotation shaft 109. FIG. 10 illustrates an example of a case where the hand 136 holds the wafer 50 such that the $I_{Hc}$ passes through a center point $c_w$ of the wafer 50. Note that the reach of the robot arm is considered a length from the first rotation shaft 101 to the center point $c_w$ of the wafer 50.

$L_{5w}$ is a length from the fifth rotation shaft 109 to the distal end of the wafer 50 when the hand 136 holds the wafer 50. For example, $L_{5w}$ is longer than $L_{5r}$. $L_{5w}$ may be shorter than $L_{5r}$. A magnitude relationship between $L_{5w}$ and $L_{5r}$ may be determined according to the method of the hand 136 holding the wafer 50 or the shape of the hand 136. FIG. 10 illustrates an example of a case where $L_{5w}$ is longer than $L_{5r}$.

Figure 11:
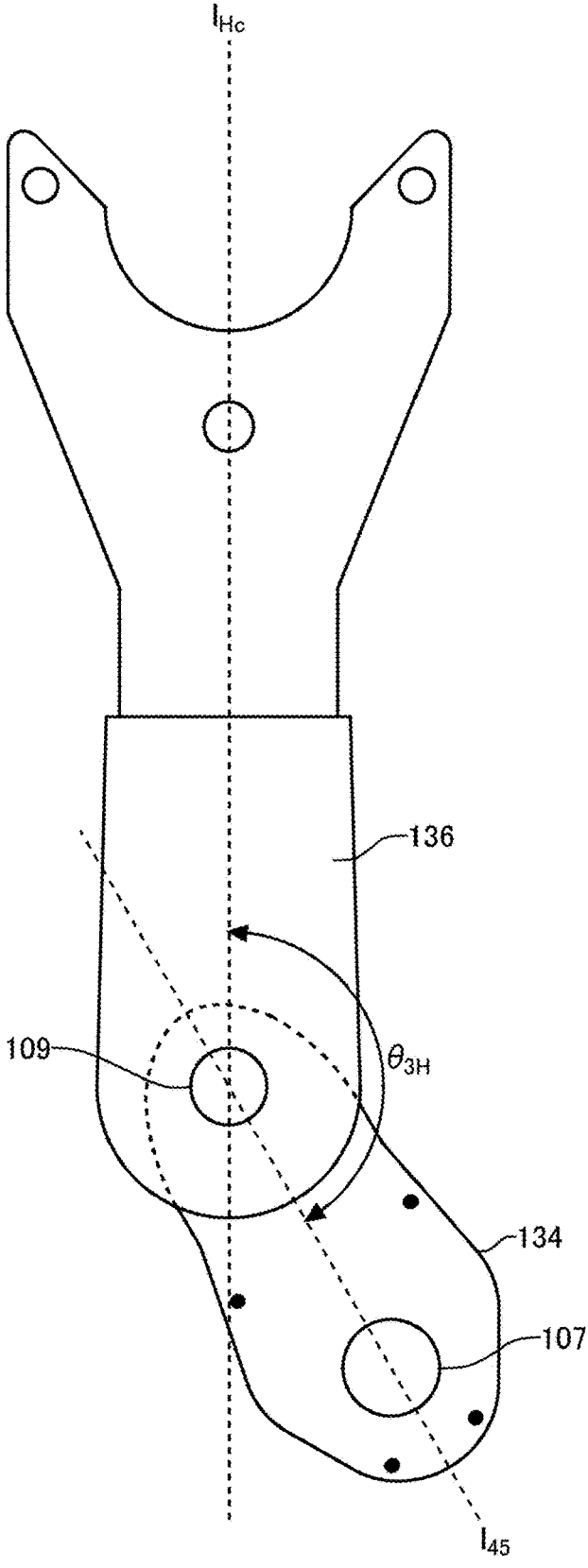
FIG. 11 is an explanatory diagram for explaining a movable range of the hand 136.

FIG. 11 is an explanatory diagram for explaining a movable range of the hand 136. The movable range of the hand 136 may be determined based on an angular range of an angle $\theta_{3H}$ between a vector parallel to a straight line $I_{45}$ passing through the fourth rotation shaft 107 and the fifth rotation shaft 109 and perpendicular to the fourth rotation shaft 107 and the fifth rotation shaft 109 and a vector parallel to the $I_{Hc}$.

The hand system of the robot 100 is determined based on, for example, the angular range of $\theta_{3H}$. Note that the angular range of $\theta_{3H}$ may be referred to as a hand-system angular range.

The hand-system angular range includes a first hand-system angular range and a second hand-system angular range. For example, when $\theta_{3H}$ is included in the first hand-system angular range, the distal end of the hand 136 is positioned on the right side of $I_{45}$, and when $\theta_{3H}$ is included in the second hand-system angular range, the distal end of the hand 136 is positioned on the left side of $I_{45}$. For example, the first hand-system angular range corresponds to a case where the hand 136 is rotated in the positive rotation direction with respect to a state where the direction of the vector parallel to $I_{45}$ coincides with the direction of the vector parallel to the $I_{Hc}$, and the second hand-system angular range corresponds to a case where the hand 136 is rotated in the negative rotation direction with respect to a state where the direction of the vector parallel to $I_{45}$ coincides with the direction of the vector parallel to the $I_{Hc}$. For example, the first hand-system angular range is an angle from 0° to 180°, and the second hand-system angular range is an angle from −180° to 0°. In this case, the angular range of $\theta_{3H}$ is an angle from −180° to 180°. The angular range of $\theta_{3H}$ may be any other angular range. FIG. 11 illustrates an example of the robot 100 in a case where $\theta_{3H}$ is included in the first hand-system angular range.

Figure 12:
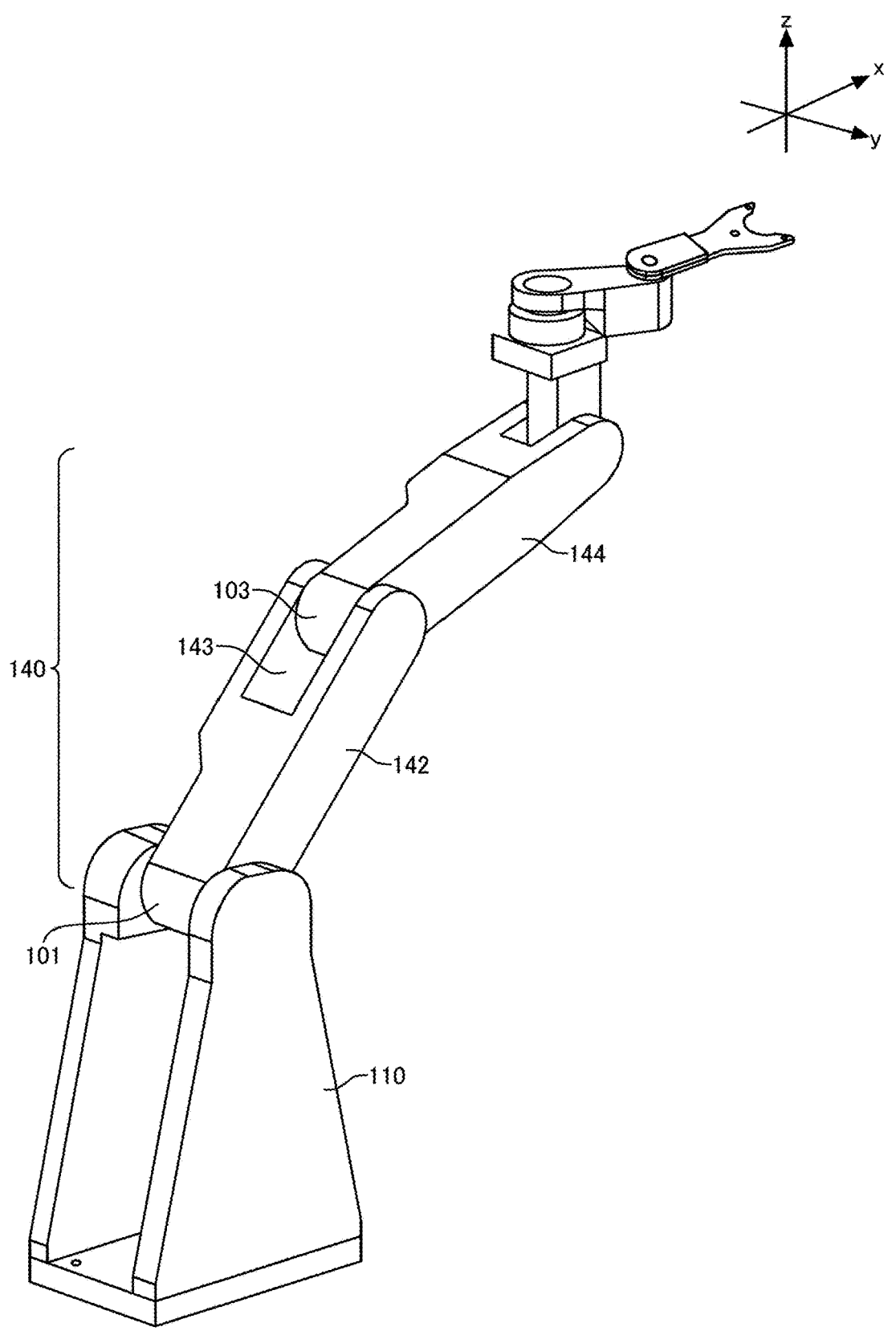
FIG. 12 is a perspective view schematically illustrating another example of the robot 100.

FIG. 12 is a perspective view schematically illustrating another example of the robot 100. Here, points different from the robot 100 in FIG. 1 will be mainly described.

The robot 100 may include a first movable portion 140. The first movable portion 140 may have a first arm 142 and a second arm 144. The first movable portion 140 may be movable in the vertical plane. In an example illustrated in FIG. 12, the first movable portion 140 is movable in the xz plane.

The proximal end side of the first arm 142 may be connected to the first base 110 to be rotatable about the first rotation shaft 101 in the vertical plane. The proximal end side of the second arm 144 may be connected to the distal end side of the first arm 142 to be rotatable about the second rotation shaft 103 in the vertical plane.

The first arm 142 and the second arm 144 have a structure in which the trajectory of the first arm 142 and the trajectory of the second arm 144 overlap each other when the first arm 142 and the second arm 144 rotate, for example. For example, the width of the trajectory of the second arm 144 in the direction perpendicular to the vertical plane falls within the width of the trajectory of the first arm 142 in the direction perpendicular to the vertical plane. FIG. 12 illustrates an example of the robot 100 in which the width of the trajectory of the second arm 144 in the y axis direction falls within the width of the trajectory of the first arm 142 in the y axis direction.

For example, in the connecting portion between the first arm 142 and the second arm 144, the connecting portion on the distal end side of the first arm 142 is connected to the connecting portion on the proximal end side of the second arm 144 such that a width between the outer surfaces of the second arm 144 in the direction parallel to the second rotation shaft 103 falls within a width between the inner surfaces of the first arm 142 in the direction parallel to the second rotation shaft 103. For example, in the connecting portion between the first arm 142 and the second arm 144, the connecting portion on the distal end side of the first arm 122 is connected to the connecting portion on the proximal end side of the second arm 124 so as to sandwich the outer surface of the second arm 144.

With the structure in which the trajectory of the first arm 142 and the trajectory of the second arm 144 overlap each other when the first arm 142 and the second arm 144 rotate, the width of the trajectory can be further narrowed as compared with a robot having a structure in which the trajectories of two arms do not overlap when the two arms rotate. Accordingly, it is possible to achieve a robot that can be arranged in a region with a narrower width.

At least one of the first arm 142 or the second arm 144 has a structure capable of avoiding the interference between the first arm 142 and the second arm 144 in a state where the projection of the link portion of the first arm 142 onto the vertical plane and the projection of the link portion of the second arm 144 onto the vertical plane overlap each other, for example. For example, in the connecting portion between the first arm 142 and the second arm 144, the connecting portion on the distal end side of the first arm 142 is connected to the connecting portion on the proximal end side of the second arm 144 such that a gap 143 exists.

With the structure which is capable of avoiding the interference between the first arm 142 and the second arm 144 in a state where the projection of the link portion of the first arm 142 onto the vertical plane and the projection of the link portion of the second arm 144 onto the vertical plane overlap each other, it is possible to further bend the first movable portion 140 while avoiding the occurrence of the interference between the first arm 142 and the second arm 144. Accordingly, it is possible to achieve a robot capable of moving the movement target in a wider range.

Figure 13:
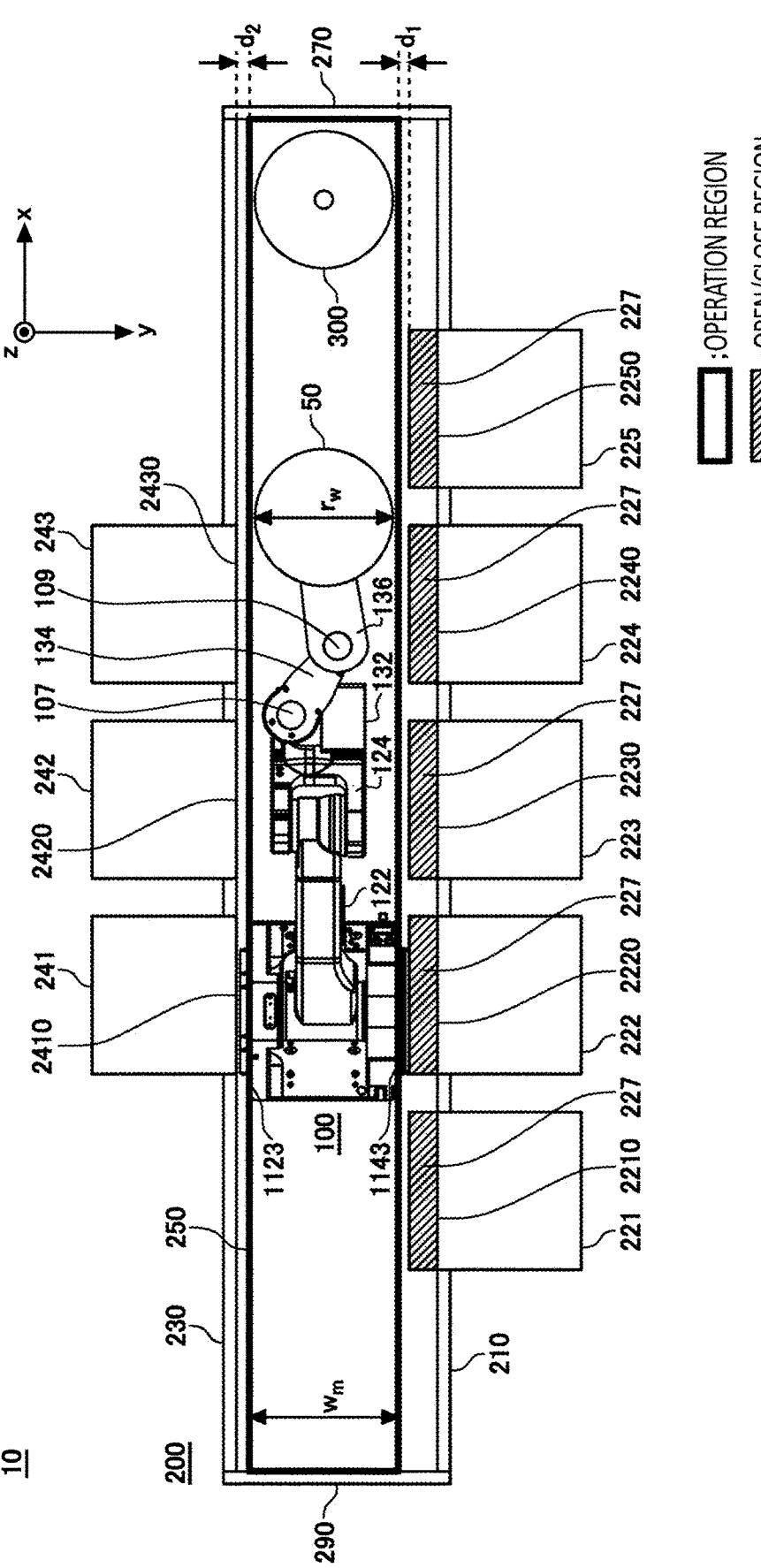
FIG. 13 schematically illustrates an example of a system 10.

FIG. 13 schematically illustrates an example of a system 10. FIG. 13 is a top view schematically illustrating an example of the system 10.

The system 10 may include the robot 100 and a housing 200. The system 10 may further include a PA 300.

The housing 200 is, for example, an EFEM. The EFEM has, for example, a front wall 210 having one or more openings. The EFEM has, for example, a back wall 230 facing the front wall 210 and having one or more openings. Note that the opening of the front wall 210 of the housing 200 and the opening of the back wall 230 of the housing 200 may be collectively referred to as an opening of the housing 200.

One or more openings of the front wall 210 of the EFEM are openings for access to a cassette storing the wafer 50. The cassette is, for example, a front-opening unified pod (FOUP).

For example, the FOUP accommodates a plurality of wafers 50 in multiple stages, and has a sealing lid openable and closable on a side surface. The FOUP conforms to, for example, the semiconductor equipment and materials international standards (SEMI standards). The sealing lid is opened and closed by a cassette opener. A specific structure of the cassette opener will be described later.

One or more openings of the back wall 230 of the EFEM are openings for access to a processing chamber side. For example, when the opening of the back wall 230 of the EFEM is an opening corresponding to a load lock chamber interposed between the EFEM and the processing chamber, the opening is an opening for access to the load lock chamber. Note that in the processing chamber connected to the EFEM via the load lock chamber, processing on the wafer 50 such as etching, ashing, and chemical vapor deposition (CVD) is executed.

The load lock chamber is a chamber interposed between the EFEM and the processing chamber or a vacuum conveyance chamber. Since the processing, such as etching, performed on the wafer 50 in the processing chamber is usually performed in a reduced pressure environment, the load lock chamber is provided between the EFEM and the processing chamber or the vacuum conveyance chamber.

The load lock chamber has, for example, open/close doors, which can seal the chamber and be opened and closed, on both sides of the EFEM side and the processing chamber side or the vacuum conveyance chamber side. The open/close door is also referred to as a gate valve.

For example, the inner pressure state of the load lock chamber is appropriately adjusted to a depressurized state or an atmospheric pressure state, so that the load lock chamber is adjusted to a state where the movement target is movable between the EFEM and the processing chamber. For example, the inner pressure state of the load lock chamber is adjusted to a substantially atmospheric pressure state, so that the load lock chamber is adjusted to a state where the movement target is movable between the EFEM and the load lock chamber. For example, the inner pressure state of the load lock chamber is adjusted to a depressurized state substantially equivalent to that of the processing chamber or the vacuum conveyance chamber, so that the load lock chamber is adjusted to a state where the movement target is movable between the load lock chamber and the processing chamber or the vacuum conveyance chamber.

When the opening of the back wall 230 of the EFEM is an opening corresponding to a processing chamber that is directly connected to the EFEM without passing through the load lock chamber, the opening may be an opening for access to the processing chamber. In the processing chamber, processing on the wafer 50 such as cleaning is executed in an atmospheric pressure environment.

The robot 100 accesses, for example, the opening of the front wall 210 of the EFEM to load and unload the wafer 50 into and from the cassette. The robot 100 loads and unloads the wafer 50 into and from the cassette by, for example, introducing and withdrawing at least a part of the hand 136 through the opening of the front wall 210 of the EFEM. The robot 100 loads and unloads the wafer 50 into and from the cassette by further introducing and withdrawing at least a part of the third arm 134 through the opening of the front wall 210 of the EFEM.

The robot 100 accesses, for example, the opening of the back wall 230 of the EFEM to load and unload the wafer 50 into and from the load lock chamber or the processing chamber. The robot 100 loads and unloads the wafer 50 into and from the load lock chamber or the processing chamber by, for example, introducing and withdrawing at least a part of the hand 136 through the opening of the back wall 230 of the EFEM. The robot 100 loads and unloads the wafer 50 into and from the load lock chamber or the processing chamber by, for example, further introducing and withdrawing at least a part of the third arm 134 through the opening of the back wall 230.

The housing 200 may be a sorter. The housing 200 is, for example, a sorter having one or more openings for access to the cassette on both sides of the front wall 210 and the back wall 230. The housing 200 may be a sorter having a plurality of openings for access to the cassette only in the front wall 210. For example, the robot 100 accesses a plurality of openings of the sorter to unload the wafer 50 from one cassette and load the unloaded wafer 50 into another cassette, thereby rearranging the wafers 50 between a plurality of cassettes. The robot 100 may access a single opening of the sorter to unload the wafer 50 from one stage of one cassette and load the unloaded wafer 50 into another stage of the one cassette, thereby rearranging the wafer 50 between stages of the single cassette.

FIG. 13 illustrates an example of a case where the housing 200 is an EFEM comprising the front wall 210 having five openings: an opening 2210 for access to the cassette 221; an opening 2220 for access to the cassette 222; an opening 2230 for access to the cassette 223; an opening 2240 for access to the cassette 224; and an opening 2250 for access to the cassette 225, and the back wall 230 having three openings: an opening 2410 for access to the load lock chamber 241; an opening 2420 for access to the load lock chamber 242; and an opening 2430 for access to the load lock chamber 243. The number of openings of the front wall 210 is not limited to 5, and may be 4 or less or 6 or more. The number of openings of the back wall 230 is not limited to 3, and may be 2 or less or 4 or more. Note that the cassette 221, the cassette 222, the cassette 223, the cassette 224, and the cassette 225 may be collectively referred to as a cassette 220, and the load lock chamber 241, the load lock chamber 242, and the load lock chamber 243 may be collectively referred to as a load lock chamber 240.

An access target of the access by the robot 100 is, for example, the opening of the housing 200. The access target is, for example, the cassette 220. The access target is, for example, the load lock chamber 240. The access target is, for example, the processing chamber. The access target is, for example, the PA 300. The PA 300 is a device that rotates a rotation table in the state of being mounted with the wafer 50, detects a notch, which is a cutout formed around the wafer 50, by a sensor, and adjusts a direction of the notch to rotate the wafer 50 in a desired direction. The access target is, for example, a storage that temporarily stores the wafer 50. The access target is, for example, an inspection device such as a camera unit that inspects whether there is an abnormality in the wafer 50. The access target may be any other device related to semiconductor manufacturing.

The access target is positioned, for example, outside the housing 200. In this case, the housing 200 has, on a wall, an opening for access to the access target positioned outside the housing 200. The access target may be positioned inside the housing 200.

The access target is positioned, for example, on the front wall 210 side of the housing 200. FIG. 13 illustrates an example of a case where the cassette 220 is positioned on the front wall 210 side.

In addition to the cassette 220, a further access target may be positioned on the front wall 210 side of the housing 200. The further access target is positioned, for example, above the cassette 220. The further access target is positioned, for example, below the cassette 220. The further access target is positioned, for example, on the left side of the cassette 221. The further access target is positioned, for example, on the right side of the cassette 225.

The access target is positioned, for example, on the back wall 230 side of the housing 200. FIG. 13 illustrates an example of a case where the load lock chamber 240 is positioned on the back wall 230 side.

In addition to the load lock chamber 240 when the housing 200 is an EFEM and the cassette 220 when the housing 200 is a sorter, a further access target may be positioned on the back wall 230 side of the housing 200. The further access target is positioned, for example, above the load lock chamber 240 or the cassette 220. The further access target is positioned, for example, below the load lock chamber 240 or the cassette 220. The further access target is positioned, for example, on the left side of the load lock chamber 241 or the cassette 220 at the left end. The further access target is positioned, for example, on the right side of the load lock chamber 243 or the cassette 220 at the right end.

The access target is positioned, for example, on the first side wall 270 side of the housing 200. FIG. 13 illustrates an example of a case where the PA 300 is positioned on the first side wall 270 side.

The access target may be positioned on the second side wall 290 side of the housing 200 facing the first side wall 270. Note that the first side wall 270 and the second side wall 290 may be collectively referred to as a side wall of the housing 200.

The cassette 220 may be opened and closed by a cassette opener. The cassette opener is also referred to as a load port.

The cassette opener may open and close the sealing lid of the FOUP mounted on a predetermined mounting portion of the cassette opener. When the cassette opener opens and closes the sealing lid of the FOUP, air outside the EFEM can be prevented from flowing into the EFEM. Accordingly, the wafer 50 can be loaded into and unloaded from the FOUP by the robot 100 while maintaining a state where the inside of the EFEM is locally cleaner than the outside of the EFEM.

The cassette opener is provided, for example, at a position corresponding to the opening of the front wall 210. The cassette opener is provided, for example, at a position corresponding to each of a plurality of openings of the front wall 210.

When the housing 200 is a sorter having an opening for access to the cassette 220 in the back wall 230, the cassette opener may be provided at a position corresponding to the opening in the back wall 230. When the housing 200 is a sorter having a plurality of openings for access to the cassette 220 in the back wall 230, the cassette opener may be provided at a position corresponding to each of the plurality of openings in the back wall 230.

An open/close region 227 is a region for the cassette opener to open and close the sealing lid of the cassette 220. The open/close region 227 is, for example, a region defined by the SEMI standards.

An operation region 250 is a region where the robot 100 conveys the movement target. Here, "convey" means that the robot 100 moves the movement target in the operation region 250. Therefore, the movement of the movement target by the robot 100 from the inside of the operation region 250 to the outside of the operation region 250 and the movement of the movement target by the robot 100 from the outside of the operation region 250 to the inside of the operation region 250 are not included in "convey".

The operation region 250 is a region defined in the housing 200. The operation region 250 is, for example, a region defined in a space between the front wall 210 and the back wall 230.

The operation region 250 is defined so as not to overlap the open/close region 227 on the front wall 210 side, for example. The operation region 250 is defined to be separated from the open/close region 227 on the front wall 210 side by a predetermined distance $d_1$, for example. $d_1$ is, for example, 10 mm.

When the operation region 250 is defined so as not to overlap the open/close region 227, the system 10 becomes a system conforming to the SEMI standards. Then, the robot 100 that can be arranged in a region with a narrow width conveys the movement target in the operation region 250. Accordingly, it is possible to achieve a system that achieves both high versatility and reduction in the thickness of the housing.

The operation region 250 is further defined, for example, so as not to overlap a region of which a distance from the opening of the back wall 230 is equal to or less than a predetermined distance. For example, as illustrated in FIG. 13, when the housing 200 is an EFEM, the operation region 250 is further defined so as not to overlap a region of which a distance from the back wall 230 is less than or equal to a predetermined distance $d_2$. When the housing 200 is a sorter having an opening for access to the cassette 220 in the back wall 230, the operation region 250 may be defined so as not to overlap the open/close region on the back wall 230 side. In this case, the operation region 250 is defined to be separated from the open/close region on the back wall 230 side by $d_1$, for example.

When the operation region 250 is further defined so as not to overlap the region of which the distance from the opening of the back wall 230 is equal to or less than the predetermined distance, the operation region 250 is defined such that the front wall 210 side does not overlap the open/close region 227, and is defined such that the back wall 230 side does not overlap the open/close door provided in the load lock chamber 240 or the open/close region of the cassette 220. Accordingly, it is possible to achieve a system that achieves both higher versatility and further reduction in the thickness of the housing.

The robot 100 may move the movement target in the housing 200. For example, the robot 100 moves the movement target from one access target to another access target. Here, an example of a case where the wafer 50 is moved from the cassette 225 of the front wall 210 illustrated in FIG. 13 to the load lock chamber 242 of the back wall 230 will be mainly described. Note that a state where the hand 136 does not hold the wafer 50 and the hand 136 is positioned at a position in the operation region 250 where the opening 2250 for access to the cassette 225 is accessible is defined as a start state.

First, the control unit 152 controls the second movable portion 130 so as to cause the hand 136 to access the opening 2250 for access to the cassette 225 by moving the hand 136 from the inside of the operation region 250 to the outside of the operation region 250. The control unit 152 controls the second movable portion 130 so as to cause the hand 136 to access the opening 2250 by, for example, the cooperative operation of the third arm 134 and the hand 136.

The cooperative operation of the third arm 134 and the hand 136 is, for example, the cooperative operation of only the third arm 134 and the hand 136. The cooperative operation of the third arm 134 and the hand 136 may be the cooperative operation of the third arm 134 and the hand 136 with another component of the robot 100.

Next, in response to the hand 136 accessing the opening 2250, the control unit 152 controls the second movable portion 130 so as to unload the wafer 50 from the cassette 225. The control unit 152 controls the second movable portion 130 to unload the wafer 50 from the cassette 225 by, for example, the cooperative operation of the third arm 134 and the hand 136.

Next, the control unit 152 controls the second movable portion 130 so as to move the hand 136 in the state of holding the wafer 50 from the outside of the operation region 250 to the inside of the operation region 250. The control unit 152 controls the second movable portion 130 so as to move the hand 136 in the state of holding the wafer 50 from the outside of the operation region 250 to the inside of the operation region 250 by, for example, the cooperative operation of the third arm 134 and the hand 136.

Next, the control unit 152 controls the first movable portion 120 and the second movable portion 130 so as to convey the wafer 50 in a state where the wafer 50 held by the hand 136 is located inside the operation region 250. The state where the wafer 50 held by the hand 136 is located inside the operation region 250 includes, for example, a state where the width of the wafer 50 in the direction perpendicular to the direction in which the wafer 50 is conveyed falls within the width of the operation region 250 in the direction perpendicular to the direction in which the wafer 50 is conveyed. For example, when the shape of the wafer 50 is a disc shape, the width of the wafer 50 in the direction perpendicular to the direction in which the wafer 50 is conveyed is the diameter of the wafer 50. FIG. 13 illustrates an example of a case where the direction in which the wafer 50 is conveyed is an x axis direction, and a width $r_w$ of the wafer 50 in the y axis direction falls within a width $w_m$ of the operation region 250 in the y axis direction. Note that the width of the operation region 250 in the direction perpendicular to the direction in which the wafer 50 is conveyed may be referred to as the width of the operation region 250.

The width of the operation region 250 is determined based on the size of the wafer 50, for example. For example, when the shape of the wafer 50 is a disc shape, the width is determined based on the diameter of the wafer 50. For example, the width of the operation region 250 is determined such that the width of the operation region 250 with respect to the diameter of the wafer 50 is smaller than a predetermined ratio. For example, when the diameter of the wafer 50 is 300 mm, the width of the operation region 250 is 330 mm.

For example, the control unit 152 controls the first movable portion 120 and the second movable portion 130 so as to convey the wafer 50, in a state where the wafer 50 held by the hand 136 is located inside the operation region 250, by the cooperative operation of the third arm 134, the hand 136, and the first movable portion 120. The cooperative operation of the third arm 134, the hand 136, and the first movable portion 120 includes, for example, the cooperative operation of the third arm 134, the hand 136, and the first arm 122. The cooperative operation of the third arm 134, the hand 136, and the first movable portion 120 includes, for example, the cooperative operation of the third arm 134, the hand 136, and the second arm 124. The cooperative operation of the third arm 134, the hand 136, and the first movable portion 120 may include the cooperative operation of the third arm 134, the hand 136, the first arm 122, and the second arm 124.

Next, in response to conveyance of the wafer 50 to a predetermined position in a state where the wafer 50 is located inside the operation region 250, the control unit 152 controls the second movable portion 130 so as to cause the hand 136 to access the opening 2420 for access to the load lock chamber 242 by moving the hand 136 from the inside of the operation region 250 to the outside of the operation region 250. The control unit 152 controls the second movable portion 130 so as to cause the hand 136 to access the opening 2420 by, for example, the cooperative operation of the third arm 134 and the hand 136.

Thereafter, in response to the hand 136 accessing the opening, the control unit 152 controls the second movable portion 130 so as to load the wafer 50 into the load lock chamber 242. The control unit 152 controls the second movable portion 130 so as to load the wafer 50 into the load lock chamber 242 by, for example, the cooperative operation of the third arm 134 and the hand 136. Accordingly, the operation of the robot 100 that moves the wafer 50 from the cassette 225 to the load lock chamber 242 ends.

In an example of a case where the wafer 50 is moved from the cassette 225 of the front wall 210 to the load lock chamber 242 of the back wall 230, the robot 100 causes the hand 136 to access the opening 2420 by the cooperative operation of the third arm 134 and the hand 136.

However, unlike the cassette 220, the load lock chamber 240 does not conform to the SEMI standards in many cases. For this reason, when an attempt is made to cause the hand 136 to access the opening for access to the load lock chamber 240 by the cooperative operation of the third arm 134 and the hand 136, interference may occur between the load lock chamber 240 and the third arm 134 or the wafer 50 or the hand 136 depending on the dimension, position, or the like of the load lock chamber 240, and thus, there is a case where the robot 100 cannot load and unload the wafer 50 into and from the load lock chamber 240. In this case, the robot 100 accesses the opening with the hand 136 by the cooperative operation of the third arm 134, the hand 136, and the first movable portion 120, so that the wafer 50 can be loaded into and unloaded from the load lock chamber 240 without any interference between the load lock chamber 240 and the third arm 134 or the wafer 50 or the hand 136.

As described above, the robot 100 may have a structure capable of conveying the movement target such as the wafer 50 held by the hand 136 in a state where the movement target is located inside the operation region 250. As a result, it is possible to achieve a robot that can contribute to reduction in the thickness of the housing.

For example, the control unit 152 causes the hand 136 to access the access target in a state where the hand 136 is parallel to the horizontal plane. In an example illustrated in FIG. 13, the control unit 152 causes the hand 136 to access the access target in a state where the hand 136 is parallel to the xy plane.

When the hand 136 accesses the access target in the state of being parallel to the horizontal plane, it is possible to reduce the risk that the movement target falls from the hand during the operation of the robot 100 unloading the movement target or the operation of the robot 100 loading the movement target. Accordingly, it is possible to achieve a robot capable of moving the movement target more safely. As a result, it is possible to achieve a robot that can contribute to realization of a system having a high yield in semiconductor manufacturing.

For example, the width, in the direction perpendicular to the vertical plane, of the trajectory of the first movable portion 120 when the wafer 50 is conveyed in the operation region 250 falls within the width, in the direction perpendicular to the vertical plane, of the trajectory of the wafer 50 being conveyed. The trajectory of the first movable portion 120 when the wafer 50 is conveyed includes, for example, the trajectory of the first arm 122 when the wafer 50 is conveyed. The trajectory of the first movable portion 120 when the wafer 50 is conveyed includes, for example, the trajectory of the second arm 124 when the wafer 50 is conveyed. FIG. 13 illustrates an example of a case where the vertical plane of the trajectory of the first movable portion 120 when the wafer 50 is conveyed is the xz plane, the vertical plane of the trajectory of the wafer 50 is the xz plane, and the width in the y axis direction of the trajectory of the first movable portion 120 when the wafer 50 is conveyed falls within the width in the y axis direction of the trajectory of the wafer 50.

As described above, the robot 100 may have a structure in which the width, in the direction perpendicular to the vertical plane, of the trajectory of the first movable portion 120 when the wafer 50 is conveyed falls within the width, in the direction perpendicular to the vertical plane, of the trajectory of the wafer 50 being conveyed. Accordingly, it is possible to achieve reduction in the thickness of the robot.

For example, the width, in the direction perpendicular to the vertical plane, of the trajectory of the first movable portion 120 when the wafer 50 is conveyed in the operation region 250 falls within the width in the direction perpendicular to the vertical plane between the inner surface 1121 of the first side surface portion 112 and the inner surface 1141 of the second side surface portion 114. FIG. 13 illustrates an example of a case where the vertical plane of the trajectory of the first movable portion 120 when the wafer 50 is conveyed is the xz plane, the vertical plane between the inner surface 1121 and the inner surface 1141 is the xz plane, and the width in the y axis direction of the trajectory of the first movable portion 120 when the wafer 50 is conveyed falls within the width in the y axis direction between the inner surface 1121 and the inner surface 1141 of the second side surface portion 114.

As described above, the robot 100 may have a structure in which the width, in the direction perpendicular to the vertical plane, of the trajectory of the first movable portion 120 when the wafer 50 is conveyed falls within the width in the direction perpendicular to the vertical plane between the inner surface 1121 and the inner surface 1141. Accordingly, it is possible to achieve reduction in the thickness of the robot.

For example, the width, in the direction perpendicular to the vertical plane, of the trajectory of the second movable portion 130 when the wafer 50 is conveyed in the operation region 250 falls within the width, in the direction perpendicular to the vertical plane, of the trajectory of the wafer 50 being conveyed. The trajectory of the second movable portion 130 when the wafer 50 is conveyed includes, for example, the trajectory of the second base 132 when the wafer 50 is conveyed. The trajectory of the second movable portion 130 when the wafer 50 is conveyed includes, for example, the trajectory of the third arm 134 when the wafer 50 is conveyed. The trajectory of the second movable portion 130 when the wafer 50 is conveyed includes, for example, the trajectory of the hand 136 when the wafer 50 is conveyed. FIG. 13 illustrates an example of a case where the vertical plane of the trajectory of the second movable portion 130 when the wafer 50 is conveyed is the xz plane, the vertical plane of the trajectory of the wafer 50 is the xz plane, and the width in the y axis direction of the trajectory of the second movable portion 130 when the wafer 50 is conveyed falls within the width in the y axis direction of the trajectory of the wafer 50.

As described above, the robot 100 may have a structure in which the width, in the direction perpendicular to the vertical plane, of the trajectory of the second movable portion 130 when the wafer 50 is conveyed falls within the width, in the direction perpendicular to the vertical plane, of the trajectory of the wafer 50 being conveyed. Accordingly, it is possible to achieve reduction in the thickness of the robot.

For example, the trajectory of the fourth rotation shaft 107 when the wafer 50 is conveyed may be shifted from the center line of the width, in the direction perpendicular to the vertical plane, of the trajectory of the second movable portion 130 when the wafer 50 is conveyed. For example, the trajectory of the fourth rotation shaft 107 when the wafer 50 is conveyed is shifted toward the back wall 230 from the center line of the width, in the direction perpendicular to the vertical plane, of the trajectory of the second movable portion 130 when the wafer 50 is conveyed. The trajectory of the fourth rotation shaft 107 when the wafer 50 is conveyed may be shifted toward the front wall 210 from the center line of the width, in the direction perpendicular to the vertical plane, of the trajectory of the second movable portion 130 when the wafer 50 is conveyed. FIG. 13 illustrates an example of a case where the trajectory of the fourth rotation shaft 107 when the wafer 50 is conveyed is shifted toward the back wall 230 from the center line of the width in the y axis direction of the trajectory of the second movable portion 130 when the wafer 50 is conveyed.

As described above, for example, the robot 100 has a structure in which the trajectory of the fourth rotation shaft 107 when the wafer 50 is conveyed is shifted from the center line of the width, in the direction perpendicular to the vertical plane, of the trajectory of the second movable portion 130 when the wafer 50 is conveyed. Accordingly, the length of the third arm 134 can be made longer within a range in which the third arm 134 can rotate in the operation region 250. As a result, it is possible to achieve a robot that can access an access target positioned farther from the installation position of the robot.

As described above, for example, the robot 100 has a structure in which the trajectory of the fourth rotation shaft 107 when the wafer 50 is conveyed is shifted toward the back wall 230 from the center line of the width, in the direction perpendicular to the vertical plane, of the trajectory of the second movable portion 130 when the wafer 50 is conveyed. Accordingly, it is possible to achieve a robot that can easily access an access target positioned on the back wall 230 side. In particular, when the housing 200 is an EFEM, the load lock chamber 240 of which dimensions are not defined by the SEMI standards in many cases unlike the cassette 220 of which dimensions are defined by the SEMI standards is positioned on the back wall 230 side, and thus, since the robot 100 has this structure, the hand 136 can access the opening of the back wall 230 to reach the processing chamber side positioned farther, so that it is possible to achieve a robot that can easily access the load lock chamber 240 having various dimensions. As a result, it is possible to achieve a robot that can contribute to realization of a system with a high degree of freedom in design.

As described above, the robot 100 may have a structure in which the trajectory of the fourth rotation shaft 107 when the wafer 50 is conveyed is shifted toward the front wall 210 from the center line of the width, in the direction perpendicular to the vertical plane, of the trajectory of the second movable portion 130 when the wafer 50 is conveyed. Accordingly, it is possible to achieve a robot that can easily access the opening on the cassette 220 side positioned on the front wall 210 side.

For example, the length of the third arm 134 is shorter than the width of the operation region 250 in the direction perpendicular to the vertical plane. FIG. 13 illustrates an example of a case where the length of the third arm 134 is shorter than the width $w_m$ of the operation region 250 in the y axis direction.

As described above, the robot 100 has a structure in which the length of the third arm 134 is shorter than the width of the operation region 250. Accordingly, it is possible to achieve a robot having high operability of the robot arm when the movement target is conveyed in the operation region 250.

For example, the length of the hand 136 and the wafer 50 in a state where the hand 136 holds the wafer 50 is longer than the width of the operation region 250 in the direction perpendicular to the vertical plane. The length of the hand 136 and the wafer 50 may be the longer of $L_{5w}$ and $L_{5t}$. For example, when $L_{5w}$ is longer than $L_{5t}$, the length of the hand 136 and the wafer 50 is $L_{5w}$. For example, when $L_{5t}$ is longer than $L_{5w}$, the length of the hand 136 and the wafer 50 is $L_{5t}$. The length of the hand 136 and the wafer 50 may be the longer of a length from the proximal end of the hand 136 to the distal end of the wafer 50 and a length from the proximal end of the hand 136 to the distal end of the hand 136. FIG. 13 illustrates an example of a case where the length of the hand 136 and the wafer 50 are longer than the width $w_m$ of the operation region 250 in the y axis direction.

As described above, the robot 100 has a structure in which the length of the hand 136 and the wafer 50 in a state where the hand 136 holds the wafer 50 is longer than the width of the operation region 250. Accordingly, it is possible to achieve a robot that can access an access target positioned at a position farther away from the operation region 250.

For example, the maximum value of the width between the outer surface 1123 and the outer surface 1143 in the direction perpendicular to the vertical plane falls within the width of the operation region 250 in the direction perpendicular to the vertical plane. FIG. 13 illustrates an example of a case where the vertical plane between the outer surface 1123 and the outer surface 1143 is the xz plane, and the maximum value of the width between the outer surface 1123 and the outer surface 1143 in the y axis direction falls within the width $w_m$ of the operation region 250 in the y axis direction.

Since the maximum value of the width between the outer surface 1123 and the outer surface 1143 in the direction perpendicular to the vertical plane falls within the width of the operation region 250 in the direction perpendicular to the vertical plane, the robot 100 can be arranged in the housing 200 in a state where the first side surface portion 112 and the second side surface portion 114 of the first base 110 are located inside the operation region 250. Accordingly, it is possible to achieve a robot that can contribute to realization of a system that achieves both high versatility and reduction in the thickness of the housing.

Figure 14:
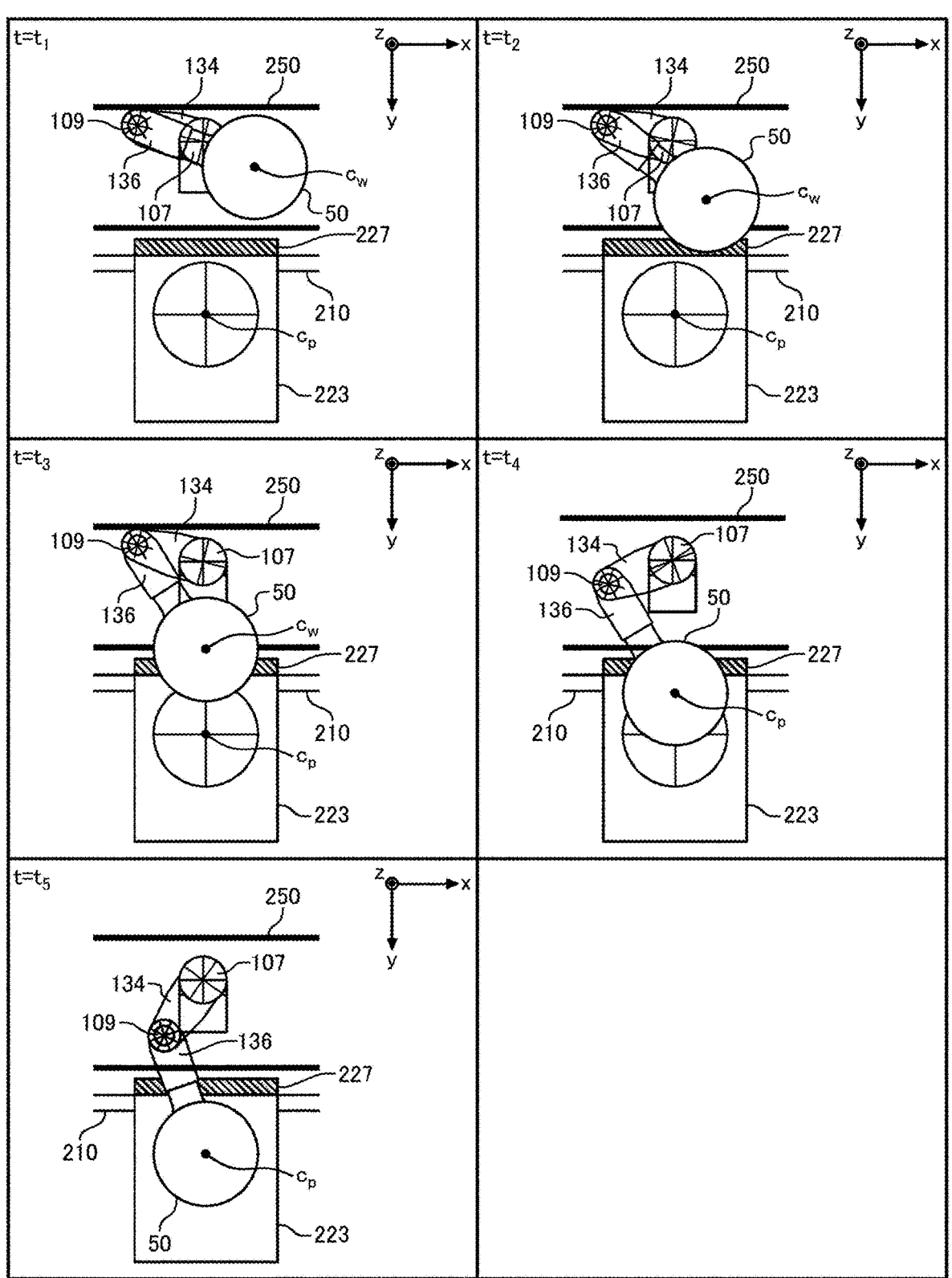
FIG. 14 is an explanatory diagram for explaining an example of cooperative operation of a third arm 134 and the hand 136.

FIG. 14 is an explanatory diagram for explaining an example of the cooperative operation of the third arm 134 and the hand 136. Here, an example of load processing in which the robot 100 loads the wafer 50 into the cassette 223 by the cooperative operation of the third arm 134 and the hand 136 in a state where $c_w$ of the wafer 50 coincides with a center $c_p$ of the installation position of the cassette 223 will be mainly described.

At time $t_1$, the wafer 50 is located inside the operation region 250. The control unit 152 controls the second movable portion 130 such that the wafer 50 in the state at time $t_1$ moves to the outside of the operation region 250.

At time $t_2$, a part of the wafer 50 is positioned outside the operation region 250. The control unit 152 controls the second movable portion 130 such that the wafer 50 in the state at time $t_2$ is included in the space in the cassette 223.

At time $t_3$, a part of the wafer 50 is included in the space in the cassette 223 in a state where $c_w$ of the wafer 50 is positioned on a straight line passing through the $c_p$ of the cassette 223 and parallel to the y axis. The control unit 152 controls the second movable portion 130 such that the wafer 50 in the state at time $t_3$ moves in the positive direction of the y axis.

At time $t_4$, the wafer 50 is positioned outside the operation region 250. The control unit 152 controls the second movable portion 130 such that the wafer 50 further moves in the positive direction of the y axis.

At time $t_5$, $c_w$ of the wafer 50 coincides with the $c_p$ of the cassette 223. When the wafer 50 in the state at time $t_5$ is placed on the cassette 223, the processing of loading the wafer 50 into the cassette 223 by the robot 100 ends.

In an example of the processing of loading the wafer 50 by the robot 100 illustrated in FIG. 14, the robot 100 loads the wafer 50 into the cassette 223 by the cooperative operation of the third arm 134 and the hand 136. Therefore, in an example of the processing of loading the wafer 50 by the robot 100 illustrated in FIG. 14, the position of the fourth rotation shaft 107 does not change throughout the load processing.

In the above description, an example of the cooperative operation of the third arm 134 and the hand 136 when the robot 100 loads the wafer 50 into the cassette 223 has been described. The robot 100 may unload the wafer 50 from the cassette 223 by the cooperative operation of the third arm 134 and the hand 136. For example, the control unit 152 controls the second movable portion 130 such that the state of the wafer 50 transitions in the order of the state at time $t_5$, the state at time $t_4$, the state at time $t_3$, the state at time $t_2$, and the state at time $t_1$, whereby the robot 100 unloads the wafer 50 from the cassette 223.

Figure 15:
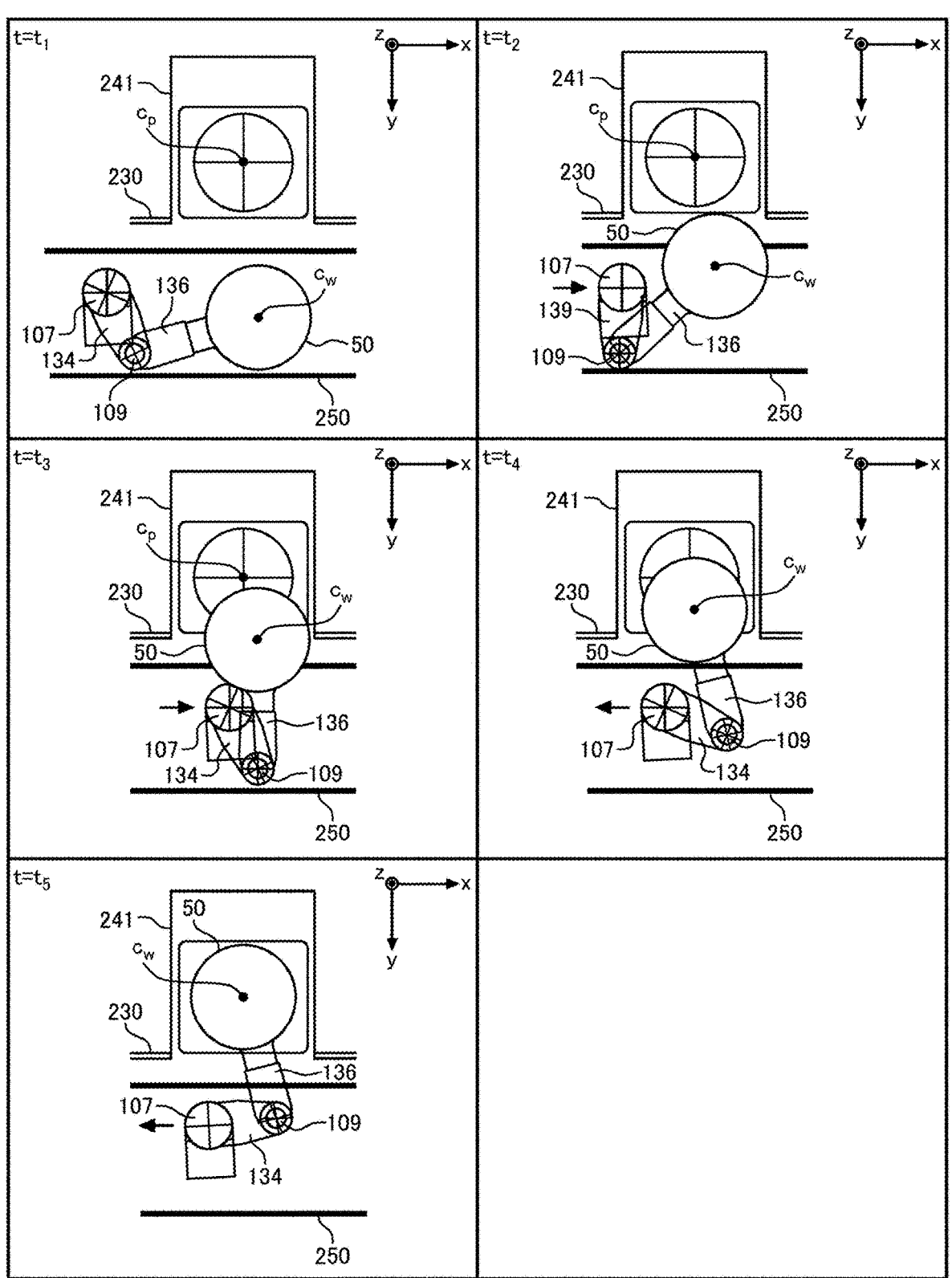
FIG. 15 is an explanatory diagram for explaining an example of cooperative operation of the third arm 134, the hand 136, and a first movable portion 120.

FIG. 15 is an explanatory diagram for explaining an example of the cooperative operation of the third arm 134, the hand 136, and the first movable portion 120. Here, an example of load processing in which the robot 100 loads the wafer 50 into the load lock chamber 241 by the cooperative operation of the third arm 134, the hand 136, and the first movable portion 120 in a state where $c_w$ of the wafer 50 coincides with the center $c_p$ of the installation position of the load lock chamber 241 will be mainly described.

At time $t_1$, the wafer 50 is located inside the operation region 250. The control unit 152 controls the first movable portion 120 and the second movable portion 130 such that the wafer 50 in the state at time $t_1$ moves to the outside of the operation region 250.

At time $t_2$, a part of the wafer 50 is positioned outside the operation region 250. When the state of the wafer 50 transitions from the state at time $t_1$ to the state at time $t_2$, the position of the fourth rotation shaft 107 moves in the positive direction of the x axis. The control unit 152 controls the first movable portion 120 and the second movable portion 130 such that the wafer 50 in the state at time $t_2$ is included in the space in the load lock chamber 241.

At time $t_3$, a part of the wafer 50 is included in the space in the load lock chamber 241. When the state of the wafer 50 transitions from the state at time $t_2$ to the state at time $t_3$, the position of the fourth rotation shaft 107 moves in the positive direction of the x axis. The control unit 152 controls the first movable portion 120 and the second movable portion 130 such that the wafer 50 in the state at time $t_3$ moves in the negative direction of the x axis and moves in the negative direction of the y axis.

At time $t_4$, the wafer 50 is positioned outside the operation region 250. When the state of the wafer 50 transitions from the state at time $t_3$ to the state at time $t_4$, the position of the fourth rotation shaft 107 moves in the negative direction of the x axis. The control unit 152 controls the first movable portion 120 and the second movable portion 130 such that the wafer 50 in the state at time $t_4$ further moves in the negative direction of the x axis and further moves in the negative direction of the y axis.

At time $t_5$, $c_w$ of the wafer 50 coincides with the center $c_p$ of the load lock chamber 241. When the state of the wafer 50 transitions from the state at time $t_4$ to the state at time $t_5$, the position of the fourth rotation shaft 107 moves in the negative direction of the x axis. When the wafer 50 in the state at time $t_5$ is placed in the load lock chamber 241, the processing of loading the wafer 50 into the load lock chamber 241 by the robot 100 ends.

In an example of the processing of loading the wafer 50 by the robot 100 illustrated in FIG. 15, the robot 100 loads the wafer 50 into the load lock chamber 241 by the cooperative operation of the third arm 134, the hand 136, and the first movable portion 120. Therefore, in an example of the processing of loading the wafer 50 by the robot 100 illustrated in FIG. 15, the position of the fourth rotation shaft 107 changes throughout the load processing. Specifically, while the state of the wafer 50 transitions in the order of the state at time $t_1$, the state at time $t_2$, and the state at time $t_3$, the position of the fourth rotation shaft 107 moves in the positive direction of the x axis, and while the state of the wafer 50 transitions in the order of the state at time $t_3$, the state at time $t_4$, and the state at time $t_5$, the position of the fourth rotation shaft 107 moves in the negative direction of the x axis.

In the above description, an example of the cooperative operation of the third arm 134, the hand 136, and the first movable portion 120 when the robot 100 loads the wafer 50 into the load lock chamber 241 has been described. The robot 100 may unload the wafer 50 from the load lock chamber 241 by the cooperative operation of the third arm 134, the hand 136, and the first movable portion 120. For example, the control unit 152 controls the first movable portion 120 and the second movable portion 130 such that the state of the wafer 50 transitions in the order of the state at time $t_5$, the state at time $t_4$, the state at time $t_3$, the state at time $t_2$, and the state at time $t_1$, whereby the robot 100 unloads the wafer 50 from the load lock chamber 241.

Figure 16:
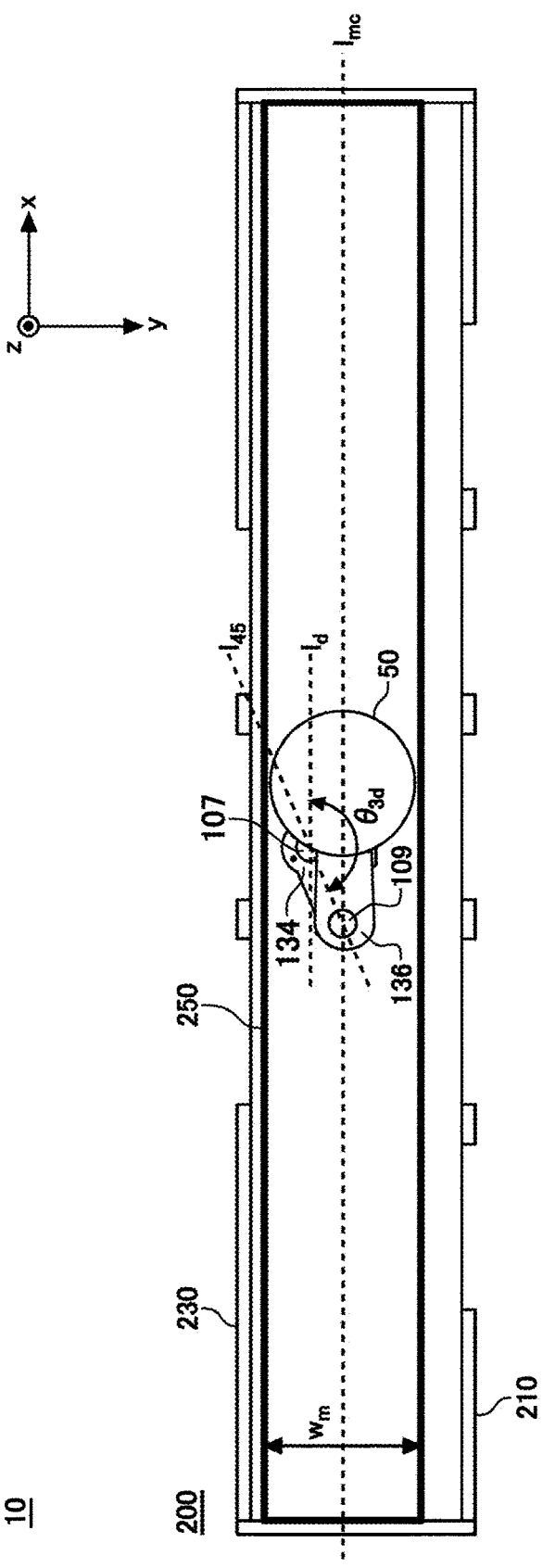
FIG. 16 schematically illustrates an example of a second movable portion 130 in a state where the hand 136 holds a wafer 50 in an operation region 250.

FIG. 16 schematically illustrates an example of the second movable portion 130 in a state where the hand 136 holds the wafer 50 in the operation region 250. Here, matters regarding the third arm 134 will be mainly described.

$I_d$ is a straight line parallel to the direction in which the wafer 50 is conveyed in the operation region 250. For example, the robot 100 conveys the wafer 50 while maintaining a state where an angle $\theta_{3d}$ between a vector parallel to $I_d$ and a vector parallel to $I_{45}$ is a predetermined offset angle. Note that the offset angle may be referred to as $\alpha$.

For example, $\alpha \neq 0°$. It may also be $\alpha = 0°$.

The forearm system of the robot 100 is determined based on, for example, the angular range of $\theta_{3d}$. Note that the angular range of $\theta_{3d}$ may be referred to as a forearm-system angular range.

The forearm-system angular range includes a first forearm-system angular range and a second forearm-system angular range. For example, the first forearm-system angular range corresponds to a state where the distal end side of the third arm 134 is positioned on the right side of the proximal end side of the third arm 134, and the second forearm-system angular range corresponds to a state where the distal end side of the third arm 134 is positioned on the left side of the proximal end side of the third arm 134. For example, the first forearm-system angular range is an angle from −90° to 90°, and the second forearm-system angular range is an angle from −180° to −90° and an angle from 90° to 180°. In this case, the angular range of $\theta_{3d}$ is an angle from −180° to 180°. The angular range of $\theta_{3d}$ may be any other angular range. FIG. 16 illustrates an example of the robot 100 in a case where $\theta_{3d}$ is included in the second forearm-system angular range.

$I_{mc}$ is a center line of the width of the operation region 250. The fourth rotation shaft 107 may be shifted from $I_{mc}$. The fourth rotation shaft 107 is shifted from $I_{mc}$ toward the back wall 230, for example. The fourth rotation shaft 107 may be shifted from $I_{mc}$ toward the front wall 210. FIG. 16 illustrates an example of the robot 100 in which the fourth rotation shaft 107 is shifted from $I_{mc}$ toward the back wall 230.

Figure 17:
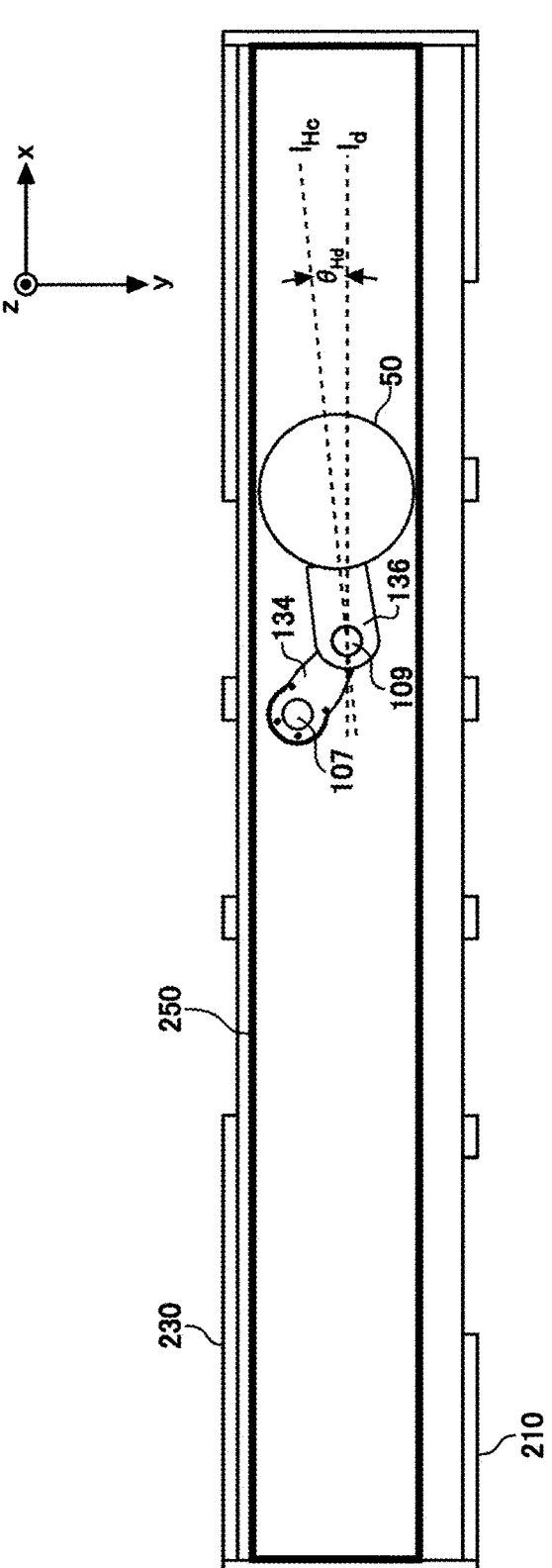
FIG. 17 schematically illustrates another example of the second movable portion 130 in a state where the hand 136 holds the wafer 50 in the operation region 250.

FIG. 17 schematically illustrates another example of the second movable portion 130 in a state where the hand 136 holds the wafer 50 in the operation region 250. Here, matters regarding the hand 136 will be mainly described.

For example, the robot 100 conveys the wafer 50 while maintaining a state where an angle $\theta_{Hd}$ between a vector parallel to $I_d$ and a vector parallel to the $I_{Hc}$ is a predetermined angle. Note that the predetermined angle may be referred to as $\beta$.

For example, $\beta \neq 0°$. FIG. 17 illustrates an example of the robot 100 that conveys the wafer 50 while maintaining the state of $\theta_{Hd} = \beta \neq 0°$.

It may also be $\beta = 0°$. FIG. 16 illustrates an example of the robot 100 that conveys the wafer 50 while maintaining the state of $\theta_{Hd} = \beta = 0°$.

The finger system of the robot 100 is determined based on, for example, the angular range of $\theta_{Hd}$. Note that the angular range of $\theta_{Hd}$ may be referred to as a finger-system angular range.

The finger-system angular range includes a first finger-system angular range and a second finger-system angular range. For example, the first finger-system angular range corresponds to a state where the distal end side of the hand 136 is positioned on the right side of the proximal end side of the hand 136, and the second finger-system angular range corresponds to a state where the distal end side of the hand 136 is positioned on the left side of the proximal end side of the hand 136. For example, the first finger-system angular range is an angle from −90° to 90°, and the second finger-system angular range is an angle from −180° to −90° and an angle from 90° to 180°. In this case, the angular range of $\theta_{Hd}$ is an angle from −180° to 180°. The angular range of $\theta_{Hd}$ may be any other angular range. FIG. 17 illustrates an example of the robot 100 in a case where $\theta_{Hd}$ is included in the first finger-system angular range.

Figure 18:
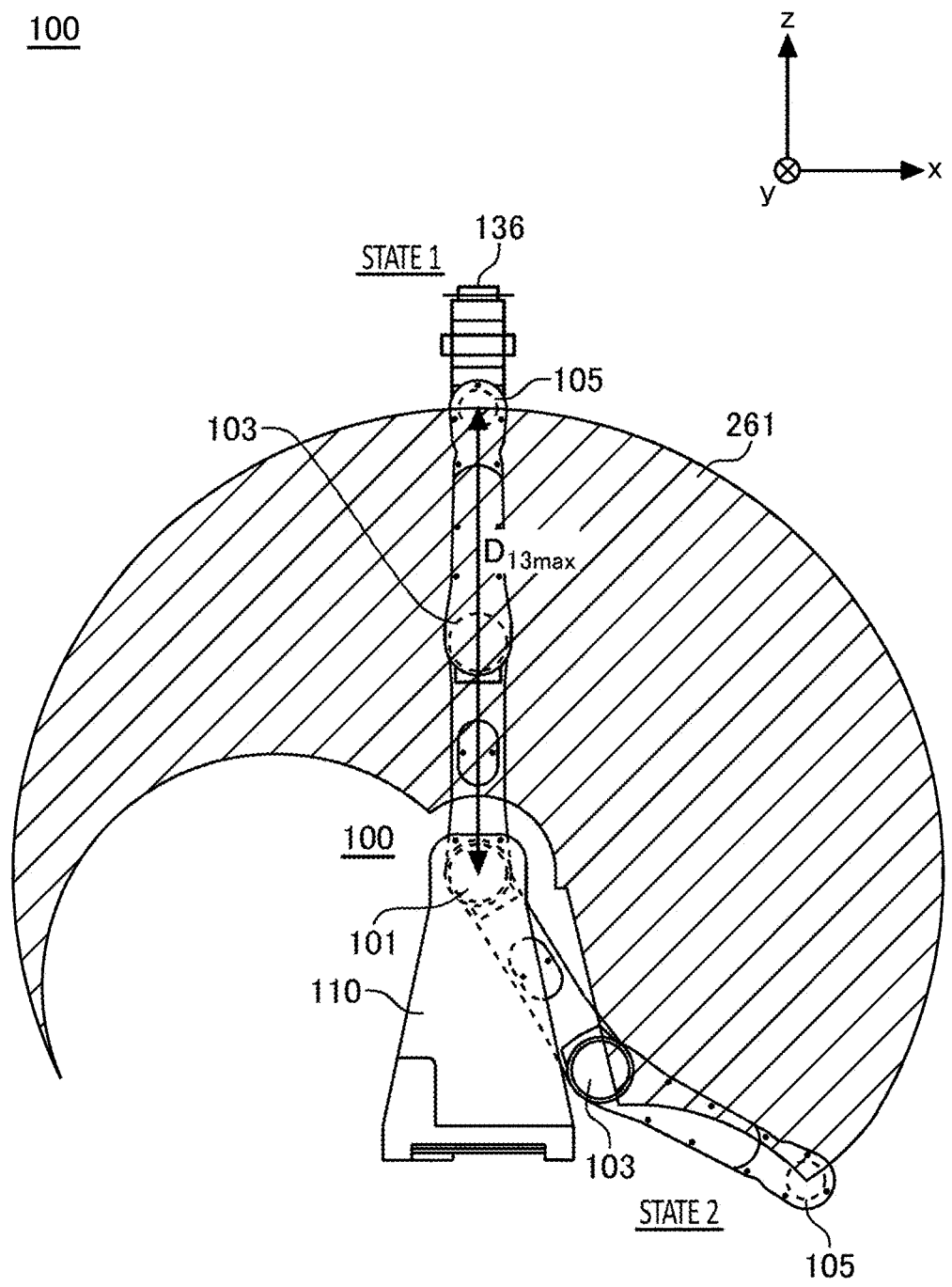
FIG. 18 is an explanatory diagram for explaining an example of an operation range of a third rotation shaft 105.

FIG. 18 is an explanatory diagram for explaining an example of the operation range of the third rotation shaft 105. The robot 100 illustrated in FIG. 18 is the robot 100 when $\theta_{B1}$ is included in the second arm-system angular range.

$D_{13max}$ is a distance between the first rotation shaft 101 and the third rotation shaft 105 in a state where the first movable portion 120 is maximally extended. For example, $D_{13max}$ is defined as a length of the first movable portion 120 in a state where the first movable portion 120 is maximally extended. The length from the proximal end of the first arm 122 to the distal end of the second arm 124 in a state where the first movable portion 120 is maximally extended may be defined as the length of the first movable portion 120 in a state where the first movable portion 120 is maximally extended.

The region 261 is a region where the third rotation shaft 105 can be positioned when $\theta_{B1}$ is included in the second arm-system angular range. The region 261 corresponds to the operation range of the third rotation shaft 105 when $\theta_{B1}$ is included in the second arm-system angular range. Here, a relationship between the third rotation shaft 105 and each of the robot 100 in a state 1 and the robot 100 in a state 2 illustrated in FIG. 18 will be described.

The robot 100 in the state 1 illustrated in FIG. 18 is the robot 100 in a state where the altitude of the third rotation shaft 105 is the highest. The robot 100 in the state 2 illustrated in FIG. 18 is the robot 100 in a state where the altitude of the third rotation shaft 105 is the lowest.

Figure 19:
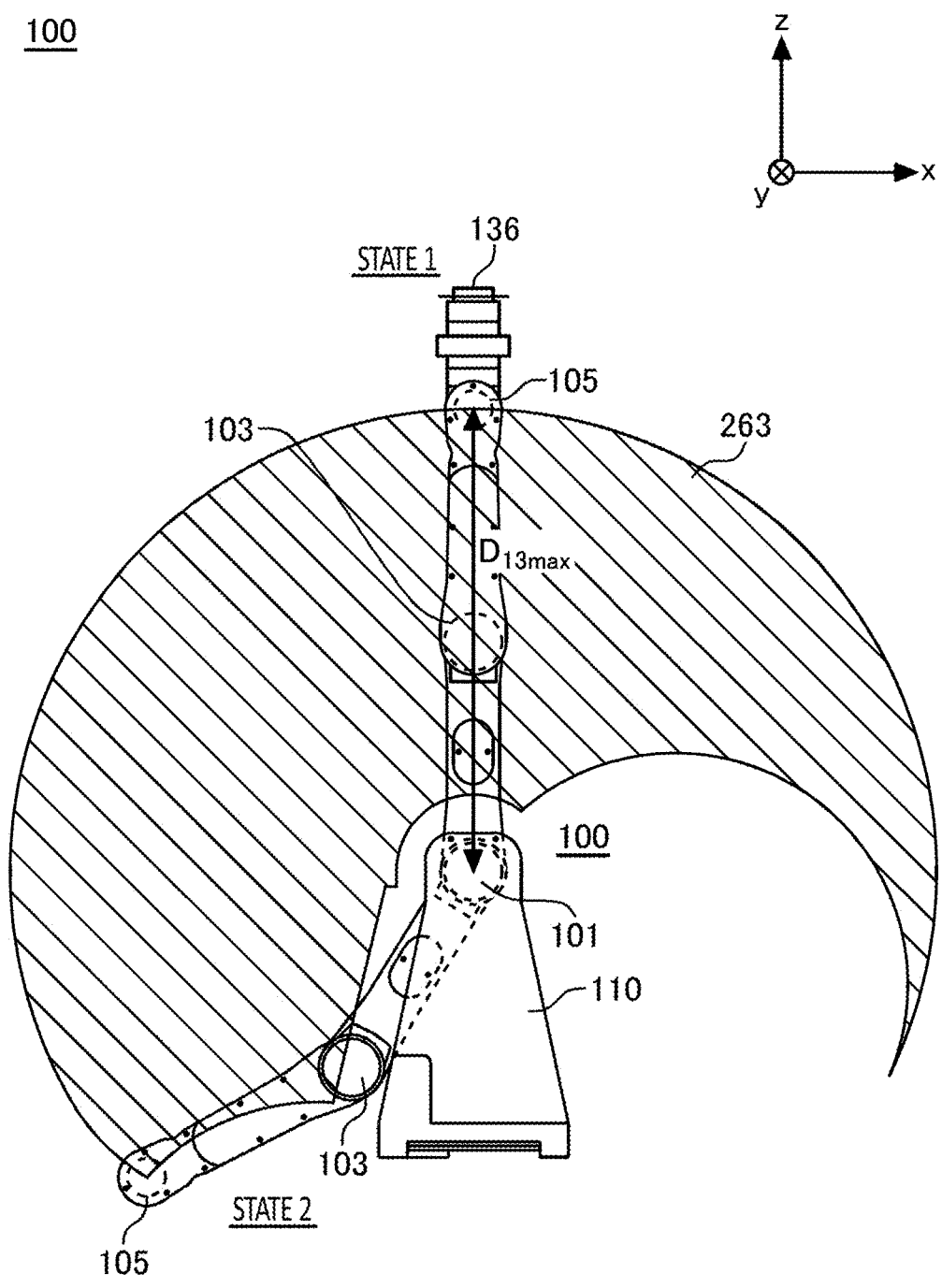
FIG. 19 is an explanatory diagram for explaining another example of the operation range of the third rotation shaft 105.

FIG. 19 is an explanatory diagram for explaining another example of the operation range of the third rotation shaft 105. The robot 100 illustrated in FIG. 19 is the robot 100 when $\theta_{B1}$ is included in the first arm-system angular range. Here, points different from FIG. 18 will be mainly described.

The region 263 is a region where the third rotation shaft 105 can be positioned when $\theta_{B1}$ is included in the first arm-system angular range. The region 263 corresponds to the operation range of the third rotation shaft 105 when $\theta_{B1}$ is included in the first arm-system angular range. Here, a relationship between the third rotation shaft 105 and each of the robot 100 in a state 1 and the robot 100 in a state 2 illustrated in FIG. 19 will be described.

The robot 100 in the state 1 illustrated in FIG. 19 is the robot 100 in a state where the altitude of the third rotation shaft 105 is the highest. The robot 100 in the state 2 illustrated in FIG. 19 is the robot 100 in a state where the altitude of the third rotation shaft 105 is the lowest.

Figure 20:
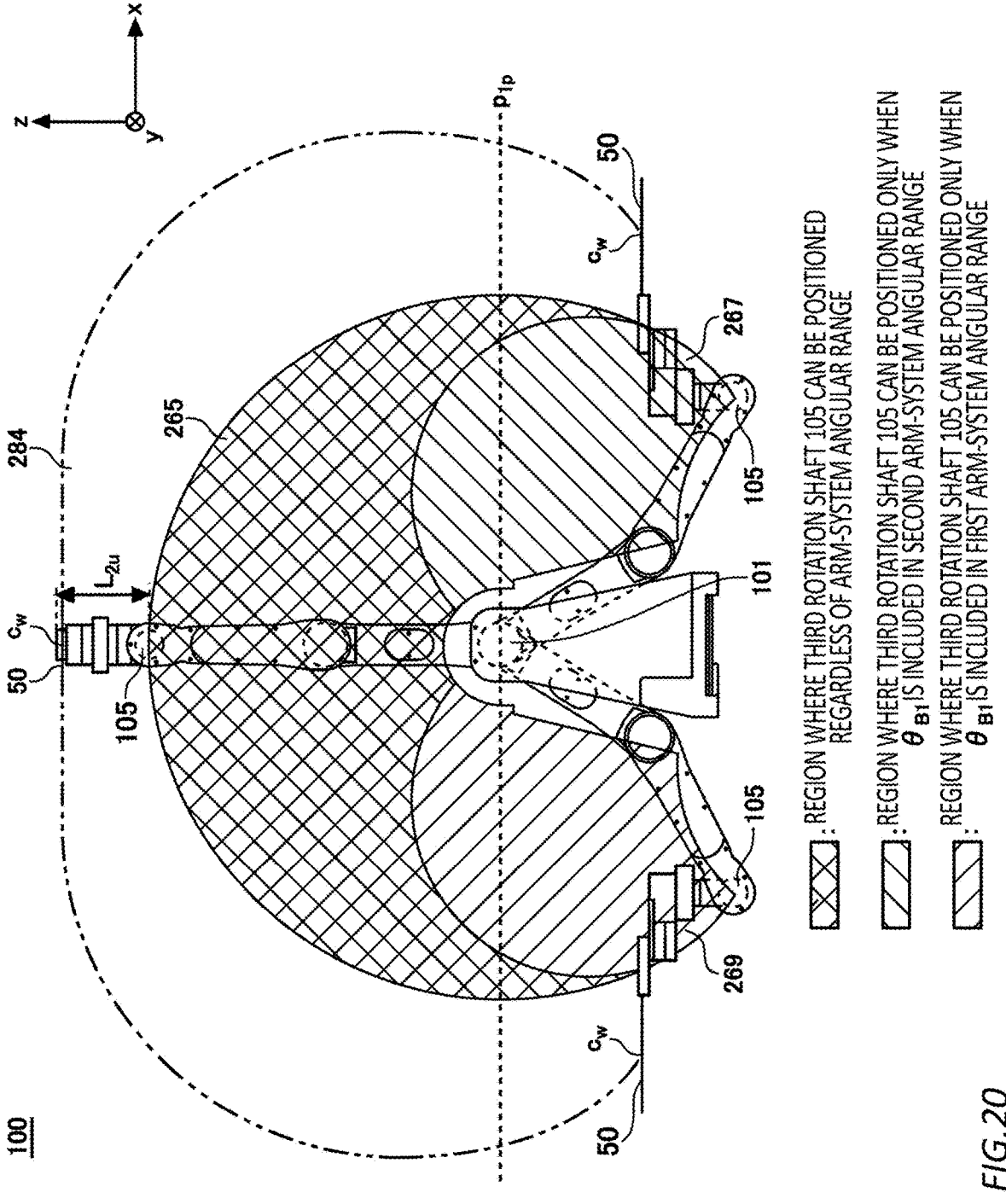
FIG. 20 is an explanatory diagram for explaining an example of a maximum operation range of the third rotation shaft 105 and an example of a maximum accessible region of the hand 136.

FIG. 20 is an explanatory diagram for explaining an example of a maximum operation range of the third rotation shaft 105 and an example of a maximum accessible region of the hand 136. First, an example of the maximum operation range of the third rotation shaft 105 will be described. Here, an example of the maximum operation range of the third rotation shaft 105 illustrated in FIG. 20 will be described with reference to the operation range of the third rotation shaft 105 illustrated in FIG. 18 and the operation range of the third rotation shaft 105 illustrated in FIG. 19.

The region 265 is a region where the third rotation shaft 105 can be positioned regardless of the arm-system angular range. The region 267 is a region where the third rotation shaft 105 can be positioned only when $\theta_{B1}$ is included in the second arm-system angular range. The region 269 is a region where the third rotation shaft 105 can be positioned only when $\theta_{B1}$ is included in the first arm-system angular range. The maximum operation range of the third rotation shaft 105 corresponds to a region that is a sum of the region 265, the region 267, and the region 269.

A region that is the sum of the region 265 and the region 267 is the region 261. In addition, a region that is the sum of the region 265 and the region 269 is the region 263.

Next, an example of the maximum accessible region of the hand 136 will be described. Here, the maximum accessible region of the hand 136 is considered the maximum region accessible by the hand 136. Note that being accessible by the hand 136 is considered being accessible by $c_w$ of the wafer 50 held by the hand 136.

Being accessible by the hand 136 includes, for example, being accessible by the hand 136 without any interference between components of the robot 100. Being accessible by the hand 136 includes, for example, being accessible by the hand 136 without any interference between the robot 100 and the housing 200.

The maximum accessible region of the hand 136 is determined based on, for example, the position where the robot 100 is arranged in the housing 200. The maximum accessible region of the hand 136 is determined based on, for example, the width of the operation region 250.

The maximum accessible region of the hand 136 is determined based on, for example, the posture of the robot 100. The maximum accessible region of the hand 136 is determined based on the posture of the robot 100, for example, in a state where the first movable portion 120 is maximally extended. The maximum accessible region of the hand 136 is determined based on the posture of the robot 100, for example, in a state where the second movable portion 130 is maximally extended. The maximum accessible region of the hand 136 is determined based on the posture of the robot 100, for example, in a state where the first movable portion 120 and the second movable portion 130 are maximally extended.

The maximum accessible region of the hand 136 is determined based on, for example, the length of the first movable portion in a state where the first movable portion 120 is maximally extended.

The maximum accessible region of the hand 136 is determined further based on, for example, the movable range of the second movable portion 130 when the third rotation shaft 105 is rotated in a state where the first movable portion 120 is maximally extended. The maximum accessible region of the hand 136 is determined further based on, for example, the movable range of the second movable portion 130 when the third rotation shaft 105 is rotated in a state where the first movable portion 120 is maximally bent.

The movable range of the second movable portion 130 is determined based on, for example, the movable range of the second base 132. The movable range of the second movable portion 130 is determined based on, for example, the movable range of the third arm 134. The movable range of the second movable portion 130 is determined based on, for example, the movable range of the hand 136.

The movable range of the second movable portion 130 is, for example, the movable range of the second movable portion 130 when the third arm 134 and the hand 136 are cooperatively operated. The movable range of the second movable portion 130 is, for example, the movable range of the second movable portion 130 when the second base 132, the third arm 134, and the hand 136 are cooperatively operated.

The maximum accessible region of the hand 136 is determined further based on, for example, the movable range of the third arm 134 and the hand 136 when the fourth rotation shaft 107 is rotated in a state where the first movable portion 120 is maximally extended. The maximum accessible region of the hand 136 is determined further based on, for example, the movable range of the third arm 134 and the hand 136 when the fourth rotation shaft 107 is rotated in a state where the first movable portion 120 is maximally bent.

The movable range of the third arm 134 and the hand 136 is determined based on, for example, the movable range of the third arm 134. The movable ranges of the third arm 134 and the hand 136 are determined based on, for example, the movable range of the hand 136. The movable range of the third arm 134 and the hand 136 is, for example, the movable range of the third arm 134 and the hand 136 when the third arm 134 and the hand 136 are cooperatively operated.

The maximum accessible region of the hand 136 is determined further based on, for example, the movable range of the hand 136 when the fifth rotation shaft 109 is rotated in a state where the first movable portion 120 is maximally extended. The maximum accessible region of the hand 136 is determined further based on, for example, the movable range of the hand 136 when the fifth rotation shaft 109 is rotated in a state where the first movable portion 120 is maximally bent.

The maximum accessible region of the hand 136 is determined based on, for example, the length of the second movable portion 130 in a state where the second movable portion 130 is maximally extended. The maximum accessible region of the hand 136 is determined based on, for example, a length from the fourth rotation shaft 107 to the distal end of the hand 136 when the second movable portion 130 is maximally extended in a state where the third arm 134 and the hand 136 are parallel to the horizontal plane.

The maximum accessible region of the hand 136 is determined further based on, for example, the altitude of the first rotation shaft 101. The maximum accessible region of the hand 136 includes, for example, an upper accessible region of the hand 136 in a state where the altitude of the third rotation shaft 105 is higher than the altitude of the first rotation shaft 101, and a lower accessible region of the hand 136 in a state where the altitude of the third rotation shaft 105 is lower than the altitude of the first rotation shaft 101. In an example illustrated in FIG. 20, the upper accessible region of the hand 136 is the accessible region of the hand 136 in a state where the altitude of the third rotation shaft 105 is higher than the altitude of a plane pip parallel to the first rotation shaft 101 and including the first rotation shaft 101, and the lower accessible region of the hand 136 is the accessible region of the hand 136 in a state where the altitude of the third rotation shaft 105 is lower than the altitude of $p_{1P}$. In addition, in an example illustrated in FIG. 20, Pip is the xy plane.

The maximum accessible region of the hand 136 is determined further based on, for example, a length $L_{2u}$ from the third rotation shaft 105 to the upper end of the second movable portion 130 in a state where a vector parallel to |23 is perpendicular to the arrangement surface of the first base 110 and parallel to the fourth rotation shaft 107. Within the upper accessible region of the hand 136, $L_{2u}$ contributes to expansion of the access region of the hand 136. On the other hand, within the lower accessible region of the hand 136, $L_{2u}$ does not contribute to expansion of the access region of the hand 136.

The maximum accessible region of the hand 136 is determined further based on, for example, the angular range of $\theta_{B1}$. The maximum accessible region of the hand 136 includes, for example, a first accessible region of the hand

136 when $\theta_{B1}$ is included in the first arm-system angular range, and a second accessible region of the hand 136 when $\theta_{B1}$ is included in the second arm-system angular range.

The maximum accessible region of the hand 136 is determined further based on, for example, the maximum operation range of the third rotation shaft 105. The maximum accessible region of the hand 136 includes, for example, a region within the maximum operation range of the third rotation shaft 105 and a region 284 outside the maximum operation range of the third rotation shaft 105. FIG. 20 illustrates an example in which the accessible outer boundary of $c_w$ of the wafer 50 is expressed by a two-dot chain line indicating the outer boundary of the region 284.

The access target may be positioned in the maximum accessible region of the hand 136. For example, one or more openings of the front wall 210 of the housing 200 are positioned within the maximum accessible region of the hand 136. For example, one or more openings of the back wall 230 of the housing 200 are positioned within the maximum accessible region of the hand 136. The PA 300 also may be positioned on the side wall side of the housing 200 and positioned in the maximum accessible region of the hand 136.

According to the system 10 in an embodiment illustrated in FIG. 20, the accessible region of the hand 136 can be used to the maximum to arrange the access target. Accordingly, the system 10 in an embodiment illustrated in FIG. 20 can increase the number of access targets that can be arranged in the housing 200, and as a result, it is possible to achieve a system with a high degree of freedom in housing design.

Figure 21:
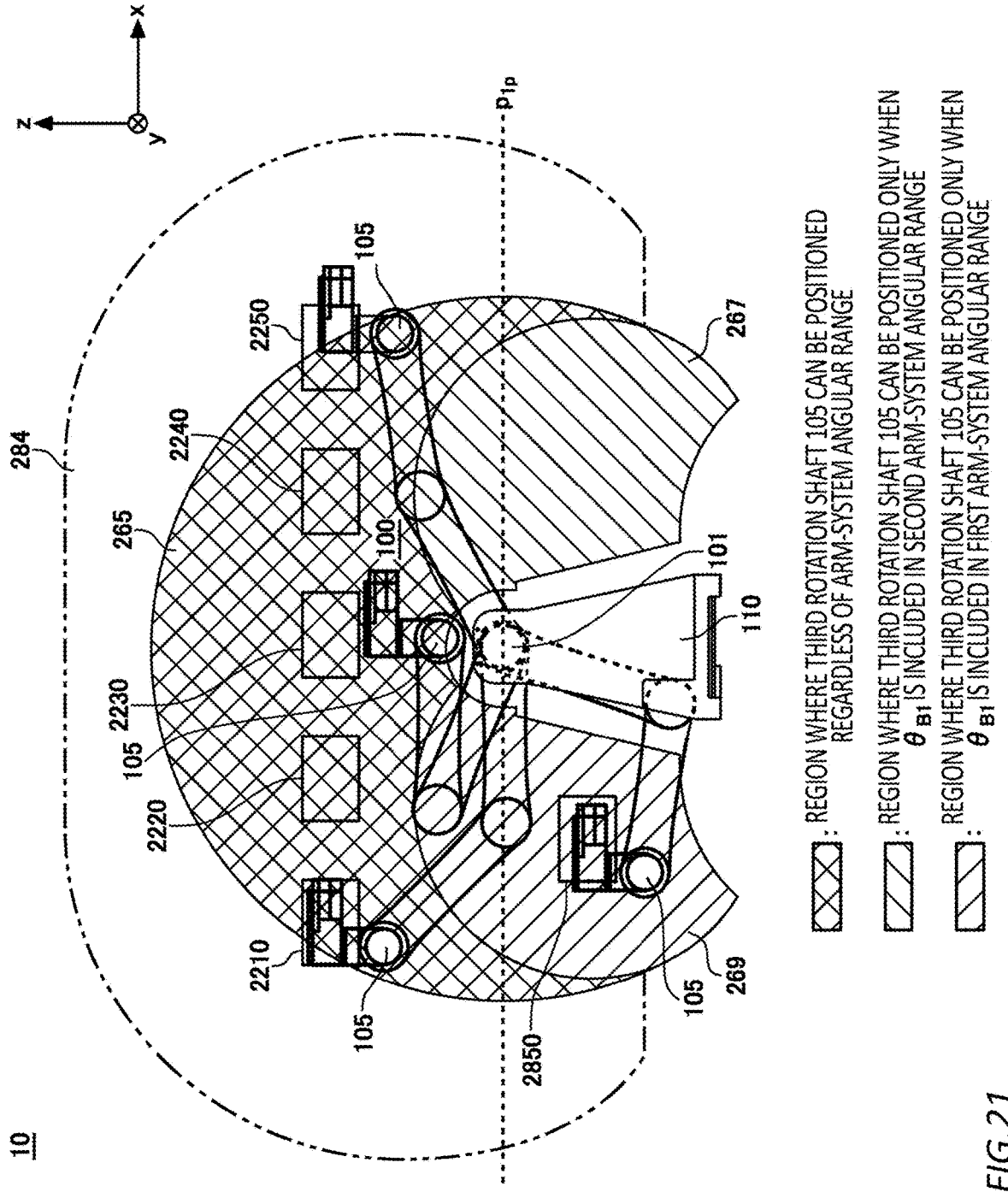
FIG. 21 is an explanatory diagram for explaining an example of a relationship between the maximum accessible region of the hand 136 and an access target.

FIG. 21 is an explanatory diagram for explaining an example of a relationship between the maximum accessible region of the hand 136 and the opening of the housing 200. FIG. 21 illustrates an example of the robot 100 in a case where $\theta_{12}$ is included in the first elbow-system angular range.

A plurality of openings of the housing 200 are positioned, for example, at positions that are accessible by the hand 136 without any interference between components of the robot 100. The plurality of openings of the housing 200 are positioned, for example, at positions that are accessible by the hand 136 without any interference between the first movable portion 120 and the third arm 134. The plurality of openings of the housing 200 are positioned, for example, at positions that the hand 136 can access without any interference between the second arm 124 and the third arm 134. The plurality of openings of the housing 200 are positioned, for example, at positions that the hand 136 can access without any interference between the first movable portion 120 and the hand 136. The plurality of openings of the housing 200 are positioned, for example, at positions that the hand 136 can access without any interference between the second arm 124 and the hand 136.

The plurality of openings of the housing 200 are positioned, for example, at positions that are accessible by the hand 136 without any interference between the robot 100 and the housing 200, for example. The plurality of openings of the housing 200 are positioned, for example, at positions that are accessible by the hand 136 without any interference between the robot 100 and the front wall 210. The plurality of openings of the housing 200 are positioned, for example, at positions that are accessible by the hand 136 without any interference between the robot 100 and the back wall 230. The plurality of openings of the housing 200 are positioned, for example, at positions that are accessible by the hand 136 without any interference between the robot 100 and the first side wall 270. The plurality of openings of the housing 200 are positioned, for example, at positions that are accessible by the hand 136 without any interference between the robot 100 and the second side wall 290.

At least one opening of the plurality of openings of the housing 200 is positioned, for example, in a region within the maximum operation range of the third rotation shaft 105. At least one opening of the plurality of openings of the housing 200 is positioned, for example, in the region 265. At least one opening of the plurality of openings of the housing 200 is positioned, for example, in the region 267. At least one opening of the plurality of openings of the housing 200 is positioned, for example, in the region 269. In an example illustrated in FIG. 21, three openings of the opening 2220, the opening 2230, and the opening 2240 of the front wall 210 are positioned in the region 265. Note that the opening being positioned in the region includes not only that the entire opening is positioned in the region but also that a part of the opening is positioned in the region.

At least one opening of the plurality of openings of the housing 200 is positioned, for example, in the region 284 outside the maximum operation range of the third rotation shaft 105. At least one opening of the plurality of openings of the housing 200 is positioned, for example, within the trajectory of the third arm 134 and the hand 136 when the first movable portion 120 is rotated in a state where the first movable portion 120 is maximally extended, and the third arm 134 and the hand 136 are parallel to the horizontal plane. In an example illustrated in FIG. 21, two openings of the opening 2210 and the opening 2250 of the front wall 210 are positioned in the region 284.

According to the system 10 in an embodiment illustrated in FIG. 21, the housing 200 has an opening positioned within the region 284. Accordingly, the access target can be arranged by maximally using a length from the third rotation shaft 105 to the upper end of the second movable portion 130, so that the number of access targets that can be arranged in the housing 200 can be further increased, and as a result, it is possible to achieve a system with a higher degree of freedom in housing design.

One opening of the plurality of openings of the front wall 210 is positioned, for example, at a position that allows the hand 136 to access the lowermost wafer storage portion of the cassette 220 arranged at the position corresponding to the one opening in a state where the first movable portion 120 is maximally bent. Accordingly, if the opening is positioned to allow the lowermost wafer storage portion of the cassette 220 to be accessed, a space in the vicinity of the boundary of the maximum accessible region can also be used, so that the number of access targets that can be arranged in the housing 200 can be further increased, and as a result, it is possible to achieve a system with a higher degree of freedom in housing design. Note that, in an example illustrated in FIG. 21, the opening portion 2230 of the front wall 210 is positioned at a position that allows the hand 136 to access the lowermost wafer storage portion of the cassette 223 corresponding to the opening portion 2230 in a state where the first movable portion 120 is maximally bent.

The plurality of openings of the housing 200 are positioned, for example, at positions higher than the first rotation shaft 101. The plurality of openings of the housing 200 are positioned, for example, in the upper accessible region. In an example illustrated in FIG. 21, five openings of the opening 2210, the opening 2220, the opening 2230, the opening 2240, and the opening 2250 of the front wall 210 are positioned in the upper accessible region.

For example, the housing 200 further includes an opening 2850 in the maximum accessible region of the hand 136 and at a position lower than the first rotation shaft 101. The housing 200 further has the opening 2850, for example, in the lower accessible region. Accordingly, the number of access targets that can be arranged in the housing 200 can be further increased, and as a result, it is possible to achieve a system with a higher degree of freedom in housing design.

The housing 200 has the opening 2850, for example, in the front wall 210. The housing 200 may have the opening 2850 in the back wall 230. FIG. 21 illustrates an example of the housing 200 in which the front wall 210 has the opening 2850.

The opening 2850 is positioned, for example, at a position that is accessible by the hand 136 without any interference between the third arm 134 and the first base 110. The opening 2850 is positioned, for example, at a position that is accessible by the hand 136 without any interference between the hand 136 and the first base 110. Accordingly, if the opening is positioned to prevent the interference between the third arm 134 and the first base 110, a space in the vicinity of the first base 110 can also be used, so that the number of access targets that can be arranged in the housing 200 can be further increased, and as a result, it is possible to achieve a system with a higher degree of freedom in housing design.

At least one opening of the plurality of openings of the housing 200 is positioned, for example, in the first accessible region of the hand 136. The at least one opening is positioned in, for example, the second accessible region of the hand 136.

At least one opening of the plurality of openings of the housing 200 is positioned in the first accessible region of the hand 136 and positioned in the second accessible region of the hand 136, for example. In the at least one opening, the hand 136 can access the at least one opening regardless of the arm-system angular range.

According to the system 10 in an embodiment illustrated in FIG. 21, the opening of the housing 200 is arranged at a position that is accessible by the hand 136 regardless of the arm-system angular range of the robot 100, so that the robot 100 can access the opening without changing the arm system. Accordingly, a system with a high throughput can be achieved as a whole. In particular, an access target with a high frequency of access by the hand 136, such as a most frequent opening, which is an opening with the highest frequency of access by the hand 136, among the openings of the housing 200, is arranged at a position that is accessible by the hand 136 regardless of the arm-system angular range so that it is possible to a system with a higher throughput.

Figure 22:
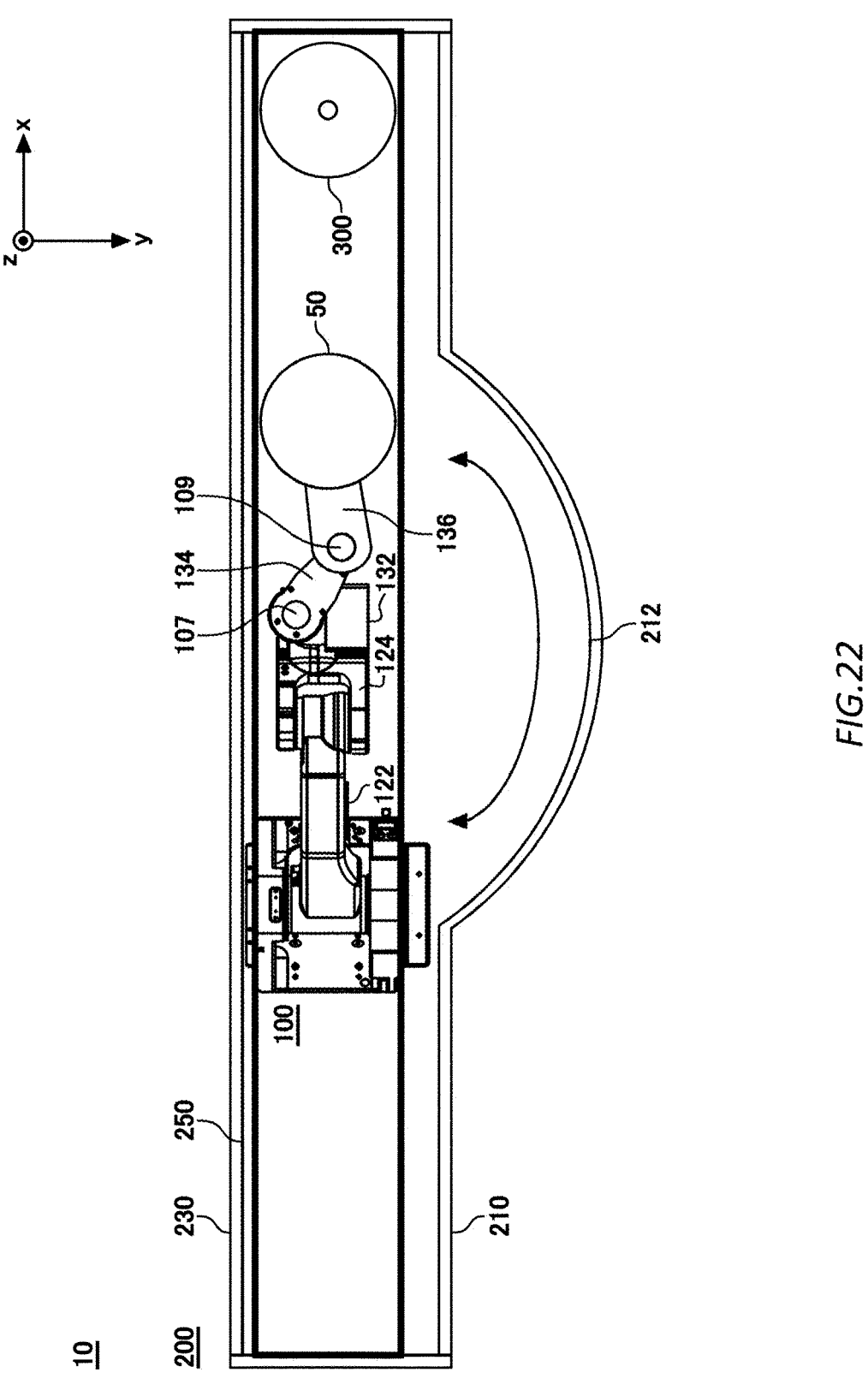
FIG. 22 is an explanatory diagram for explaining an example of an operation of the robot 100 arranged in a housing 200.

FIG. 22 is an explanatory diagram for explaining an example of the operation of the robot 100 arranged in the housing 200. Here, an example of the operation of changing the finger system of the robot 100 will be mainly described.

The housing 200 has, for example, a portion for changing $\theta_{Hd}$. The portion is, for example, a hole. The hole forms, for example, a recess in the wall of the housing 200 without penetrating the wall of the housing 200. In this case, the hole is a blind hole. The hole may penetrate the wall of the housing 200. In this case, the hole is a through hole. The portion may be an example of the access target.

The portion is positioned, for example, on the front wall 210 side. The portion is positioned, for example, above the cassette 220. The portion is positioned, for example, below the cassette 220. The portion is positioned, for example, on the left side of the cassette 221. The portion may be positioned on the right side of the cassette 225. The portion may be positioned on the back wall 230 side. The portion is positioned, for example, above the load lock chamber 240 or the cassette 220. The portion is positioned, for example, below the load lock chamber 240 or the cassette 220. The portion is positioned, for example, on the left side of the load lock chamber 241 or the cassette 220 at the left end. The portion may be positioned on the right side of the load lock chamber 243 or the cassette 220 at the right end. FIG. 22 illustrates an example of the housing 200 having a portion 212 for changing $\theta_{Hd}$ on the front wall 210 side.

For example, the robot 100 changes $\theta_{Hd}$ in the portion 212. For example, the robot 100 changes the angular range of $\theta_{Hd}$ in the portion 212 between the first finger-system angular range and the second finger-system angular range. The robot 100 changes the angular range of $\theta_{Hd}$ in the portion 212, for example, from the first finger-system angular range to the second finger-system angular range. The robot 100 changes the angular range of $\theta_{Hd}$ in the portion 212 from the first finger-system angular range to the second finger-system angular range by, for example, changing $\theta_{Hd}$ from 0° to −180°. The robot 100 changes the angular range of $\theta_{Hd}$ in the portion 212, for example, from the second finger-system angular range to the first finger-system angular range. The robot 100 changes the angular range of $\theta_{Hd}$ in the portion 212 from the second finger-system angular range to the first finger-system angular range by, for example, changing $\theta_{Hd}$ from −180° to 0°.

The portion 212 has, for example, a space in which the robot 100 can change the finger system by rotating only the hand 136. The robot 100 changes the finger system by rotating only the hand 136 in the portion 212. Accordingly, the robot 100 can change the finger system in a short time, so that it is possible to achieve a system having a high throughput as a whole.

Figure 23:
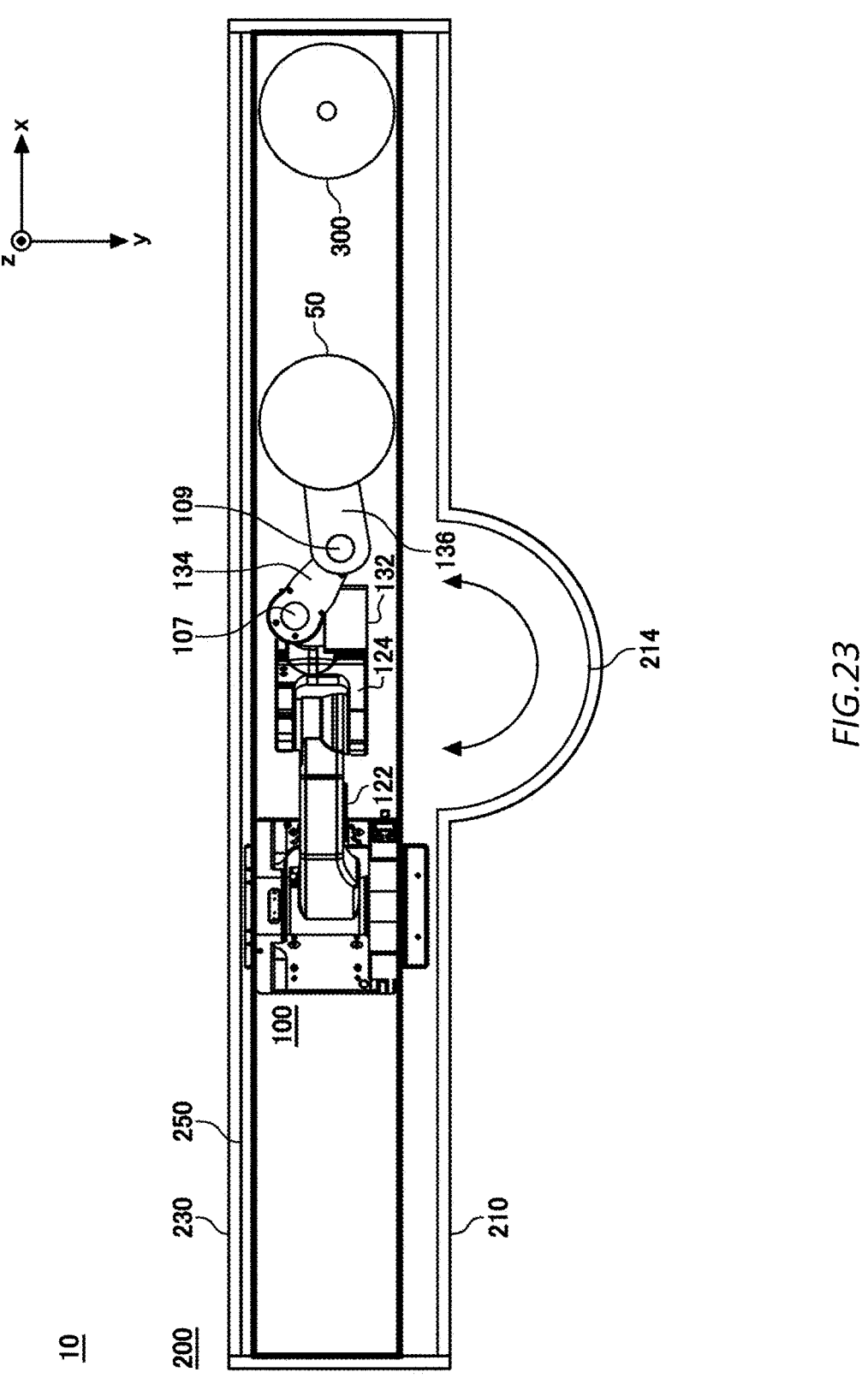
FIG. 23 is an explanatory diagram for explaining another example of the operation of the robot 100 arranged in the housing 200.

FIG. 23 is an explanatory diagram for explaining another example of the operation of the robot 100 arranged in the housing 200. Here, points different from FIG. 22 will be mainly described.

The front wall 210 of the housing 200 has, for example, a portion 214 for changing $\theta_{Hd}$. For example, the robot 100 changes the angular range of $\theta_{Hd}$ in the portion 214 between the first finger-system angular range and the second finger-system angular range.

The portion 214 has, for example, a space in which the robot 100 can change the finger system by causing the hand 136 and the first movable portion 120 to perform a cooperative operation. The cooperative operation of the hand 136 and the first movable portion 120 includes, for example, the cooperative operation of the hand 136 and the first arm 122. The cooperative operation of the hand 136 and the first movable portion 120 includes, for example, the cooperative operation of the hand 136 and the second arm 124. The cooperative operation of the hand 136 and the first movable portion 120 may include the cooperative operation of the hand 136, the first arm 122, and the second arm 124.

The space required for changing the finger system of the robot 100 by the cooperative operation of the hand 136 and the first movable portion 120 is narrower than the space required for changing the finger system of the robot 100 by the rotation of only the hand 136. Therefore, the space of the housing 200 required for changing the finger system of the robot 100 can be saved, and the access target can be arranged in the space. As a result, it is possible to achieve a system with a high degree of freedom in housing design.

Figure 24:
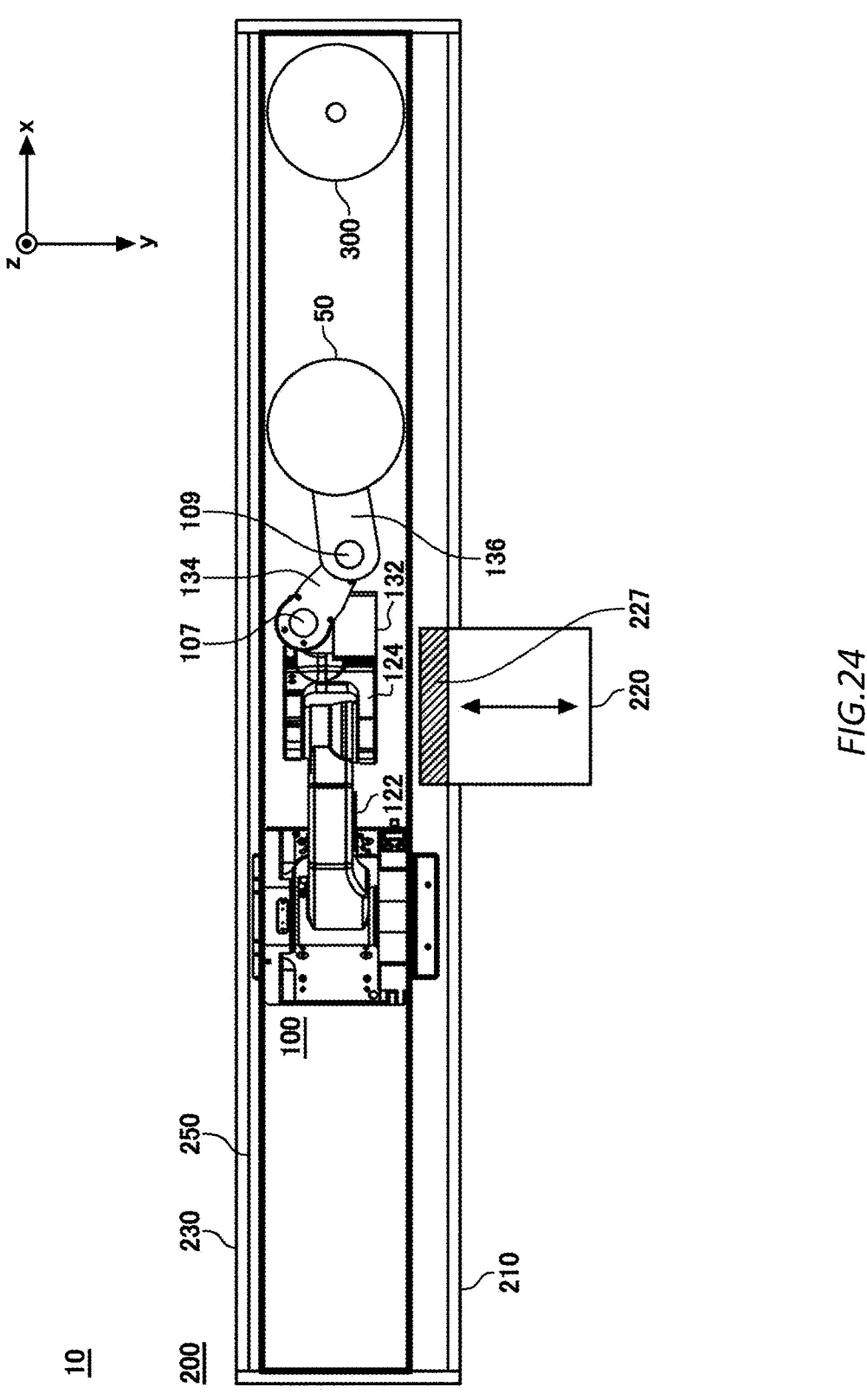
FIG. 24 is an explanatory diagram for explaining still another example of the operation of the robot 100 arranged in the housing 200.

FIG. 24 is an explanatory diagram for explaining another example of the operation of the robot 100 arranged in the housing 200. Here, differences from FIGS. 22 and 23 will be mainly described.

The robot 100 changes the finger system, for example, in the opening of the front wall 210 for access to the cassette 220. The opening for access to the cassette 220 may be an example of a portion for changing $\theta_{Hd}$.

When the robot 100 changes the finger system in the opening for access to the cassette 220, the robot 100 can change the finger system even in the housing 200 not having the portion 212 or the portion 214. Accordingly, the space of the housing 200 can be further saved, and as a result, it is possible to achieve a system with a higher degree of freedom in housing design.

Figure 25:
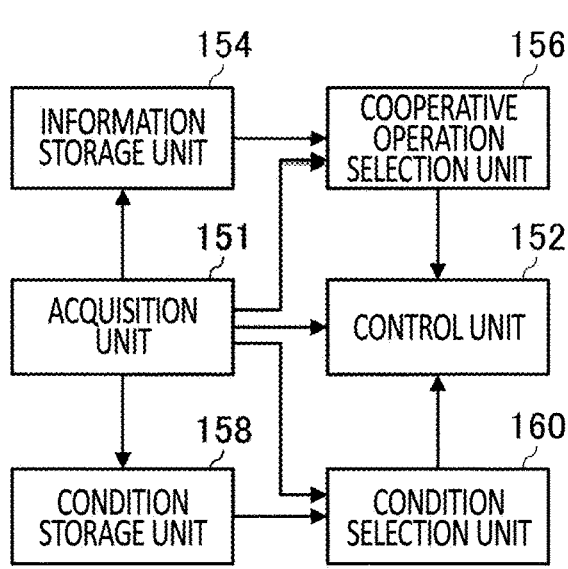
FIG. 25 schematically illustrates an example of a functional configuration of the robot 100.

FIG. 25 schematically illustrates an example of a functional configuration of the robot 100. The robot 100 includes an acquisition unit 151, a control unit 152, an information storage unit 154, a cooperative operation selection unit 156, a condition storage unit 158, and a condition selection unit 160. Note that it is not essential to include all these configurations of the robot 100.

The acquisition unit 151 acquires various types of information. The acquisition unit 151 acquires various types of information by, for example, receiving various types of information from an external device. The acquisition unit 151 may acquire various types of information by receiving an input from a user of the robot 100 via an input unit included in the robot 100. The user of the robot 100 is, for example, an administrator of the system 10.

The acquisition unit 151 acquires, for example, access processing information indicating access processing for causing the hand 136 to access an access target. The access processing information includes, for example, access target information indicating an access target. The access processing information includes, for example, access target position information indicating a position of an access target.

The control unit 152 controls a control target. The control unit 152 controls, for example, the robot 100.

The control unit 152 controls the control target by, for example, transmitting a control signal to the control target. The control unit 152 transmits the control signal to the control target via, for example, a network. The control unit 152 transmits the control signal to the control target via, for example, a wired network. For example, when the control target of the control unit 152 is the robot 100, the control unit 152 transmits the control signal to the robot 100 via the cable and the connector portion 1148. The control unit 152 transmits the control signal to the control target via, for example, a wireless network. The control unit 152 transmits the control signal to the control target via, for example, a wireless network conforming to a short-range wireless communication system such as Wi-Fi (registered trademark), Bluetooth (registered trademark), or Zigbee (registered trademark). The control unit 152 may transmit the control signal to the control target via the Internet.

The control unit 152 is externally attached to the robot 100, for example. The control unit 152 may be incorporated in the robot 100. The control unit 152 is incorporated in the first side surface portion 112, for example. The control unit 152 is incorporated in the second side surface portion 114. The control unit 152 may be incorporated in any other portion of the robot 100.

The control unit 152 controls, for example, a robot arm. The control unit 152 controls the robot arm, for example, to extend the robot arm. The control unit 152 may control the robot arm to bend the robot arm.

The control unit 152 controls, for example, the first movable portion 120. The control unit 152 controls, for example, the second movable portion 130. The control unit 152 controls, for example, the first movable portion 120 and the second movable portion 130.

The control unit 152 controls the first movable portion 120 by, for example, controlling a motor that rotates the first rotation shaft 101. The control unit 152 controls the motor that rotates the first rotation shaft 101, for example, so as to drive the motor that rotates the first rotation shaft 101. For example, when the motor that rotates the first rotation shaft 101 is a servomotor, the control unit 152 further controls the deceleration mechanism in addition to the servomotor. The control unit 152 controls the first movable portion 120 by, for example, controlling a motor that rotates the second rotation shaft 103. The control unit 152 controls the motor that rotates the second rotation shaft 103, for example, so as to drive the motor that rotates the second rotation shaft 103. For example, when the motor that rotates the second rotation shaft 103 is a servomotor, the control unit 152 further controls the deceleration mechanism in addition to the servomotor.

The control unit 152 controls the second movable portion 130 by, for example, controlling a motor that rotates the third rotation shaft 105. The control unit 152 controls the motor that rotates the third rotation shaft 105, for example, so as to drive the motor that rotates the third rotation shaft 105. For example, when the motor that rotates the third rotation shaft 105 is a servomotor, the control unit 152 further controls the deceleration mechanism in addition to the servomotor. The control unit 152 controls the second movable portion 130 by, for example, controlling a motor that rotates the fourth rotation shaft 107. The control unit 152 controls the motor that rotates the fourth rotation shaft 107, for example, so as to drive the motor that rotates the fourth rotation shaft 107. The control unit 152 controls the second movable portion 130 by, for example, controlling a motor that rotates the fifth rotation shaft 109. The control unit 152 controls the motor that rotates the fifth rotation shaft 109, for example, so as to drive the motor that rotates the fifth rotation shaft 109.

The control unit 152 controls, for example, the posture of the robot 100. The control unit 152 controls, for example, the operation of the robot 100.

For example, the control unit 152 controls the robot 100 to access an access target. The control unit 152 controls the robot 100 to access the access target based on, for example, the access processing information acquired by the acquisition unit 151.

For example, the control unit 152 controls the first movable portion 120 and the second movable portion 130 so as to access each of one or more openings of the housing 200. The control unit 152 controls the first movable portion 120 and the second movable portion 130, for example, so as to cause the hand 136 to access each of one or more openings of the housing 200 in a state where the hand 136 is parallel to the horizontal plane.

The control unit 152 controls the first movable portion 120 and the second movable portion 130, for example, so as to cause the hand 136 to access the access target while maintaining a state where $\theta_{B1}$ satisfies a predetermined angle condition. The control unit 152 controls the first movable portion 120 and the second movable portion 130, for example, so as to cause the hand 136 to access the access target while maintaining a state where $\theta_{12}$ satisfies a predetermined angle condition. The control unit 152 controls the first movable portion 120 and the second movable portion 130, for example, so as to cause the hand 136 to access the access target while maintaining a state where $\theta_{2B}$ satisfies a predetermined angle condition. The control unit 152 controls the first movable portion 120 and the second movable portion 130, for example, so as to cause the hand 136 to access the access target while maintaining a state where $\theta_{3H}$ satisfies a predetermined angle condition. The control unit 152 controls the first movable portion 120 and the second movable portion 130, for example, so as to cause the hand 136 to access the access target while maintaining a state where $\theta_{3d}$ satisfies a predetermined angle condition. The control unit 152 controls the first movable portion 120 and the second movable portion 130, for example, so as to cause the hand 136 to access the access target while maintaining a state where $\theta_{Hd}$ satisfies a predetermined angle condition. The control unit 152 controls the first movable portion 120 and the second movable portion 130, for example, so as to cause the hand 136 to access the access target while maintaining a state where two or more angles of $\theta_{B1}$, $\theta_{12}$, $\theta_{2B}$, $\theta_{3H}$, $\theta_{3d}$, or $\theta_{Hd}$ satisfy the angle condition. Note that the angle condition of $\theta_{B1}$ may be referred to as an arm-system angle condition, the angle condition of $\theta_{12}$ may be referred to as an elbow-system angle condition, the angle condition of $\theta_{2B}$ may be referred to as a wrist-system angle condition, the angle condition of $\theta_{3H}$ may be referred to as a hand-system angle condition, the angle condition of $\theta_{3d}$ may be referred to as a forearm-system angle condition, and the angle condition of $\theta_{Hd}$ may be referred to as a finger-system angle condition.

The control unit 152 controls the robot 100, for example, so as to unload the wafer 50, which is an example of the movement target, from the access target. For example, the control unit 152 controls the first movable portion 120 and the second movable portion 130 so as to unload the wafer 50 from the access target in a state where the hand 136 is parallel to the horizontal plane.

The control unit 152 controls the robot 100, for example, so as to hold the wafer 50. For example, the control unit 152 controls the first movable portion 120 and the second movable portion 130 such that the hand 136 holds the wafer 50 in the state of being parallel to the horizontal plane.

The control unit 152 controls the robot 100, for example, so as to convey the wafer 50 held by the hand 136. For example, the control unit 152 controls the first movable portion 120 and the second movable portion 130 so as to convey the wafer 50 in a state where the wafer 50 held by the hand 136 is located inside the operation region 250. For example, the control unit 152 controls the first movable portion 120 and the second movable portion 130 so as to convey the wafer 50 in a state where the wafer 50 held by the hand 136 is located inside the operation region 250 and to cause the hand 136 to access the opening of the housing 200 in a state where the hand 136 is parallel to the horizontal plane.

For example, the control unit 152 controls the second movable portion such that the width, in the direction perpendicular to the vertical plane, of the trajectory of the second movable portion 130 when the wafer 50 is conveyed falls within the width, in the direction perpendicular to the vertical plane, of the trajectory of the wafer 50 being conveyed. The control unit 152 controls the second movable portion, for example, such that the width, in the direction perpendicular to the vertical plane, of the trajectory of the third arm 134 and the hand 136 when the wafer 50 is conveyed falls within the width, in the direction perpendicular to the vertical plane, of the trajectory of the wafer 50 being conveyed. Accordingly, it is possible to achieve a robot capable of conveying the wafer 50 in a space where the width of the operation region 250 is narrower. As a result, it is possible to achieve a robot that can contribute to reduction in the thickness of the housing.

For example, the control unit 152 controls the first movable portion 120 and the second movable portion 130 so as to convey the wafer 50 while maintaining a state where the wafer 50 held by the hand 136 is located inside the operation region 250, and $c_w$ of the wafer 50 is positioned on $I_{mc}$. For example, the control unit 152 controls the first movable portion 120 and the second movable portion 130 so as to translate the wafer 50 while maintaining a state where the wafer 50 held by the hand 136 is located inside the operation region 250, and $c_w$ of the wafer 50 is positioned on $I_{mc}$.

The control unit 152 controls the first movable portion 120 and the second movable portion 130 so as to convey the wafer 50 while maintaining, for example, a state where the wafer 50 held by the hand 136 is located inside the operation region 250, and $\theta_{3d}$ is the offset angle. The control unit 152 controls the first movable portion 120 and the second movable portion 130 so as to convey the wafer 50 while maintaining, for example, a state where the wafer 50 held by the hand 136 is located inside the operation region 250, and $\theta_{Hd}$ is the predetermined angle. The control unit 152 controls the first movable portion 120 and the second movable portion 130 so as to convey the wafer 50 while maintaining, for example, a state where the wafer 50 held by the hand 136 is located inside the operation region 250, $\theta_{3d}$ is the offset angle, and $\theta_{Hd}$ is the predetermined angle.

The robot 100 controls the first movable portion 120 and the second movable portion 130 so as to convey the wafer 50 while maintaining a state where $\theta_{3d}$ is the offset angle or a state where $\theta_{Hd}$ is the predetermined angle, so that the wafer 50 can be conveyed in the operation region 250 in a state where the third arm 134 and the hand 136 are inclined with respect to the direction in which the wafer 50 is conveyed. Accordingly, it is possible to achieve a robot capable of conveying the wafer 50 in a space where the width of the operation region 250 is narrower. As a result, it is possible to achieve a robot that can contribute to reduction in the thickness of the housing.

The control unit 152 controls the robot 100, for example, so as to load the wafer 50 into the access target. For example, the control unit 152 controls the first movable portion 120 and the second movable portion 130 so as to load the wafer 50 into the access target in a state where the hand 136 is parallel to the horizontal plane.

The information storage unit 154 stores various types of information. The information storage unit 154 stores, for example, cooperative operation-related information in which the position of the access target is associated with the type of the cooperative operation of the robot 100 at the time of accessing the position of the access target. In the cooperative operation-related information, for example, the position of each of one or more openings of the front wall 210 and the position of each of one or more openings of the back wall 230 are associated with the type of the cooperative operation of the robot 100 when the hand 136 accesses the position of each of one or more openings of the front wall 210 and the position of each of one or more openings of the back wall 230. The acquisition unit 151 may acquire the cooperative operation-related information and store the acquired cooperative operation-related information in the information storage unit 154.

The cooperative operation of the robot 100 includes, for example, the cooperative operation of only the third arm 134 and the hand 136. The cooperative operation of the robot 100 includes, for example, the cooperative operation of the third arm 134, the hand 136, and the first movable portion 120.

The cooperative operation of the robot 100 includes the cooperative operation of the hand 136 and the first movable portion 120.

The cooperative operation selection unit 156 selects the cooperative operation of the robot 100 when the robot 100 accesses the access target.

The cooperative operation selection unit 156 selects the cooperative operation of the robot 100 based on, for example, the position, which is indicated by the access processing information acquired by the acquisition unit 151, of the access target of the access by the hand 136 and the cooperative operation-related information stored in the information storage unit 154. For example, the cooperative operation selection unit 156 selects whether to cause the hand 136 to access the access target by the cooperative operation of only the third arm 134 and the hand 136 or to cause the hand 136 to access the access target by the cooperative operation of the third arm 134, the hand 136, and the first movable portion 120. The control unit 152 may control the first movable portion 120 and the second movable portion 130 to cause the hand 136 to access the access target in a state where the hand 136 is parallel to the horizontal plane by the cooperative operation of the robot 100 selected by the cooperative operation selection unit 156.

When the hand 136 can access the access target by the cooperative operation of only the third arm 134 and the hand 136 which is the cooperative operation that allows access to the access target in a short time, the robot 100 selects the cooperative operation of only the third arm 134 and the hand 136 to access the access target. On the other hand, when the hand 136 cannot access the access target by the cooperative operation of only the third arm 134 and the hand 136, the robot 100 selects the cooperative operation of the third arm 134, the hand 136, and the first movable portion 120 to access the access target. Accordingly, it is possible to achieve a robot that achieves both a high throughput and a wide accessible region as a whole. As a result, it is possible to achieve a robot that can contribute to realization of a system capable of manufacturing more semiconductors per unit time.

Since the third arm 134 and the hand 136 are components of the distal end portion of the robot 100 as compared with the first movable portion 120, the cooperative operation of only the third arm 134 and the hand 136 gives less vibration to the robot 100 as compared with the cooperative operation of the third arm 134, the hand 136, and the first movable portion 120. Therefore, when the hand 136 can access the access target by the cooperative operation of only the third arm 134 and the hand 136, the cooperative operation of only the third arm 134 and the hand 136 is selected to access the access target, and when the hand 136 cannot access the access target by the cooperative operation of only the third arm 134 and the hand 136, the cooperative operation of the third arm 134, the hand 136, and the first movable portion 120 is selected to access the access target, whereby it is possible to achieve a robot that achieves both safe access to the access target and a wide accessible region as a whole. As a result, it is possible to achieve a robot that can contribute to realization of a system having a high yield in semiconductor manufacturing.

Furthermore, in a case where a motor, which is capable of controlling the position with high accuracy, such as a DD motor, is used to control the third arm 134 and the hand 136, when the hand 136 can access the access target by the cooperative operation of only the third arm 134 and the hand 136, the cooperative operation of only the third arm 134 and the hand 136 is selected to access the access target, and when the hand 136 cannot access the access target by the cooperative operation of only the third arm 134 and the hand 136, the cooperative operation of the third arm 134, the hand 136, and the first movable portion 120 is selected to access the access target, whereby it is possible to achieve a robot that achieves both a high accuracy access to the access target and a wide accessible region as a whole. As a result, it is possible to achieve a robot that can contribute to realization of a system capable of manufacturing a higher-quality semiconductor.

For example, when the hand 136 is caused to access each of the plurality of openings of the front wall 210, the cooperative operation selection unit 156 selects to cause the hand 136 to access the access target by the cooperative operation of only the third arm 134 and the hand 136. For example, when the hand 136 is caused to access one opening of one or more openings of the back wall 230, the cooperative operation selection unit 156 selects to cause the hand 136 to access the access target by the cooperative operation of the third arm 134, the hand 136, and the first movable portion 120. For example, when the hand 136 is caused to access another opening of one or more openings of the back wall 230, the cooperative operation selection unit 156 selects to cause the hand 136 to access the access target by the cooperative operation of only the third arm 134 and the hand 136.

The condition storage unit 158 stores an angle condition. The condition storage unit 158 stores, for example, an angle condition including a first candidate condition that requires the angle to be included in a first angular range and a second candidate condition that requires the angle to be included in a second angular range. The acquisition unit 151 may acquire the angle condition and store the acquired angle condition in the condition storage unit 158.

The condition storage unit 158 stores, for example, an arm-system angle condition. The condition storage unit 158 stores, for example, an arm-system angle condition including a first arm-system candidate condition that requires $\theta_{B1}$ to be included in the first arm-system angular range and a second arm-system candidate condition that requires $\theta_{B1}$ to be included in the second arm-system angular range.

The condition storage unit 158 stores, for example, an elbow-system angle condition. The condition storage unit 158 stores, for example, an elbow-system angle condition including a first elbow-system candidate condition that requires $\theta_{12}$ to be included in the first elbow-system angular range and a second elbow-system candidate condition that requires $\theta_{12}$ to be included in the second elbow-system angular range.

The condition storage unit 158 stores, for example, a wrist-system angle condition. The condition storage unit 158 stores, for example, a wrist-system angle condition including a first wrist-system candidate condition that requires $\theta_{2B}$ to be included in the first wrist-system angular range and a second wrist-system candidate condition that requires $\theta_{2B}$ to be included in the second wrist-system angular range.

The condition storage unit 158 stores, for example, a hand-system angle condition. The condition storage unit 158 stores, for example, a hand-system angle condition including a first hand-system candidate condition that requires $\theta_{3H}$ to be included in the first hand-system angular range and a second hand-system candidate condition that requires $\theta_{3H}$ to be included in the second hand-system angular range.

The condition storage unit 158 stores, for example, a forearm-system angle condition. The condition storage unit 158 stores, for example, a forearm-system angle condition including a first forearm-system candidate condition that requires $\theta_{3d}$ to be included in the first forearm-system angular range and a second forearm-system candidate condition that requires $\theta_{3d}$ to be included in the second forearm-system angular range.

The condition storage unit 158 stores, for example, a finger-system angle condition. The condition storage unit 158 stores, for example, a finger-system angle condition including a first finger-system candidate condition that requires $\theta_{Hd}$ to be included in the first finger-system angular range and a second finger-system candidate condition that requires $\theta_{Hd}$ to be included in the second finger-system angular range.

The condition storage unit 158 may store a PA access condition that needs to be satisfied when the hand 136 is caused to access the PA 300. The PA access condition includes, for example, an arm-system PA access condition in which $\theta_{B1}$ needs to be satisfied when the hand 136 is caused to access the PA 300. The PA access condition includes, for example, an elbow-system PA access condition in which $\theta_{12}$ needs to be satisfied when the hand 136 is caused to access the PA 300. The PA access condition includes, for example, a wrist-system PA access condition in which $\theta_{2B}$ needs to be satisfied when the hand 136 is caused to access the PA 300. The PA access condition includes, for example, a hand-system PA access condition in which $\theta_{3H}$ needs to be satisfied when the hand 136 is caused to access the PA 300. The PA access condition includes, for example, a forearm-system PA access condition in which $\theta_{3d}$ needs to be satisfied when the hand 136 is caused to access the PA 300. The PA access condition includes, for example, a finger-system PA access condition in which Od needs to be satisfied when the hand 136 is caused to access the PA 300. The PA access condition includes, for example, two or more of the arm-system PA access condition, the elbow-system PA access condition, the wrist-system PA access condition, the hand-system PA access condition, the forearm-system PA access condition, or the finger-system PA access condition. The PA access condition may be an example of the angle condition.

The most frequent opening is positioned, for example, at a position that allows $\theta_{B1}$ when the hand 136 is caused to access the most frequent opening to satisfy the arm-system PA access condition. The most frequent opening is positioned, for example, at a position that allows $\theta_{12}$ when the hand 136 is caused to access the most frequent opening to satisfy the elbow-system PA access condition. The most frequent opening is positioned, for example, at a position that allows $\theta_{2B}$ when the hand 136 is caused to access the most frequent opening to satisfy the wrist-system PA access condition. The most frequent opening is positioned, for example, at a position that allows $\theta_{3H}$ when the hand 136 is caused to access the most frequent opening to satisfy the hand-system PA access condition. The most frequent opening is positioned, for example, at a position that allows $\theta_{3d}$ when the hand 136 is caused to access the most frequent opening to satisfy the forearm-system PA access condition. The most frequent opening is positioned, for example, at a position that allows $\theta_{Hd}$ when the hand 136 is caused to access the most frequent opening to satisfy the finger-system PA access condition. Accordingly, the hand 136 can continuously access the most frequent opening and the PA 300 without changing the angle condition, so that it is possible to achieve a robot having a high throughput. As a result, it is possible to achieve a robot that can contribute to realization of a system capable of manufacturing more semiconductors per unit time.

The most frequent opening is, for example, the opening of the front wall 210. The most frequent opening may be the opening of the back wall 230.

The condition selection unit 160 selects the angle condition of the access processing. For example, based on the position of the access target of the access by the hand 136 indicated by the access processing information acquired by the acquisition unit 151, the condition selection unit 160 selects the angle condition of the access processing indicated by the access processing information from the first candidate condition and the second candidate condition included in the angle condition stored in the condition storage unit 158. The control unit 152 controls the first movable portion 120 and the second movable portion 130 so as to cause the hand 136 to access an access target while maintaining the state of satisfying the angle condition selected by the condition selection unit 160.

For example, the condition selection unit 160 selects the arm-system angle condition of the access processing from the first arm-system candidate condition and the second arm-system candidate condition included in the arm-system angle condition stored in the condition storage unit 158. For example, the condition selection unit 160 selects the elbow-system angle condition of the access processing from the first elbow-system candidate condition and the second elbow-system candidate condition included in the elbow-system angle condition stored in the condition storage unit 158. For example, the condition selection unit 160 selects the wrist-system angle condition of the access processing from the first wrist-system candidate condition and the second wrist-system candidate condition included in the wrist-system angle condition stored in the condition storage unit 158. For example, the condition selection unit 160 selects the hand-system angle condition for the access processing from the first hand-system candidate condition and the second hand-system candidate condition included in the hand-system angle condition stored in the condition storage unit 158. For example, the condition selection unit 160 selects the forearm-system angle condition of the access processing from the first forearm-system candidate condition and the second forearm-system candidate condition included in the forearm-system angle condition stored in the condition storage unit 158. For example, the condition selection unit 160 selects the finger-system angle condition of the access processing from the first finger-system candidate condition and the second finger-system candidate condition included in the finger-system angle condition stored in the condition storage unit 158. For example, the condition selection unit 160 selects, as the angle condition of the access processing, two or more of the arm-system angle condition of the access processing, the elbow-system angle condition of the access processing, the wrist-system angle condition of the access processing, the hand-system angle condition of the access processing, the forearm-system angle condition of the access processing, or the finger-system angle condition of the access processing.

For example, in a case where the access target is positioned on the side wall side of the housing 200 and is accessible by the hand 136 only when $\theta_{B1}$ is included in the first arm-system angular range, the condition selection unit 160 selects the first arm-system candidate condition as the arm-system angle condition of the access processing. The access target is, for example, the PA 300.

For example, in a case where the access target is positioned on the side wall side of the housing 200 and is accessible by the hand 136 only when $\theta_{12}$ is included in the first elbow-system angular range, the condition selection unit 160 selects the first elbow-system candidate condition as the elbow-system angle condition of the access processing. The access target is, for example, the PA 300.

For example, in a case where the access target is positioned on the side wall side of the housing 200 and is accessible by the hand 136 only when $\theta_{2B}$ is included in the first wrist-system angular range, the condition selection unit 160 selects the first wrist-system candidate condition as the wrist-system angle condition of the access processing. The access target is, for example, the PA 300.

For example, in a case where the access target is positioned on the side wall side of the housing 200 and is accessible by the hand 136 only when $\theta_{3H}$ is included in the first hand-system angular range, the condition selection unit 160 selects the first hand-system candidate condition as the hand-system angle condition of the access processing. The access target is, for example, the PA 300.

For example, in a case where the access target is positioned on the side wall side of the housing 200 and is accessible by the hand 136 only when $\theta_{3d}$ is included in the first forearm-system angular range, the condition selection unit 160 selects the first forearm-system candidate condition as the forearm-system angle condition of the access processing. The access target is, for example, the PA 300.

For example, in a case where the access target is positioned on the side wall side of the housing 200 and is accessible by the hand 136 only when $\theta_{Hd}$ is included in the first finger-system angular range, the condition selection unit 160 selects the first finger-system candidate condition as the finger-system angle condition of the access processing. The access target is, for example, the PA 300.

For example, in a case where the first arm-system candidate condition is selected as the arm-system angle condition of the first access processing, the condition selection unit 160 selects the first arm-system candidate condition as the arm-system angle condition of the second access processing when the hand 136 can access the access target of second access processing that is the access processing subsequent to first access processing in a state where $\theta_{B1}$ is included in the first arm-system angular range, and selects the second arm-system candidate condition as the arm-system angle condition of the second access processing when the hand 136 cannot access the access target of the second access processing in a state where $\theta_{B1}$ is included in the first arm-system angular range. When the condition selection unit 160 selects the second arm-system candidate condition as the arm-system angle condition of the second access processing, the control unit 152 may control the first movable portion 120 and the second movable portion 130 so as to change $\theta_{B1}$ from the first arm-system angular range to the second arm-system angular range. The control unit 152 controls the first movable portion 120 and the second movable portion 130 so as to change $\theta_{B1}$ from the first arm-system angular range to the second arm-system angular range by, for example, changing $\theta_{B1}$ from an angle larger than 0° to an angle smaller than 0° without any interference between the third arm 134 or the hand 136 and an object, such as the housing 200, around the robot 100.

For example, when the hand 136 can access the access target of third access processing which is the access processing subsequent to the second access processing in a state where $\theta_{B1}$ is included in the first arm-system angular range, the condition selection unit 160 selects the first arm-system candidate condition as the arm-system angle condition of the third access processing. For example, when the hand 136 can access the access target of the third access processing in a state where $\theta_{B1}$ is included in the second arm-system angular range, the condition selection unit 160 selects the second arm-system candidate condition as the arm-system angle condition of the third access processing.

For example, in a case where the first elbow-system candidate condition is selected as the elbow-system angle condition of the first access processing, the condition selection unit 160 selects the first elbow-system candidate condition as the elbow-system angle condition of the second access processing when the hand 136 can access the access target of the second access processing which is the access processing subsequent to the first access processing in a state where $\theta_{12}$ is included in the first elbow-system angular range, and selects the second elbow-system candidate condition as the elbow-system angle condition of the second access processing when the hand 136 cannot access the access target of the second access processing in a state where $\theta_{12}$ is included in the first elbow-system angular range. When the condition selection unit 160 selects the second elbow-system candidate condition as the elbow-system angle condition of the second access processing, the control unit 152 may control the first movable portion 120 and the second movable portion 130 so as to change $\theta_{12}$ from the first elbow-system angular range to the second elbow-system angular range. The control unit 152 controls the first movable portion 120 and the second movable portion 130 so as to change $\theta_{12}$ from the first arm-system angular range to the second arm-system angular range by, for example, changing a state where the first movable portion 120 is extended in the positive rotation direction to a state where the first movable portion 120 is extended in the negative rotation direction in a space in the housing 200 in which the first movable portion 120 can be maximally extended without any interference between the third arm 134 or the hand 136 and an object, such as the housing 200, around the robot 100.

For example, when the hand 136 can access the access target of the third access processing which is the access processing subsequent to the second access processing in a state where $\theta_{12}$ is included in the first elbow-system angular range, the condition selection unit 160 selects the first elbow-system candidate condition as the elbow-system angle condition of the third access processing. For example, when the hand 136 can access the access target of the third access processing in a state where $\theta_{12}$ is included in the second elbow-system angular range, the condition selection unit 160 selects the second elbow-system candidate condition as the elbow-system angle condition of the third access processing.

For example, in a case where the first wrist-system candidate condition is selected as the wrist-system angle condition of the first access processing, the condition selection unit 160 selects the first wrist-system candidate condition as the wrist-system angle condition of the second access processing when the hand 136 can access the access target of the second access processing that is the access processing subsequent to the first access processing in a state where $\theta_{2B}$ is included in the first wrist-system angular range, and selects the second wrist-system candidate condition as the wrist-system angle condition of the second access processing when the hand 136 cannot access the access target of the second access processing in a state where $\theta_{2B}$ is included in the first wrist-system angular range. When the condition selection unit 160 selects the second wrist-system candidate condition as the wrist-system angle condition of the second access processing, the control unit 152 may control the first movable portion 120 and the second movable portion 130 so as to change $\theta_{2B}$ from the first wrist-system angular range to the second wrist-system angular range. The control unit 152 controls the first movable portion 120 and the second movable portion 130 so as to change $\theta_{2B}$ from the first wrist-system angular range to the second wrist-system angular range by, for example, changing a state where the second base 132 is rotated in the positive rotation direction to a state where the second base 132 is rotated in the negative rotation direction with respect to a state where the direction of the vector parallel to $I_{23}$ coincides with the direction of the vector parallel to $I_{4p}$ without any interference between the third arm 134 or the hand 136 and an object, such as the housing 200, around the robot 100.

For example, when the hand 136 can access the access target of the third access processing which is the access processing subsequent to the second access processing in a state where $\theta_{2B}$ is included in the first wrist-system angular range, the condition selection unit 160 selects the first wrist-system candidate condition as the wrist-system angle condition of the third access processing. For example, when the hand 136 can access the access target of the third access processing in a state where $\theta_{2B}$ is included in the second wrist-system angular range, the condition selection unit 160 selects the second wrist-system candidate condition as the wrist-system angle condition of the third access processing.

For example, in a case where the first hand-system candidate condition is selected as the first hand-system angle condition of the first access processing, the condition selection unit 160 selects the first hand-system candidate condition as the hand-system angle condition of the second access processing when the hand 136 can access the access target of the second access processing that is the access processing subsequent to the first access processing in a state where $\theta_{3H}$ is included in the first hand-system angular range, and selects the second hand-system candidate condition as the hand-system angle condition of the second access processing when the hand 136 cannot access the access target of the second access processing in a state where $\theta_{3H}$ is included in the first hand-system angular range. When the condition selection unit 160 selects the second hand-system candidate condition as the hand-system angle condition of the second access processing, the control unit 152 may control the first movable portion 120 and the second movable portion 130 so as to change $\theta_{3H}$ from the first hand-system angular range to the second hand-system angular range.

For example, when the housing 200 has the portion 212, the control unit 152 controls the hand 136 so as to change $\theta_{3H}$ in the portion 212 from the first hand-system angular range to the second hand-system angular range by rotating only the hand 136. For example, when the housing 200 has the portion 214, the control unit 152 controls the hand 136 and the first movable portion 120 so as to change $\theta_{3H}$ in the portion 214 from the first hand-system angular range to the second hand-system angular range by causing the hand 136 and the first movable portion 120 to perform a cooperative operation. The control unit 152 may control the hand 136 and the first movable portion 120 so as to change $\theta_{3H}$ in the opening for access to the cassette 220 from the first hand-system angular range to the second hand-system angular range by causing the hand 136 and the first movable portion 120 to perform a cooperative operation.

The control unit 152 may control the third arm 134, the hand 136, and the first movable portion 120 so as to change $\theta_{3H}$ from the first hand-system angular range to the second hand-system angular range in the operation region 250. For example, the control unit 152 causes the third arm 134, the hand 136, and the first movable portion 120 to perform a cooperative operation, so as to extend the robot arm toward the side wall of the housing 200 in the operation region 250 and then bend the extended robot arm in the operation region 250, thereby changing $\theta_{3H}$ from the first hand-system angular range to the second hand-system angular range in the operation region 250.

For example, when the hand 136 can access the access target of the third access processing which is the access processing subsequent to the second access processing in a state where $\theta_{3H}$ is included in the first hand-system angular range, the condition selection unit 160 selects the first hand-system candidate condition as the hand-system angle condition of the third access processing. For example, when the hand 136 can access the access target of the third access processing in a state where $\theta_{3H}$ is included in the second hand-system angular range, the condition selection unit 160 selects the second hand-system candidate condition as the hand-system angle condition of the third access processing.

For example, in a case where the first forearm-system candidate condition is selected as the forearm-system angle condition of the first access processing, the condition selection unit 160 selects the first forearm-system candidate condition as the forearm-system angle condition of the second access processing when the hand 136 can access the access target of the second access processing that is the access processing subsequent to the first access processing in a state where $\theta_{3d}$ is included in the first forearm-system angular range, and selects the second forearm-system candidate condition as the forearm-system angle condition of the second access processing when the hand 136 cannot access the access target of the second access processing in a state where $\theta_{3d}$ is included in the first forearm-system angular range. When the second forearm-system candidate condition is selected as the forearm-system angle condition of the second access processing, the control unit 152 controls the first movable portion 120 and the second movable portion 130 so as to change $\theta_{3d}$ in the portion of the housing 200 for changing $\theta_{3d}$ from the first forearm-system angular range to the second forearm-system angular range.

For example, when the housing 200 has the portion 212, the control unit 152 controls the third arm 134 so as to change $\theta_{3d}$ in the portion 212 from the first forearm-system angular range to the second forearm-system angular range by rotating only the third arm 134. The control unit 152 controls the third arm 134 so as to change the angular range of $\theta_{3d}$ from the first forearm-system angular range to the second forearm-system angular range by, for example, changing $\theta_{3d}$ in the portion 212 from 0° to −180°. For example, when the housing 200 has the portion 214, the control unit 152 controls the third arm 134 and the first movable portion 120 so as to change $\theta_{3d}$ in the portion 214 from the first forearm-system angular range to the second forearm-system angular range by causing the third arm 134 and the first movable portion 120 to perform a cooperative operation. The control unit 152 may control the third arm 134 and the first movable portion 120 so as to change $\theta_{3d}$ in the opening for access to the cassette 220 from the first forearm-system angular range to the second forearm-system angular range by causing the third arm 134 and the first movable portion 120 to perform a cooperative operation.

For example, when the hand 136 can access the access target of the third access processing which is the access processing subsequent to the second access processing in a state where $\theta_{3d}$ is included in the first forearm-system angular range, the condition selection unit 160 selects the first forearm-system candidate condition as the forearm-system angle condition of the third access processing. For example, when the hand 136 can access the access target of the third access processing in a state where $\theta_{3d}$ is included in the second forearm-system angular range, the condition selection unit 160 selects the second forearm-system candidate condition as the forearm-system angle condition of the third access processing.

For example, in a case where the first finger-system candidate condition is selected as the finger-system angle condition of the first access processing, the condition selection unit 160 selects the first finger-system candidate condition as the finger-system angle condition of the second access processing when the hand 136 can access the access target of the second access processing which is the access processing subsequent to the first access processing in a state where $\theta_{Hd}$ is included in the first finger-system angular range, and selects the second finger-system candidate condition as the finger-system angle condition of the second access processing when the hand 136 cannot access the access target of the second access processing in a state where $\theta_{Hd}$ is included in the first finger-system angular range. When the second finger-system candidate condition is selected as the finger-system angle condition of the second access processing, the control unit 152 controls the first movable portion 120 and the second movable portion 130 so as to change $\theta_{Hd}$ in the portion of the housing 200 for changing Oud from the first finger-system angular range to the second finger-system angular range.

For example, when the housing 200 has the portion 212, the control unit 152 controls the hand 136 so as to change $\theta_{Hd}$ in the portion 212 from the first finger-system angular range to the second finger-system angular range by rotating only the hand 136. For example, when the housing 200 has the portion 214, the control unit 152 controls the hand 136 and the first movable portion 120 so as to change $\theta_{Hd}$ in the portion 214 from the first finger-system angular range to the second finger-system angular range by causing the hand 136 and the first movable portion 120 to perform a cooperative operation. The control unit 152 may control the hand 136 and the first movable portion 120 so as to change Hd in the opening for access to the cassette 220 from the first finger-system angular range to the second finger-system angular range by causing the hand 136 and the first movable portion 120 to perform a cooperative operation.

For example, when the hand 136 can access the access target of the third access processing which is the access processing subsequent to the second access processing in a state where $\theta_{Hd}$ is included in the first finger-system angular range, the condition selection unit 160 selects the first finger-system candidate condition as the finger-system angle condition of the third access processing. For example, when the hand 136 can access the access target of the third access processing in a state where $\theta_{Hd}$ is included in the second finger-system angular range, the condition selection unit 160 selects the second finger-system candidate condition as the finger-system angle condition of the third access processing.

When the robot 100 can access the access target of the second access processing without any change from the angle condition of the first access processing, the robot 100 accesses the access target of the second access processing without changing the angle condition in order to access the access target of the second access processing in a short time, and when the robot 100 cannot access the access target of the second access processing without any change from the angle condition of the first access processing, the robot 100 accesses the access target of the second access processing after changing the angle condition. Accordingly, it is possible to achieve a robot that achieves both a high throughput and a wide accessible region as a whole.

Then, in a case where the robot 100 accesses the access target of the second access processing after changing the angle condition, when the robot 100 accesses the access target of the third access processing, for example, if the robot 100 can access the access target of the third access processing under the angle condition before the change, the robot 100 accesses the access target of the third access processing after returning to the angle condition before the change. Accordingly, the robot 100 can access the access target by prioritizing accessing the access target as much as possible under the angle condition that serves as a reference for access to the access target. In particular, a plurality of openings with a high access frequency such as the most frequent opening are positioned at accessible positions under the reference angle condition, so that it is possible to achieve a robot that can contribute to realization of a system having a high throughput as a whole.

In a case where the robot 100 accesses the access target of the second access processing after changing the angle condition, when the robot 100 accesses the access target of the third access processing, for example, if the robot 100 can access the access target of the third access processing under the changed angle condition, the robot 100 accesses the access target of the third access processing under the changed angle condition as it is. Accordingly, the robot 100 can access the access target by prioritizing not changing the angle condition as much as possible. In particular, an opening with a high access frequency such as the most frequent opening portion is positioned at an accessible position regardless of the angle condition, so that it is possible to achieve a robot that can contribute to realization of a system having a high throughput as a whole.

The control unit 152 controls the first movable portion 120 and the second movable portion 130, for example, such that the first movable portion 120 passes through a space between the inner surface 1121 of the first side surface portion 112 and the inner surface 1141 of the second side surface portion 114. For example, in a state where the altitude of the second rotation shaft 103 is lower than the altitude of the first rotation shaft 101, the control unit 152 controls the first movable portion 120 and the second movable portion 130 such that the third rotation shaft 105 and the second movable portion 130 do not pass through $p_{B1}$, and the second rotation shaft 103 passes through $p_{B1}$.

The control unit 152 controls the first movable portion 120 and the second movable portion 130, for example, so as to cause the hand 136 to access the PA 300. The control unit 152 controls the first movable portion 120 and the second movable portion 130 so as to cause the hand 136 to access the PA 300, for example, in a state where the hand 136 is parallel to the horizontal plane. The control unit 152 controls the first movable portion 120 and the second movable portion 130 so as to cause the hand 136 to access the PA 300, for example, in a state where the wafer 50 held by the hand 136 is located inside the operation region 250 and in a state where the hand 136 is parallel to the horizontal plane.

The control unit 152 may have a function of controlling the entire system 10. The control unit 152 controls, for example, the cassette opener. The control unit 152 controls, for example, opening and closing of the cassette opener. The control unit 152 controls, for example, the load lock chamber 240. The control unit 152 controls the load lock chamber 240 by, for example, controlling the gate valve of the load lock chamber 240.

For example, in a state where both the gate valve on the EFEM side and the gate valve on the processing chamber side are sealed, the control unit 152 controls the gate valve on the EFEM side so as to open the gate valve on the EFEM side, in order to move the wafer 50 between the EFEM and the load lock chamber 240. Thereafter, in response to the wafer 50 being loaded from the EFEM into the load lock chamber 240 or the wafer 50 being unloaded from the load lock chamber 240, the control unit 152 may control the gate valve on the EFEM side so as to seal the opened gate valve on the EFEM side.

For example, in a state where both the gate valve on the EFEM side and the gate valve on the processing chamber side are sealed, the control unit 152 controls the gate valve on the processing chamber side so as to open the gate valve on the processing chamber side, in order to move the wafer 50 between the load lock chamber 240 and the processing chamber. Thereafter, in response to the wafer 50 being loaded from the processing chamber to the load lock chamber 240 or the wafer 50 being unloaded from the load lock chamber 240, the control unit 152 may control the gate valve on the processing chamber side so as to seal the opened gate valve on the processing chamber side.

The control unit 152 controls the load lock chamber 240 by, for example, controlling the inner pressure of the load lock chamber 240. The control unit 152 controls the inner pressure state of the load lock chamber 240 to the atmospheric pressure state, for example. The control unit 152 controls the inner pressure state of the load lock chamber 240 to a depressurized state, for example.

The control unit 152 may control the PA 300. The control unit 152 controls, for example, the rotation table of the PA 300. The control unit 152 controls the rotation table of the PA 300, for example, so as to rotate the wafer 50 in a desired direction.

Figure 26:
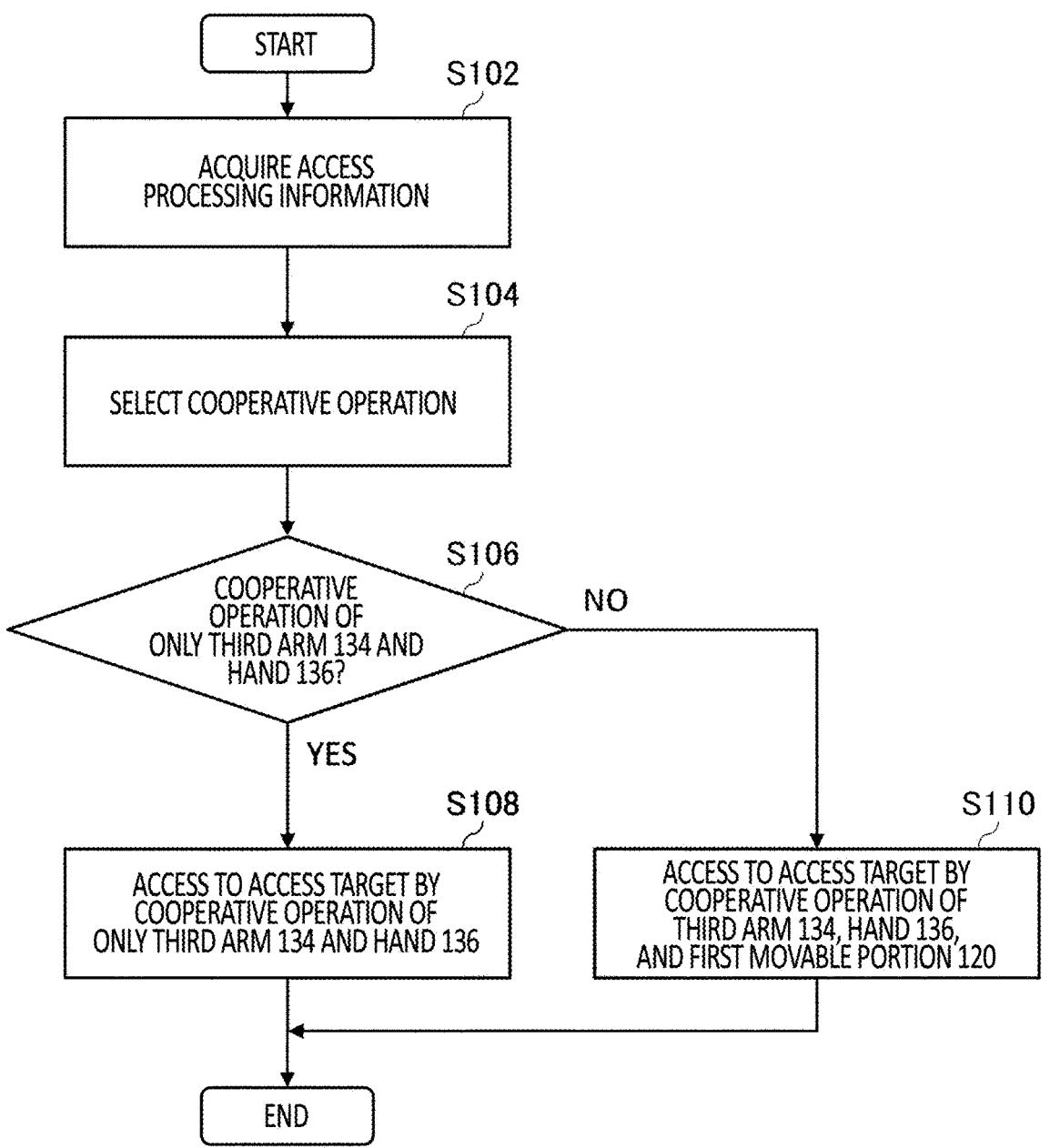
FIG. 26 is an explanatory diagram for explaining an example of a processing flow of the robot 100.

FIG. 26 is an explanatory diagram for explaining an example of a processing flow of the robot 100. Here, a state where the robot 100 has not acquired the access processing information will be described as a start state.

In step (the step may be abbreviated as S) 102, the acquisition unit 151 acquires access processing information. In S104, the cooperative operation selection unit 156 selects the cooperative operation of the robot 100 based on the access processing information acquired by the acquisition unit 151 in S102 and the cooperative operation-related information stored in the information storage unit 154. Here, the description will be continued assuming that the access target indicated by the access processing information is the opening of the housing 200.

In S106, the control unit 152 determines whether the cooperative operation of the robot 100 selected by the cooperative operation selection unit 156 in S104 is the cooperative operation of only the third arm 134 and the hand 136. If the control unit 152 determines that it is the cooperative operation of only the third arm 134 and the hand 136, the process proceeds to S108. If the control unit 152 determines that it is not the cooperative operation of only the third arm 134 and the hand 136, the process proceeds to S110.

In S108, the control unit 152 controls the first movable portion 120 and the second movable portion 130 such that the cooperative operation of only the third arm 134 and the hand 136 causes the hand 136 to access the access target in a state where the hand 136 is parallel to the horizontal plane. Thereafter, the processing of the robot 100 ends.

In S110, the control unit 152 controls the first movable portion 120 and the second movable portion 130 such that the cooperative operation of the third arm 134, the hand 136, and the first movable portion 120 causes the hand 136 to access the access target in a state where the hand 136 is parallel to the horizontal plane. Thereafter, the processing of the robot 100 ends.

Figure 27:
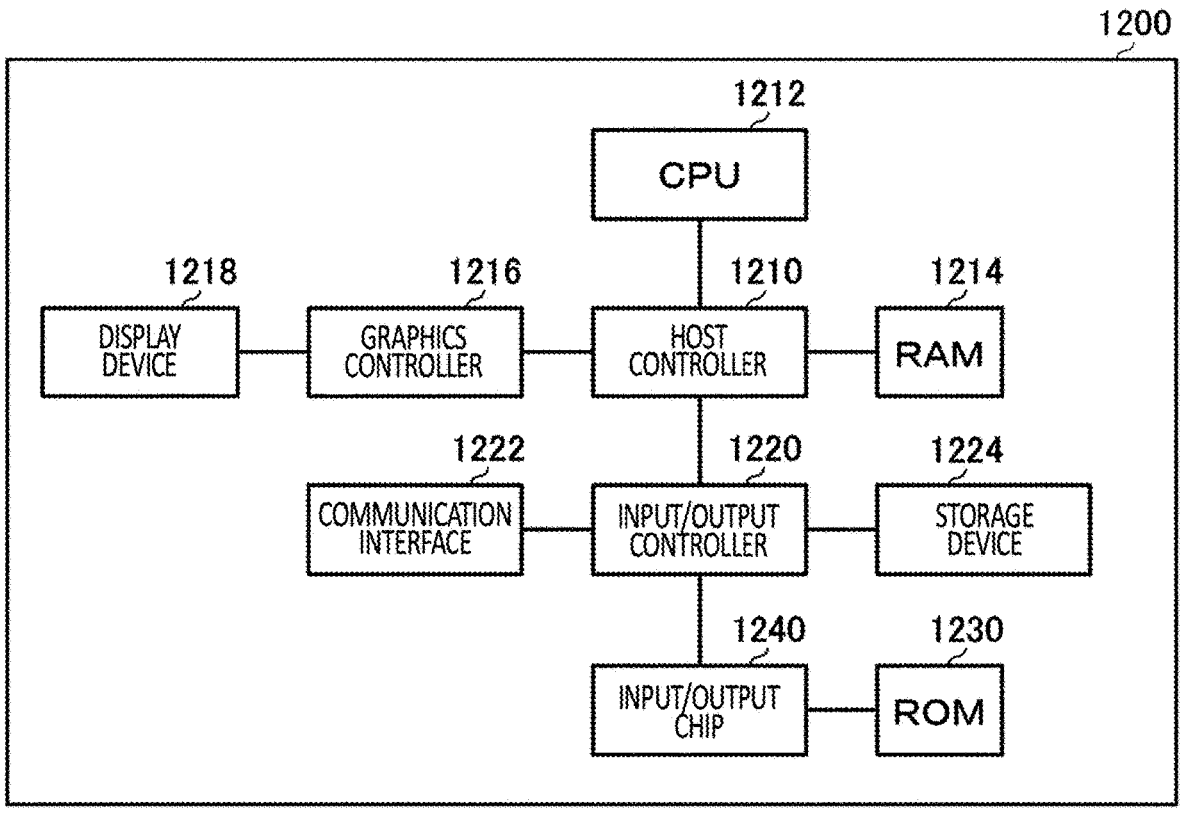
FIG. 27 schematically illustrates an example of a hardware configuration of a computer 1200 functioning as the robot 100.

FIG. 27 schematically illustrates an example of a hardware configuration of a computer 1200 functioning as the robot 100. Programs installed in the computer 1200 can cause the computer 1200 to function as one or more "units" of the device according to the above described embodiment or can cause the computer 1200 to execute operations associated with the devices according to the above described embodiment or the one or more "units", and/or can cause the computer 1200 to execute a process according to the above described embodiment or steps of the process. Such a program may be executed by a CPU 1212 to cause the computer 1200 to perform particular operations associated with some or all of the blocks in the flowcharts and block diagrams described in the specification.

The computer 1200 according to the present embodiment includes the CPU 1212, a RAM 1214, and a graphics controller 1216, which are connected to each other via a host controller 1210. The computer 1200 also includes input/output units such as a communication interface 1222, a storage apparatus 1224, a DVD drive and an IC card drive, which are connected to the host controller 1210 via an input/output controller 1220. The DVD drive may be a DVD-ROM drive, a DVD-RAM drive, etc. The storage device 1224 may be a hard disk drive, a solid-state drive, and the like. The computer 1200 also includes a ROM 1230 and a legacy input/output unit such as a keyboard, which are connected to the input/output controller 1220 via an input/output chip 1240.

The CPU 1212 operates according to the programs stored in the ROM 1230 and the RAM 1214, thereby controlling each unit. The graphics controller 1216 obtains image data which is generated by the CPU 1212 in a frame buffer or the like provided in the RAM 1214 or in itself so as to cause the image data to be displayed on a display device 1218.

The communication interface 1222 communicates with other electronic devices via a network. The storage device 1224 stores a program and data used by the CPU 1212 in the computer 1200. The DVD drive reads the programs or the data from the DVD-ROM or the like, and provides the storage apparatus 1224 with the programs or the data. The IC card drive reads the program and data from an IC card, and/or writes the program and data to the IC card.

The ROM 1230 stores therein a boot program or the like executed by the computer 1200 at the time of activation, and/or a program depending on the hardware of the computer 1200. The input/output chip 1240 may also connect various input/output units via a USB port, a parallel port, a serial port, a keyboard port, a mouse port, or the like to the input/output controller 1220.

A program is provided by a computer-readable storage medium such as the DVD-ROM or the IC card. The program is read from the computer-readable storage medium, installed into the storage device 1224, RAM 1214, or ROM 1230, which are also examples of a computer-readable storage medium, and executed by the CPU 1212. Information processing described in these programs is read by the computer 1200, and provides cooperation between the programs and the various types of hardware resources described above. An apparatus or method may be constituted by realizing the operation or processing of information in accordance with the usage of the computer 1200.

For example, in a case where a communication is performed between the computer 1200 and an external device, the CPU 1212 may execute a communication program loaded in the RAM 1214 and instruct the communication interface 1222 to perform communication processing based on a process written in the communication program. The communication interface 1222, under control of the CPU 1212, reads transmission data stored on a transmission buffer region provided in a recording medium such as the RAM 1214, the storage apparatus 1224, the DVD-ROM, or the IC card, and transmits the read transmission data to a network or writes reception data received from a network to a reception buffer region or the like provided on the recording medium.

In addition, the CPU 1212 may cause all or a necessary portion of a file or a database to be read into the RAM 1214, the file or the database having been stored in an external recording medium such as the storage apparatus 1224, the DVD drive (DVD-ROM), the IC card, etc., and perform various types of processing on the data on the RAM 1214. Next, the CPU 1212 may write the processed data back in the external recording medium.

A various types of information, such as various types of programs, data, tables, and databases, may be stored in the recording medium to undergo information processing. The CPU 1212 may execute, on the data read from the RAM 1214, various types of processing including various types of operations, information processing, conditional judgement, conditional branching, unconditional branching, information search/replacement, or the like described throughout the present disclosure and designated by instruction sequences of the programs, to write the results back to the RAM 1214. In addition, the CPU 1212 may search for information in a file, a database, or the like in the recording medium. For example, when a plurality of entries, each having an attribute value of a first attribute associated with an attribute value of a second attribute, are stored in the recording medium, the CPU 1212 may search for an entry whose attribute value of the first attribute matches a designated condition, from among said plurality of entries, and read the attribute value of the second attribute stored in said entry, thereby acquiring the attribute value of the second attribute associated with the first attribute that meets a predetermined condition.

The programs or software module described above may be stored on the computer 1200 or in a computer-readable storage medium near the computer 1200. In addition, a recording medium such as a hard disk or a RAM provided in a server system connected to a dedicated communication network or the Internet can be used as the computer-readable storage medium, thereby providing the program to the computer 1200 via the network.

Blocks in flowcharts and block diagrams in the present embodiments may represent steps of processes in which operations are performed or "units" of devices responsible for performing operations. A specific step and "unit" may be implemented by dedicated circuitry, programmable circuitry supplied along with a computer-readable instruction stored on a computer-readable storage medium, and/or a processor supplied along with the computer-readable instruction stored on the computer-readable storage medium. The dedicated circuitry may include a digital and/or analog hardware circuit, or may include an integrated circuit (IC) and/or a discrete circuit. The programmable circuitry may include, for example, a reconfigurable hardware circuit including logical AND, logical OR, logical XOR, logical NAND, logical NOR, and other logical operations, and a flip-flop, a register, and a memory element, such as a field-programmable gate array (FPGA) and a programmable logic array (PLA).

The computer-readable storage medium may include any tangible device capable of storing an instruction performed by an appropriate device, so that the computer-readable storage medium having the instruction stored thereon constitutes a product including an instruction that may be performed in order to provide means for performing an operation specified by a flowchart or a block diagram. An example of the computer-readable storage medium may include an electronic storage medium, a magnetic storage medium, an optical storage medium, an electromagnetic storage medium, or a semiconductor storage medium. More specific examples of the computer-readable storage medium may include a floppy (registered trademark) disk, a diskette, a hard disk, a random access memory (RAM), a read only memory (ROM), an erasable programmable read only memory (EPROM or flash memory), an electrically erasable programmable read only memory (EEPROM), a static random access memory (SRAM), a compact disk read only memory (CD-ROM), a digital versatile disk (DVD), a Blu-ray (registered trademark) disk, a memory stick, an integrated circuit card, or the like.

The computer-readable instructions may include an assembler instruction, an instruction-set-architecture (ISA) instruction, a machine instruction, a machine dependent instruction, a microcode, a firmware instruction, state-setting data, or either of source code or object code written in any combination of one or more programming languages including an object oriented programming language such as Smalltalk (registered trademark), JAVA (registered trademark), and C++, and a conventional procedural programming language such as a "C" programming language or a similar programming language.

The computer-readable instruction may be provided to a general-purpose computer, a special purpose computer, or a processor or programmable circuitry of another programmable data processing device locally or via a local area network (LAN), a wide area network (WAN) such as the Internet or the like in order that the general-purpose computer, the special purpose computer, or the processor or the programmable circuitry of another programmable data processing device performs said computer-readable instruction to provide means for performing operations specified by the flowchart or the block diagram. Examples of the processor include a computer processor, a processing unit, a microprocessor, a digital signal processor, a controller, a microcontroller, and the like.

While the present invention has been described with the embodiments, the technical scope of the present invention is not limited to the above-described embodiments. It is apparent to persons skilled in the art that various alterations or improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: system; 50: wafer; 100: robot; 101: first rotation shaft; 103: second rotation shaft; 105: third rotation shaft;

107: fourth rotation shaft; 109: fifth rotation shaft; 110: first base; 112: first side surface portion; 113: cavity; 114: second side surface portion; 116: bottom surface portion; 120: first movable portion; 122: first arm; 123: gap; 124: second arm; 125: gap; 130: second movable portion; 132: second base; 134: third arm; 136: hand; 140: first movable portion; 142: first arm; 143: gap; 144: second arm; 151: acquisition unit; 152: control unit; 154: information storage unit; 156: cooperative operation selection unit; 158: condition storage unit; 160: condition selection unit; 200: housing; 210: front wall; 212: portion; 214: portion; 220: cassette; 221: cassette; 222: cassette; 223: cassette; 224: cassette; 225: cassette; 227: open/close region; 230: back wall; 240: load lock chamber; 241: load lock chamber; 242: load lock chamber; 243: load lock chamber; 250: operation region; 261: region; 263: region; 265: region; 267: region; 269: region; 270: first side wall; 284: region; 290: second side wall; 300: PA; 1121: inner surface; 1123: outer surface; 1141: inner surface; 1143: outer surface; 1147: second side surface; 1148: connector portion; 1160: central portion; 1162: first protruding portion; 1164: second protruding portion; 1166: hole; 1200: computer; 1210: host controller; 1212: CPU; 1214: RAM; 1216: graphics controller; 1218: display device; 1220: input/output controller; 1222: communication interface; 1224: storage device; 1230: ROM; 1240: input/output chip; 2210: opening; 2220: opening; 2230: opening; 2240: opening; 2250: opening; 2410: opening; 2420: opening; 2430: opening; 2850: opening.

What is claimed is:

1. A robot arranged in a housing having a front wall having a plurality of openings for access to a cassette storing a wafer and a back wall facing the front wall and having an opening, the robot comprising:

a first base;

a first movable portion which has a first arm having a proximal end side connected to the first base to be rotatable about a first rotation shaft in a vertical plane and a second arm having a proximal end side connected to a distal end side of the first arm to be rotatable about a second rotation shaft in the vertical plane;

a second movable portion which has a second base having a proximal end side connected to a distal end side of the second arm to be rotatable about a third rotation shaft in the vertical plane, a third arm having a proximal end side connected to a distal end side of the second base to be rotatable about a fourth rotation shaft, and a hand having a proximal end side connected to a distal end side of the third arm to be rotatable about a fifth rotation shaft and holding the wafer;

at least one memory configured to store cooperative operation-related information in which a position of each of the plurality of openings of the front wall and a position of the opening of the back wall are associated with a type of a cooperative operation of the robot when the hand accesses the position of each of the plurality of openings of the front wall and the position of the opening of the back wall;

at least one processor configured to:

select, based on a position of an access target of access by the hand and the cooperative operation-related information stored in the at least one memory, whether to cause the hand to access the access target by an cooperative operation of the third arm and the hand or to cause the hand to access the access target by an operation of the third arm, the hand, and the first movable portion; and control the first movable portion and the second movable portion to cause the hand to access the access target in a state where the hand is parallel to a horizontal plane by the cooperative operation of the robot selected by the at least one processor.

2. The robot according to claim 1, wherein when the hand is caused to access each of the plurality of openings of the front wall, the at least one processor is further configured to select to cause the hand to access the access target by the cooperative operation of the third arm and the hand.

3. The robot according to claim 2, wherein when the hand is caused to access the opening of the back wall, the at least one processor is further configured to select to cause the hand to access the access target by the cooperative operation of the third arm, the hand, and the first movable portion.

4. The robot according to claim 1, wherein the at least one processor is further configured to control the first movable portion and the second movable portion so as to cause the hand to access the access target while maintaining a state where a first angle between a vector parallel to a straight line passing through the fourth rotation shaft and the fifth rotation shaft and perpendicular to the fourth rotation shaft and the fifth rotation shaft and a vector parallel to a center line of the hand perpendicular to the fifth rotation shaft and passing through the fifth rotation shaft satisfies a predetermined first angle condition.

5. The robot according to claim 4, wherein
the at least one memory is further configured to store the first angle condition including a first candidate condition that requires the first angle to be included in a first angular range and a second candidate condition that requires the first angle to be included in a second angular range, and
the at least one processor is further configured to:
select the first angle condition of access processing of causing the hand to access the access target from the first candidate condition and the second candidate condition, based on a position of the access target; and
control the first movable portion and the second movable portion so as to cause the hand to access the access target while maintaining a state where the first angle condition selected by the at least one processor is satisfied.

6. The robot according to claim 5, wherein the at least one processor is further configured to select the first candidate condition as the first angle condition of the access processing in a case where the access target is positioned on a side wall side of the housing and is accessible by the hand only when the first angle is included in the first angular range.

7. The robot according to claim 6, wherein the at least one processor is further configured to select the first candidate condition as the first angle condition of the access processing when the access target is a pre-aligner (PA).

8. The robot according to claim 5, wherein in a case where the first candidate condition is selected as the first angle condition of first access processing, the at least one processor is further configured to select the first candidate condition as the first angle condition of second access processing which is access processing subsequent to the first access processing when the hand is capable of accessing an access target of the second access processing in a state where the first angle is included in the first angular range, and selects the second candidate condition as the first angle condition of the second access processing when the hand is incapable of accessing the access target of the second access processing in a state where the first angle is included in the first angular range.

9. The robot according to claim 8, wherein when the at least one processor selects the second candidate condition as the first angle condition of the second access processing, the at least one processor is further configured to control the first movable portion and the second movable portion so as to change the first angle from the first angular range to the second angular range.

10. The robot according to claim 9, wherein when the hand is capable of accessing an access target of third access processing which is access processing subsequent to the second access processing in a state where the first angle is included in the first angular range, the at least one processor is further configured to select the first candidate condition as the first angle condition of the third access processing.

11. The robot according to claim 9, wherein when the hand is capable of accessing an access target of third access processing which is access processing subsequent to the second access processing in a state where the first angle is included in the second angular range, the at least one processor is further configured to select the second candidate condition as the first angle condition of the third access processing.

12. The robot according to claim 5, wherein the first angular range is an angle from 0° to 180° and the second angular range is an angle from −180° to 0°.

13. The robot according to claim 4, wherein the at least one processor is further configured to control the first movable portion and the second movable portion so as to cause the hand to access the access target while maintaining a state where a second angle between a vector parallel to a direction in which the wafer is conveyed in an operation region and a vector parallel to a center line of the hand perpendicular to the fifth rotation shaft and passing through the fifth rotation shaft further satisfies a predetermined second angle condition, the operation region being defined in a space between the front wall and the back wall so as not to overlap an open/close region for a cassette opener, which is provided at a position corresponding to each of the plurality of openings of the front wall, to open and close the cassette.

14. The robot according to claim 13, wherein
the at least one memory is further configured to store the second angle condition including a third candidate condition that requires the second angle to be included in a third angular range and a fourth candidate condition that requires the second angle to be included in a fourth angular range, and
the at least one processor is further configured to:
select the second angle condition of access processing of causing the hand to access the access target from the third candidate condition and the fourth candidate condition, based on a position of the access target; and
control the first movable portion and the second movable portion so as to cause the hand to access the access target while maintaining a state where the second angle condition selected by the at least one processor is satisfied.

15. The robot according to claim 14, wherein the third angular range corresponds to a state where a distal end side of the hand is positioned on a right side of the proximal end side of the hand, and the fourth angular range corresponds to a state where the distal end side of the hand is positioned on a left side of the proximal end side of the hand.

16. A system comprising:

the robot according to claim 1; and the housing.

17. A system comprising:

the robot according to claim 2; and the housing.

18. A system comprising:

the robot according to claim 3; and the housing.

19. A control method executed by a robot which is arranged in a housing having a front wall having a plurality of openings for access to a cassette storing a wafer and a back wall facing the front wall and having an opening, the robot including: a first base; a first movable portion which has a first arm having a proximal end side connected to the first base to be rotatable about a first rotation shaft in a vertical plane and a second arm having a proximal end side connected to a distal end side of the first arm to be rotatable about a second rotation shaft in the vertical plane; a second movable portion which has a second base having a proximal end side connected to a distal end side of the second arm to be rotatable about a third rotation shaft in the vertical plane, a third arm having a proximal end side connected to a distal end side of the second base to be rotatable about a fourth rotation shaft, and a hand having a proximal end side connected to a distal end side of the third arm to be rotatable about a fifth rotation shaft and holding the wafer; and at least one memory configured to store cooperative operation-related information in which a position of each of the plurality of openings of the front wall and a position of the opening of the back wall are associated with a type of a cooperative operation of the robot when the hand accesses the position of each of the plurality of openings of the front wall and the position of the opening of the back wall, the control method comprising:

selecting a cooperative operation by selecting, based on a position of an access target of access by the hand and the cooperative operation-related information stored in the at least one memory, whether to cause the hand to access the access target by an cooperative operation of the third arm and the hand or to cause the hand to access the access target by an cooperative operation of the third arm, the hand, and the first movable portion; and controlling the first movable portion and the second movable portion to cause the hand to access the access target in a state where the hand is parallel to a horizontal plane by the cooperative operation of the robot selected by the selecting the cooperative operation.

20. A non-transitory computer-readable storage medium having recorded thereon a program that causes a computer mounted with a robot to perform a control method, wherein the robot, which is arranged in a housing having a front wall having a plurality of openings for access to a cassette storing a wafer and a back wall facing the front wall and having an opening, includes: a first base; a first movable portion which has a first arm having a proximal end side connected to the first base to be rotatable about a first rotation shaft in a vertical plane and a second arm having a proximal end side connected to a distal end side of the first arm to be rotatable about a second rotation shaft in the vertical plane; a second movable portion which has a second base having a proximal end side connected to a distal end side of the second arm to be rotatable about a third rotation shaft in the vertical plane, a third arm having a proximal end side connected to a distal end side of the second base to be rotatable about a fourth rotation shaft, and a hand having a proximal end side connected to a distal end side of the third arm to be rotatable about a fifth rotation shaft and holding the wafer; and at least one memory configured to store cooperative operation-related information in which a position of each of the plurality of openings of the front wall and a position of the opening of the back wall are associated with a type of a cooperative operation of the robot when the hand accesses the position of each of the plurality of openings of the front wall and the position of the opening of the back wall, the control method including:

selecting a cooperative operation by selecting, based on a position of an access target of access by the hand and the cooperative operation-related information stored in the at least one memory, whether to cause the hand to access the access target by an cooperative operation of the third arm and the hand or to cause the hand to access the access target by an cooperative operation of the third arm, the hand, and the first movable portion; and controlling the first movable portion and the second movable portion to cause the hand to access the access target in a state where the hand is parallel to a horizontal plane by the cooperative operation of the robot selected by the selecting the cooperative operation.

* * * * *